US012089430B2

(12) United States Patent
Im et al.

(10) Patent No.: US 12,089,430 B2
(45) Date of Patent: Sep. 10, 2024

(54) ORGANIC LIGHT-EMITTING DEVICE AND APPARATUS INCLUDING THE SAME

(71) Applicant: Samsung Display Co., Ltd., Yongin-si (KR)

(72) Inventors: Yeongji Im, Yongin-si (KR); Jino Lim, Yongin-si (KR); Beomjin Kim, Yongin-si (KR); Seunggak Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 717 days.

(21) Appl. No.: 17/249,231

(22) Filed: Feb. 24, 2021

(65) Prior Publication Data

US 2021/0320273 A1 Oct. 14, 2021

(30) Foreign Application Priority Data

Apr. 2, 2020 (KR) ........................ 10-2020-0040483

(51) Int. Cl.
*H10K 50/11* (2023.01)
*C09K 11/06* (2006.01)
(Continued)

(52) U.S. Cl.
CPC .............. *H10K 50/11* (2023.02); *C09K 11/06* (2013.01); *H10K 59/35* (2023.02); (Continued)

(58) Field of Classification Search
None
See application file for complete search history.

(56) References Cited

U.S. PATENT DOCUMENTS 8,987,715 B2 3/2015 Nishimura et al.
9,640,774 B2 5/2017 Lee et al.
(Continued)

FOREIGN PATENT DOCUMENTS

KR 10-2016-0024074 A 3/2016
KR 10-2018-0013536 A 2/2018
(Continued)

OTHER PUBLICATIONS

Lee, Jun Yeob, "Mixed-host-emitting layer for high-efficiency organic light-emitting diodes", Journal of Information Display, 2014, vol. 15, No. 3, pp. 139-144.
(Continued)

*Primary Examiner* — Jeffrey D Washville
(74) *Attorney, Agent, or Firm* — Lewis Roca Rothgerber Christie LLP

(57) ABSTRACT

An organic light-emitting device includes: a first electrode; a second electrode facing the first electrode; and an organic layer located between the first electrode and the second electrode and including an emission layer, wherein the emission layer includes a host and a dopant, the host includes a first compound and a second compound, and the first compound, the second compound, and the dopant are different from one another. Two compounds in the host included in the emission layer may have different HOMO and LUMO energy levels and may form an exciplex, and a difference between a HOMO energy level and a LUMO energy level of the exciplex ($\Delta E_{exciplex}$) may be greater than a difference between a HOMO energy level and a LUMO energy level of the dopant ($\Delta E_{dopant}$).

19 Claims, 3 Drawing Sheets

10

(51) Int. Cl.

| | |
|---|---|
| ***H10K 59/12*** | (2023.01) |
| ***H10K 59/35*** | (2023.01) |
| ***H10K 85/30*** | (2023.01) |
| ***H10K 85/60*** | (2023.01) |
| ***H10K 101/00*** | (2023.01) |
| ***H10K 101/10*** | (2023.01) |
| ***H10K 101/30*** | (2023.01) |

(52) U.S. Cl.

CPC ...... *C09K 2211/1018* (2013.01); *H10K 59/12* (2023.02); *H10K 85/342* (2023.02); *H10K 85/622* (2023.02); *H10K 85/623* (2023.02); *H10K 85/626* (2023.02); *H10K 85/633* (2023.02); *H10K 85/636* (2023.02); *H10K 85/654* (2023.02); *H10K 85/657* (2023.02); *H10K 85/6572* (2023.02); *H10K 85/6574* (2023.02); *H10K 85/6576* (2023.02); *H10K 2101/10* (2023.02); *H10K 2101/30* (2023.02); *H10K 2101/90* (2023.02)

(56) References Cited

U.S. PATENT DOCUMENTS

| | | | | |
|---|---|---|---|---|
| 9,876,196 B2 | | 1/2018 | Seo et al. | |
| 10,547,020 B2 | | 1/2020 | Jang et al. | |
| 2011/0037056 A1 | * | 2/2011 | Dubois | H10K 85/631 252/301.16 |
| 2018/0033994 A1 | * | 2/2018 | Jang | H10K 50/125 |
| 2018/0212157 A1 | * | 7/2018 | Oshiyama | C07D 491/22 |
| 2019/0237678 A1 | * | 8/2019 | Hang | H10K 50/16 |
| 2019/0296256 A1 | | 9/2019 | Kim et al. | |

FOREIGN PATENT DOCUMENTS

| | | |
|---|---|---|
| KR | 10-2018-0079108 A | 7/2018 |
| KR | 10-2019-0087282 A | 7/2019 |
| KR | 10-2019-0112373 A | 10/2019 |

OTHER PUBLICATIONS

Wang, Qiang, et al., "High-efficiency organic light-emitting diodes with exciplex hosts" *Journal of Materials Chemistry C*, vol. 7, No. 37, 2019, pp. 11329-11360.

Park, Young-Seo, et al., "Exciplex-Forming Co-host for Organic Light-Emitting Diodes with Ultimate Efficiency", *Advanced Functional Materials*, vol. 23, No. 39, pp. 4914-4920.

Shin, Hyun, et al., "Blue Phosphorescent Organic Light-Emitting Diodes Using an Exciplex Forming Co-host with the External Quantum Efficiency of Theoretical Limit", *Advanced Materials*, vol. 26, No. 27, pp. 4730-4734.

* cited by examiner

ORGANIC LIGHT-EMITTING DEVICE AND APPARATUS INCLUDING THE SAME

CROSS-REFERENCE TO RELATED APPLICATION

This application claims priority to and the benefit of Korean Patent Application No. 10-2020-0040483, filed on Apr. 2, 2020, in the Korean Intellectual Property Office, the entire content of which is incorporated herein by reference.

BACKGROUND

1. Field

One or more aspects of embodiments of the present disclosure relate to an organic light-emitting device and an organic light-emitting display apparatus including the same.

2. Description of Related Art

Organic light-emitting devices are self-emission devices that produce full-color images, and also have wide viewing angles, high contrast ratios, short response times, and/or excellent characteristics in terms of brightness, driving voltage, and/or response speed, compared to devices in the related art.

An example organic light-emitting device may include a first electrode disposed on a substrate, and a hole transport region, an emission layer, an electron transport region, and a second electrode sequentially disposed on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. These excitons may transition from an excited state to a ground state, thereby generating light.

SUMMARY

One or more aspects of embodiments of the present disclosure are directed toward a high-quality organic light-emitting device having low driving voltage, high efficiency, and/or long lifespan.

Additional aspects will be set forth in part in the description which follows and, in part, will be apparent from the description, or may be learned by practice of the presented embodiments of the disclosure.

One or more example embodiments of the present disclosure provide an organic light-emitting device including:

a first electrode, a second electrode facing the first electrode, and an organic layer located between the first electrode and the second electrode and including an emission layer, wherein the emission layer includes a host and a dopant, the host includes a first compound and a second compound, the first compound, the second compound, and the dopant are different from one another, two compounds in the host included in the emission layer have different highest occupied molecular orbital (HOMO) and lowest unoccupied molecular orbital (LUMO) energy levels and form an exciplex, and a difference between a HOMO energy level and a LUMO energy level of the exciplex ($\Delta E_{exciplex}$) is greater than a difference between a HOMO energy level and a LUMO energy level of the dopant ($\Delta E_{dopant}$).

In one embodiment, the second compound may have a smaller electron transport capability compared to the first compound.

In one embodiment, the first compound and the second compound may form an exciplex.

In one embodiment, a HOMO energy level (eV) of an exciplex ($HOMO_{exciplex}$) may be identical to a HOMO energy level (eV) of the first compound or a HOMO energy level (eV) of the second compound, whichever has a smaller absolute value, and a LUMO energy level (eV) of an exciplex ($LUMO_{exciplex}$) may be identical to a LUMO energy level (eV) of the first compound or a LUMO energy level (eV) of the second compound, whichever has a greater absolute value.

In one embodiment, a difference between a HOMO energy level of the first compound and a HOMO energy level of the second compound may be about 0.1 eV or more, and a difference between a LUMO energy level of the first compound and a LUMO energy level of the second compound may be about 0.1 eV or more.

In one embodiment, i) both the first compound and the second compound may include an electron transport moiety, ii) neither of the first compound and the second compound may include an electron transport moiety, or iii) the first compound may include an electron transport moiety and the second compound may not include an electron transport moiety.

In one embodiment, i) both the first compound and the second compound may include an electron transport moiety, ii) neither of the first compound and the second compound may include an electron transport moiety, or iii) the first compound may include an electron transport moiety and the second compound may not include an electron transport moiety, and in all cases, the first compound and the second compound may form exciplex.

In one embodiment, the electron transport moiety may be a cyano group, a fluoro group, a π-electron-deficient nitrogen-containing cyclic group, or any combination thereof.

In one embodiment, the first compound may be an electron transport host, and the second compound may be a hole transport compound.

In one embodiment, the first compound and the second compound may each have a higher triplet energy level (T1) than the dopant.

In one embodiment, a weight ratio of the first compound to the second compound may be about 90:10 to about 10:90.

In one embodiment, the host may further include a third compound; the first compound, the second compound, the third compound, and the dopant may be different from each other, two compounds in the host included in the emission layer may have different HOMO and LUMO energy levels and may form an exciplex, and a difference between a HOMO energy level and a LUMO energy level of the exciplex ($\Delta E_{exciplex}$) may be greater than a difference between a HOMO energy level and a LUMO energy level of the dopant ($\Delta E_{dopant}$).

In one embodiment, the third compound may be an electron transport host, a hole transport host, or a bipolar host.

In one embodiment, a weight ratio of the first compound and the second compound to the third compound may be about 1:99 to about 99:1.

In one embodiment, the emission layer may further include two or more hosts for a total of N hosts, wherein N may be an integer of 4 or more; the two or more hosts, the first compound, the second compound, and the dopant may be different from each other; two compounds selected from the N hosts included in the emission layer may have different HOMO and LUMO energy levels and may form an exciplex, and a difference between a HOMO energy level and a LUMO energy level of the exciplex ($\Delta E_{exciplex}$) may be greater than a difference between a HOMO energy level and a LUMO energy level of the dopant ($\Delta E_{dopant}$).

In one embodiment, the exciplex may have an energy band gap ($\Delta E_{exciplex}$) of about 2.5 eV to about 3.5 eV.

In one embodiment, the dopant in the emission layer may be a phosphorescent dopant or a fluorescent dopant.

In one embodiment, the organic layer may further include a hole transport region between the first electrode and the emission layer and an electron transport region between the emission layer and the second electrode; the hole transport region may include at least one selected from a hole injection layer, a hole transport layer, an emission auxiliary layer, and an electron blocking layer; and the electron transport region may include at least one selected from a buffer layer, a hole blocking layer, an electron control layer, an electron transport layer, and an electron injection layer.

In one embodiment, the hole transport region may include an arylamine compound.

In one embodiment, the electron transport region may include a π-electron-deficient nitrogen-containing cyclic containing compound.

One or more example embodiments of the present disclosure provide an organic light-emitting device including:

a first pixel electrode, a second pixel electrode, and a third pixel electrode respectively located in a first emission area, a second emission area, and a third emission area, a counter electrode facing the first pixel electrode, the second pixel electrode, and the third pixel electrode, and an organic layer located between the first pixel electrode, the second pixel electrode, and the third pixel electrode and the counter electrode and including an emission layer, wherein the emission layer includes:

a first emission layer corresponding to the first emission area and emitting first-color light, a second emission layer corresponding to the second emission area and emitting second-color light, and a third emission layer corresponding to the third emission area and emitting third-color light, wherein a maximum emission wavelength of the first-color light and a maximum emission wavelength of the second-color light are each greater than a maximum emission wavelength of the third-color light, at least two emission layers selected from the first emission layer, the second emission layer, and the third emission layer include a host including a first compound and a second compound and a dopant, the first compound, the second compound, and the dopant are different from one another, two compounds in the host included in the emission layer have different HOMO and LUMO energy levels and form an exciplex, and a difference between a HOMO energy level and a LUMO energy level of the exciplex ($\Delta E_{exciplex}$) is greater than a difference between a HOMO energy level and a LUMO energy level of the dopant ($\Delta E_{dopant}$).

In one embodiment, at least one emission layer selected from the first emission layer, the second emission layer, and the third emission layer may further include a third compound that is different from the first compound and the second compound.

One or more example embodiments of the present disclosure provide an apparatus including: a thin-film transistor including a source electrode, a drain electrode, and an activation layer; and the organic light-emitting device, wherein the first electrode or a pixel electrode of the organic light-emitting device is electrically connected with one selected from the source electrode and the drain electrode of the thin-film transistor.

BRIEF DESCRIPTION OF THE DRAWINGS

The above and other aspects, features, and advantages of embodiments of the present disclosure will be more apparent from the following description taken in conjunction with the accompanying drawings, in which.

DETAILED DESCRIPTION

Figure 1:
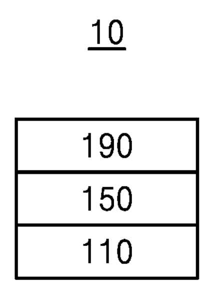
FIG. 1 is a schematic view of a structure of an organic light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

As the present disclosure can be subject to various transformations and can have various examples, selected examples will be illustrated in the drawings and described in detail in the detailed description. Effects and features of the present disclosure, and methods of achieving the same will be clarified by referring to the detailed Examples with reference to the drawings. However, the present disclosure is not limited to the examples disclosed below, and may be implemented in various forms.

As used herein, the singular forms "a," "an" and "the" are intended to include the plural forms as well, unless the context clearly indicates otherwise. Further, the use of "may" when describing embodiments of the present disclosure refers to "one or more embodiments of the present disclosure".

It will be further understood that the terms "includes," "including," "comprises," and/or "comprising" when used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of elements in the drawings may be exaggerated for convenience of explanation. For example, since sizes and thicknesses of components in the drawings are arbitrarily illustrated for convenience of explanation, the following embodiments of the present disclosure are not limited thereto.

The term "an organic layer" as used herein may refer to a single layer and/or a plurality of layers located between the first electrode and the second electrode of an organic light-emitting device. Materials included in the "organic layer" are not limited to being an organic material.

The expression "(an organic layer) includes a compound represented by Formula 1" as used herein may include a case in which "(an organic layer) includes one compound of Formula 1" as well as a case in which "(an organic layer) includes two or more different compounds of Formula 1".

Description of FIG. 1

FIG. 1 is a schematic cross-sectional view of an organic light-emitting device 10 according to an embodiment of the present disclosure. The organic light-emitting device 10 includes: a first electrode 110; a second electrode 190 facing the first electrode 110; and an organic layer 150 located between the first electrode 110 and the second electrode 190 and including an emission layer.

Hereinafter, a structure of the organic light-emitting device 10 according to an embodiment and a method of manufacturing the organic light-emitting device 10 will be described in connection with FIG. 1.

First Electrode 110

In FIG. 1, a substrate may be additionally disposed under the first electrode 110 and/or above the second electrode 190. The substrate may be a glass substrate and/or a plastic substrate, each having excellent mechanical strength, thermal stability, transparency, surface smoothness, ease of handling, and/or water resistance.

The first electrode 110 may be formed by depositing and/or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, the material for forming the first electrode 110 may be selected from indium tin oxide (ITO), indium zinc oxide (IZO), tin oxide ($SnO_2$), zinc oxide (ZnO), and any combination thereof, but embodiments of the present disclosure are not limited thereto.

In one or more embodiments, when the first electrode 110 is a semi-transmissive electrode or a reflective electrode, the material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 is located on the first electrode 110. The organic layer 150 includes an emission layer.

The emission layer may include a host and a dopant, the host may include a first compound and a second compound (e.g., the emission layer may include a first host compound and a second host compound), and the first compound, the second compound, and the dopant may be different from one another. Here, the term "different from" indicates that the compounds are not the same, and may have different structures, compositions, and properties.

In one embodiment, the second compound may be a host having a smaller electron transport capability than the first compound.

Two different host compounds (e.g., molecules) included in the emission layer may form an exciplex, and the energy level difference between the highest occupied molecular orbital (HOMO) energy level and the lowest unoccupied molecular orbital (LUMO) energy level (e.g., the HOMO-LUMO gap or energy band gap) of the exciplex ($\Delta E_{exciplex}$) may be greater than the energy level difference between the HOMO energy level and the LUMO energy level (e.g., the HOMO-LUMO gap) of the dopant ($\Delta E_{dopant}$).

The HOMO energy level (eV) and the LUMO energy level (eV) of the host, the HOMO energy level (eV) and the LUMO energy level (eV) of the exciplex, and the HOMO energy level (eV) and the LUMO energy level (eV) of the dopant may each be measured by cyclic voltammetry (CV).

In one embodiment, the first compound and the second compound may form an exciplex. In this case, the HOMO energy level (eV) of the exciplex ($HOMO_{exciplex}$) may be identical to the HOMO energy level (eV) of the first compound or the HOMO energy level (eV) of the second compound, whichever has a smaller (lower) absolute value. For example, the HOMO energy level of the exciplex may be identical to the shallower value among the HOMO energy level of the first compound and the HOMO energy level of the second compound.

In one or more embodiments, the LUMO energy level (eV) of the exciplex ($LUMO_{exciplex}$) may be identical to the LUMO energy level (eV) of the first compound or the LUMO energy level (eV) of the second compound, whichever has a greater (higher) absolute value. For example, the LUMO energy level of the exciplex may be identical to the deeper value among the LUMO energy level of the first compound and the LUMO energy level of the second compound.

Figure 2:
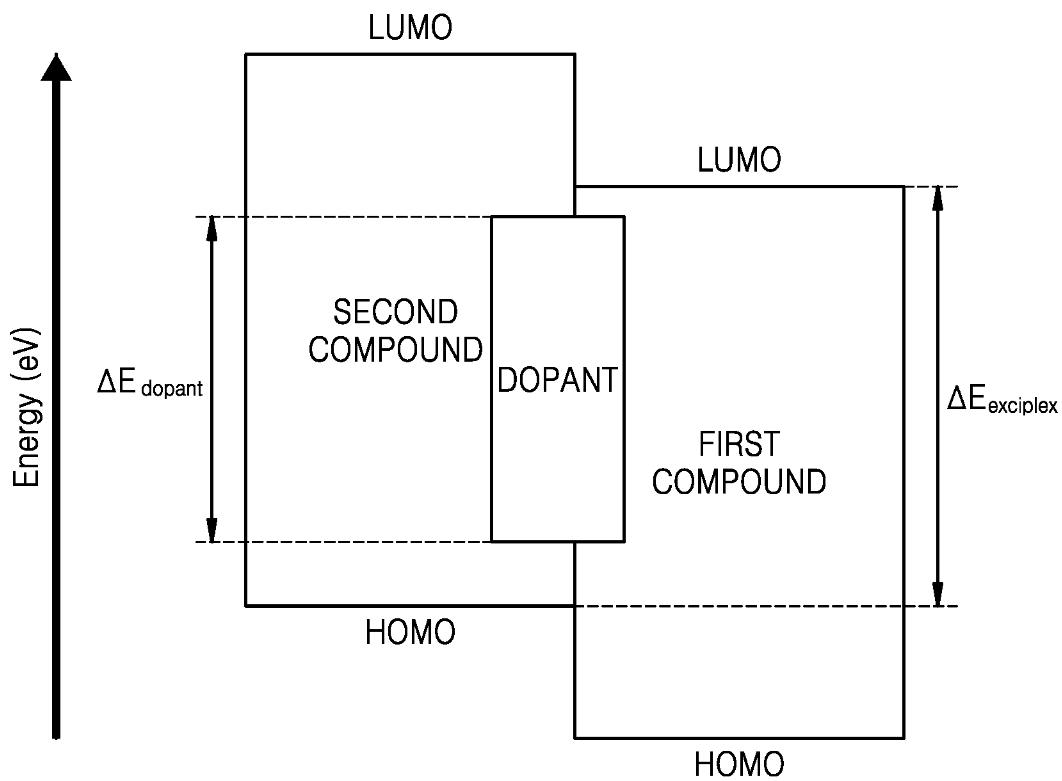
FIG. 2 is an energy diagram of a first compound, a second compound, an exciplex, and a dopant.

FIG. 2 is an energy diagram of a first compound, a second compound, an exciplex, and a dopant, according to an embodiment.

Referring to FIG. 2, for example, when the first compound and the second compound form an exciplex, the HOMO energy level of the exciplex is identical to the HOMO energy level of the second compound, which has a smaller absolute value compared to the HOMO energy level of the first compound; and the LUMO energy level of the exciplex is identical to a LUMO energy level of the first compound, which has a greater absolute value compared to the LUMO energy level of the second compound.

Accordingly, in the example of FIG. 2, a difference between the HOMO energy level and the LUMO energy level (e.g., the HOMO-LUMO gap) of the exciplex ($\Delta E_{exciplex}$) formed by the first compound and the second compound may be the same as the difference between the HOMO energy level of the second compound and the LUMO energy level of the first compound.

An energy band gap of the dopant ($\Delta E_{dopant}$) is smaller than an energy band gap of the exciplex ($\Delta E_{exciplex}$) FIG. 2 illustrates, for ease of understanding, that the LUMO energy level of the dopant is smaller than the LUMO energy level of the exciplex, and the HOMO energy level of the dopant is greater than the HOMO energy level of the exciplex, (e.g., so that the HOMO-LUMO gap of the dopant is entirely contained within the HOMO-LUMO gap of the exciplex).

However, the HOMO and LUMO energy levels of the dopant are not limited thereto, and may each be independently selected as long as the values satisfy $\Delta E_{exciplex} > \Delta E_{dopant}$.

When the emission layer exciplex and the dopant satisfy the condition that $\Delta E_{exciplex}$ is greater than $\Delta E_{dopant}$, an exciton formed in the exciplex may be efficiently transferred to the dopant. In addition, compared to an emission layer including a single host, when an emission layer includes at least two hosts, energy may be efficiently transferred from the hosts to the dopant. Thus, the organic light-emitting device may have high efficiency and/or long lifespan.

When the emission layer includes two or more hosts, compared to a case of the emission layer including one host, a hole-electron charge balance in the emission layer may be improved. When the first compound has greater electron mobility than the second compound, the first compound may be an electron transport host having relatively strong electron transport characteristics in the emission layer, and the second compound may be a hole transport host having relatively strong hole transport characteristics in the emission layer, but embodiments of the present disclosure are not limited thereto.

When the emission layer includes at least two hosts, holes provided from the first electrode 110 may flow to the emission layer via the HOMO of the hole transport host, and electrons provided from the second electrode 190 may flow to the emission layer via the LUMO of the electron transport host.

Even though the hole transport host including the holes and the electron transport host including the electrons may contact each other in the emission layer, because the holes and the electrons exist in (e.g., are concentrated on) different compounds, excitons may not be easily formed. In this case, when the electron transport host transfers electrons to the hole transport host, excitons may be formed in the hole transport host, or when the hole transport host transfers holes to the electron transport host, excitons may be formed in the electron transport host. In one or more embodiments, when the electron transport host and the hole transport host respectively transfer electrons and holes to the dopant, excitons may be formed in the dopant. As such, it is only when carriers are transferred over the energy barrier therebetween that excitons are formed to thereby emit light. Thus, driving voltage of an organic light-emitting device may be increased.

In contrast, in the organic light-emitting device according to an embodiment, two host compounds in the emission layer, for example, the first compound and the second compound, may have different HOMO and LUMO energy levels and may form an exciplex, and thus excitons may be formed without transferring holes or electrons over an energy barrier therebetween (e.g., the energy barrier for transfer of holes and/or electrons may be reduced, and in some embodiments, substantially zero).

As such, when the HOMO and LUMO energy levels of compounds or materials in the emission layer are aligned to induce efficient carrier injection, injection of holes and electrons may be improved, and excitons may be formed in the emission layer without an energy barrier due to the exciplex formed by the first compound and the second compound, such that the organic light-emitting device 10 may have low driving voltage and/or high efficiency.

The first compound and the second compound, which are host compounds in the emission layer, are not limited to being particular compounds as long as the exciplex formed in the emission layer can satisfy $\Delta E_{exciplex} > \Delta E_{dopant}$.

In one or more embodiments, when the first compound and the second compound in the emission layer form an exciplex, in order to efficiently form an exciplex, the difference between the HOMO energy level of the first compound and the HOMO energy level of the second compound may be, for example, about 0.1 eV or more, and the difference between the LUMO energy level of the first compound and the LUMO energy level of the second compound may be, for example, about 0.1 eV or more, but embodiments of the present disclosure are not limited thereto.

In one embodiment, the HOMO energy level of the second compound may be at least about 0.1 eV higher than the HOMO energy level of the first compound, and the LUMO energy level of the second compound may be at least about 0.1 eV higher than the LUMO energy level of the first compound, but embodiments of the present disclosure are not limited thereto. A first compound and a second compound satisfying the above-described energy conditions may efficiently form an exciplex.

In respective embodiments, i) both the first compound and the second compound may include an electron transport moiety, ii) neither of the first compound and the second compound may include an electron transport moiety, or iii) the first compound may include an electron transport moiety and the second compound may not include an electron transport moiety, or vice versa, and in each embodiment, the first compound and the second compound may form an exciplex.

In one embodiment, the electron transport moiety may be a cyano group, a fluoro group, a π-electron-deficient nitrogen-containing cyclic group, or any combination thereof.

The term "π-electron-deficient nitrogen-containing cyclic group" as used herein refers to a heterocyclic group having at least one *—N=*' moiety as a ring-forming moiety.

In one embodiment, the first compound may be an electron transport host, and the second compound may be a hole transport compound.

In one embodiment, the first compound and the second compound may both (each) include an electron transport moiety, the first compound may be an electron transport host, and the second compound may be a hole transport host. In this case, the first compound may be or act as an electron transport host having electron injection and transport characteristics, and the second compound may be or act as a hole transport host having hole injection and transport characteristics, consistent with the relative magnitudes of electron mobility of the first compound and the second compound.

In one embodiment, neither of the first compound and the second compound may include an electron transport moiety, the first compound may be an electron transport host, and the second compound may be a hole transport host. For example, even a host or first compound that does not include an electron transport moiety may be or act as an electron transport host having electron injection and transport characteristics due to the comparative magnitudes of electron mobility of the first compound and the second compound, and the second compound may be or act as a hole transport host having hole injection and transport characteristics.

In one or more embodiments, the first compound may be an electron transport host including an electron transport moiety, and the second compound may be a hole transport host including a hole transport moiety.

The first compound may have high electron transport characteristics and may stably and efficiently transport electrons, thereby lowering the driving voltage, increasing current efficiency, and supporting long lifespan characteristics of a device.

The second compound may have hole transport characteristics and may efficiently transport holes with relative stability, thereby contributing to improvement of device characteristics.

In one embodiment, the first compound may be a bipolar compound including both an electron transport moiety and a hole transport moiety (e.g., simultaneously). The hole transport moiety may include a carbazole, a dibenzofuran, a dibenzothiophene, an amine group, and/or the like.

In one embodiment, both the first compound and the second compound may be bipolar compounds. However, an electron transport capability of the first compound may be greater than that of the second compound.

In one embodiment, an electron mobility of the first compound μ(C1) may be greater than that of the second compound μ(C2).

μ(C1) and μ(C2) may each be evaluated using DFT methods, for example, with the Gaussian program on structures optimized using the B3LYP/6-31G(d,p) functional and basis set.

In one embodiment, the first compound and the second compound may each have a higher triplet energy level (T1) than the dopant.

When the first compound and the second compound each have a triplet energy level (T1) satisfying the above-described condition, excitons recombined in a host or an exciplex may be efficiently transferred to the dopant.

In one embodiment, the first compound and the second compound may each independently be selected from compounds represented by Formulae 1 to 3 and 301.

Formula 1

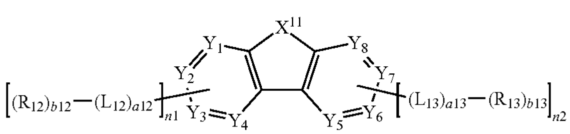

In Formula 1, $X_{11}$ may be O, S, $N[(L_{11})_{a11}$—$(R_{11})_{b11}]$, $C(R_{11a})(R_{11b})$, or $Si(R_{11a})(R_{11b})$, $Y_1$ to $Y_8$ may each independently be N or $C(R_{14})$, wherein, when $C(R_{14})$ is 2 or more, two or more of $R_{14}$(s) may be identical to or different from each other, $L_{11}$ to $L_{13}$ may each independently be a substituted or unsubstituted $C_5$-$C_{60}$ carbocyclic group or a substituted or unsubstituted $C_1$-$C_{60}$ heterocyclic group, a11 to a13 may each independently be an integer from 0 to 5, $R_{11}$ to $R_{14}$ and $R_{11a}$ and $R_{11b}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, two adjacent groups selected from $R_{11}$ to $R_{14}$, $R_{11a}$, and $R_{11b}$ may optionally be linked together via a linking group selected from a single bond, *—O—*', *—S—*', *—B($R_{15}$)—', *—N($R_{15}$)—*', *—C($R_{15}$)($R_{16}$)—*', *—C($R_{15}$)=C($R_{16}$)—', a $C_5$-$C_{30}$ carbocyclic group, and a $C_1$-$C_{30}$ heterocyclic group, $R_{15}$ and $R_{16}$ may each independently be selected from: hydrogen, a $C_1$-$C_{20}$ alkyl group, a phenyl group, a biphenyl group, a terphenyl group, a naphthyl group, a fluorenyl group, a carbazolyl group, a dibenzofuranyl group, and a dibenzothiophenyl group; and a phenyl group, a biphenyl group, a terphenyl group, a naphthyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, and a naphthyl group, b11 to b13 may each independently be an integer from 1 to 5, and n1 and n2 may each independently be an integer from 1 to 4.

Formula 2

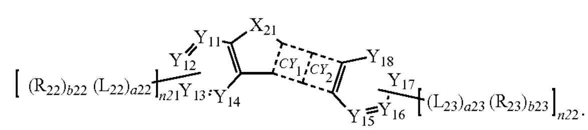

In Formula 2, $X_{21}$ may be O, S, $N[(L_{21})_{a21}$—$(R_{21})_{b21}]$, $C(R_{21a})(R_{21b})$, or $Si(R_{21a})(R_{21b})$, $Y_{11}$ to $Y_{18}$ may each independently be N or $C(R_{24})$, wherein, when $C(R_{24})$ is 2 or more, two or more of $R_{24}$(s) may be identical to or different from each other, $CY_1$ may be a group represented by Formula 2A, and $CY_2$ may be a group represented by Formula 2B, Formula 2A

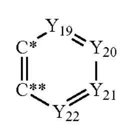

Formula 2B

in Formula 2A, C* and C** may each be a carbon condensed with an $X_{21}$-containing 5-membered ring, in Formula 2A, $Y_{19}$ to $Y_{22}$ may each independently be N, C, or $C(R_{25})$, wherein, when $C(R_{25})$ is 2 or more, two or more of $R_{25}$(s) may be identical to or different from each other, and two adjacent among $Y_{19}$ to $Y_{22}$ may each be a carbon condensed with an $X_{22}$-containing 5-membered ring, in Formula 2B, $X_{22}$ may be O, S, $N[(L_{24})_{a24}$—$(R_{26})_{b26}]$, $C(R_{26a})(R_{26b})$, or $Si(R_{26a})(R_{26b})$, $L_{21}$ to $L_{24}$ may each independently be a substituted or unsubstituted $C_5$-$C_{60}$ carbocyclic group or a substituted or unsubstituted $C_1$-$C_{60}$ heterocyclic group, a21 to a24 may each independently be an integer from 0 to 5, $R_{21}$ to $R_{26}$, $R_{21a}$, $R_{21b}$, $R_{26a}$, and $R_{26b}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), two adjacent groups selected from $R_{21}$ to $R_{26}$, $R_{21a}$, $R_{21b}$, $R_{26a}$, and $R_{26b}$ may optionally be linked together via a linking group selected from a single bond, *—O—*', *-5-*'*—B($R_{27}$)—', *—N($R_{27}$)—*', *—C($R_{27}$)($R_{28}$)—*', —C($R_{27}$)=C($R_{28}$)—', a $C_5$-$C_{30}$ carbocyclic group, and a $C_1$-$C_{30}$ heterocyclic group, $R_{27}$ and $R_{28}$ may each independently be selected from: hydrogen, a $C_1$-$C_{20}$ alkyl group, a phenyl group, a biphenyl group, a terphenyl group, a naphthyl group, a fluorenyl group, a carbazolyl group, a dibenzofuranyl group, and a dibenzothiophenyl group; and a phenyl group, a biphenyl group, a terphenyl group, a naphthyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, and a naphthyl group, b21 to b23 and b26 may each independently be an integer from 1 to 5, and n21 and n22 may each independently be an integer from 1 to 4.

Formula 3

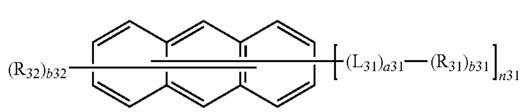

In Formula 3, $L_{31}$ may be a substituted or unsubstituted $C_5$-$C_{60}$ carbocyclic group or a substituted or unsubstituted $C_1$-$C_{60}$ heterocyclic group, a31 may be an integer from 0 to 5, $R_{31}$ and $R_{32}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), b31 and b32 may each independently be an integer from 1 to 5, and n31 may be an integer from 1 to 3.

In Formulae 1 to 3, $L_{11}$ to $L_{13}$, $L_{21}$ to $L_{24}$, and $L_{31}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ may each independently be the same as described above.

In Formulae 1 to 3, $R_{11}$ to $R_{14}$, $R_{11a}$, $R_{11b}$, $R_{21}$ to $R_{26}$, $R_{21a}$, $R_{21b}$, $R_{26a}$, $R_{26b}$, $R_{31}$, and $R_{32}$ may each independently be selected from:

hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a biphenyl group;

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a chrysenyl group, a benzochrysenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a cyclopentabenzofuranyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, and an azadibenzosilolyl group;

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a chrysenyl group, a benzochrysenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a cyclopentabenzofuranyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a chrysenyl group, a benzochrysenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a cyclopentabenzofuranyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, and an azadibenzosilolyl group; and —$Si(Q_1)(Q_2)(Q_3)$, —$N(Q_1)(Q_2)$, and —$B(Q_1)(Q_2)$, wherein $Q_1$ to $Q_3$ may each independently be selected from hydrogen, deuterium, a $C_1$-$C_{10}$ alkyl group, a $C_1$-$C_{10}$ alkoxy group, a phenyl group, a biphenyl group, a terphenyl group, and a naphthyl group.

In one embodiment, the compound represented by Formula 2 may be represented by any one of Formulae 2-1 to 2-6:

2-1

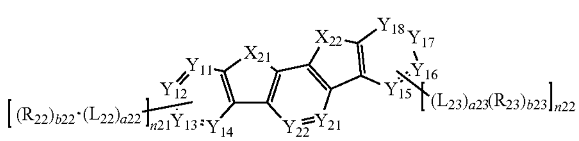

2-2

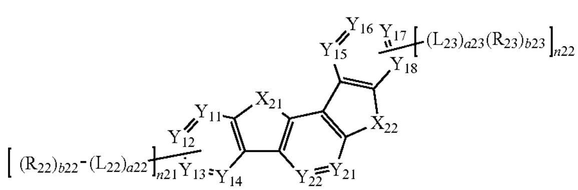

2-3

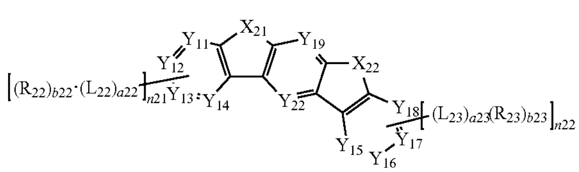

2-4

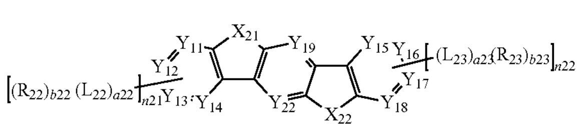

-continued 2-5

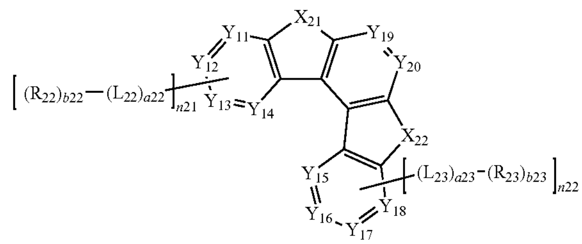

2-6

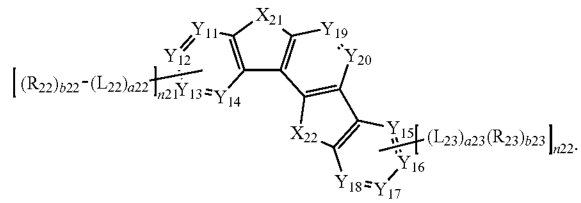

In Formulae 2-1 to 2-6, $X_{21}$, $X_{22}$, $Y_{11}$ to $Y_{22}$, $L_{22}$, $L_{23}$, a22, a23, $R_{22}$, $R_{23}$, b22, b23, n21, and n22 may each independently be the same as described in the present specification.

In one embodiment, the compound represented by Formula 3 may be represented by Formula 3-1:

Formula 3-1

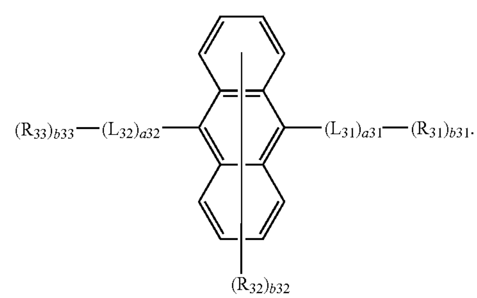

In Formula 3-1, $L_{31}$, $L_{32}$, a31, a32, $R_{31}$, $R_{32}$, b31, and b32 may each independently be the same as described in the present specification, $L_{32}$ and $R_{33}$ may each independently be the same as described in connection with $L_{31}$ and $R_{31}$, respectively, a32 may be an integer from 0 to 5, and b33 may be an integer from 1 to 5.

$$[Ar_{301}]_{xb11}\text{-}[(L_{301})_{xb1}\text{-}R_{301}]_{xb21}. \qquad \text{Formula 301}$$

In Formula 301, $Ar_{301}$ may be selected from a substituted or unsubstituted $C_5$-$C_{60}$ carbocyclic group and a substituted or unsubstituted $C_1$-$C_{60}$ heterocyclic group, xb11 may be an integer from 1 to 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), and —P(═O)($Q_{301}$)($Q_{302}$), and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is two or more, two or more $Ar_{301}$(s) may be linked via a single bond.

In one embodiment, the compound represented by Formula 301 may be represented by Formula 301-1 or Formula 301-2:

Formula 301-1

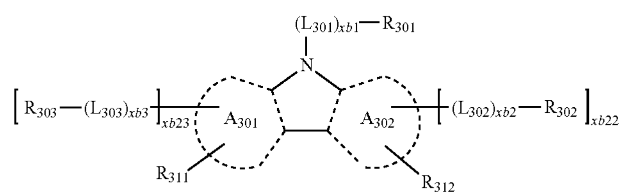

Formula 301-2

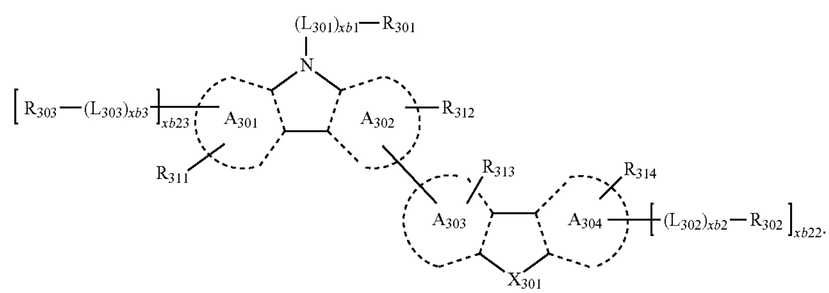

In Formulae 301-1 and 301-2

$A_{301}$ to $A_{304}$ may each independently be selected from a benzene ring, a naphthalene ring, a phenanthrene ring, a fluoranthene ring, a triphenylene ring, a pyrene ring, a chrysene ring, a pyridine ring, a pyrimidine ring, an indene ring, a fluorene ring, a spiro-bifluorene ring, a benzofluorene ring, a dibenzofluorene ring, an indole ring, a carbazole ring, a benzocarbazole ring, a dibenzocarbazole ring, a furan ring, a benzofuran ring, a dibenzofuran ring, a naphthofuran ring, a benzonaphthofuran ring, a dinaphthofuran ring, a thiophene ring, a benzothiophene ring, a dibenzothiophene ring, a naphthothiophene ring, a benzonaphthothiophene ring, and a dinaphthothiophene ring, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), xb22 and xb23 may each independently be 0, 1, or 2, $L_{301}$, xb1, $R_{301}$, and $Q_{31}$ to $Q_{33}$ may each independently be the same as described above, $L_{302}$ to $L_{304}$ may each independently be the same as described in connection with $L_{301}$, xb2 to xb4 may each independently be the same as described in connection with xb1, and $R_{302}$ to $R_{304}$ may each independently be the same as described in connection with $R_{301}$.

For example, $L_{301}$ to $L_{304}$ in Formulae 301, 301-1, and 301-2 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ may each independently be the same as described above.

In one embodiment, $R_{301}$ to $R_{304}$ in Formulae 301, 301-1, and 301-2 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be the same as described above.

In one or more embodiments, the first compound and the second compound may each independently be selected from Compounds C1 to C12 and H1 to H55, but embodiments of the present disclosure are not limited thereto:

C1

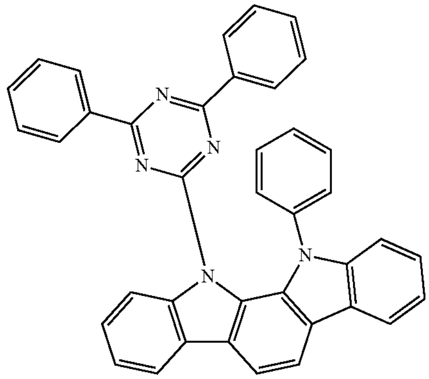

-continued

C2

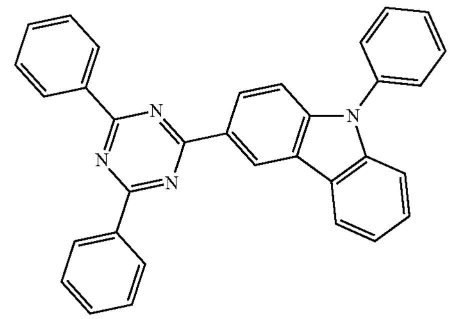

C3

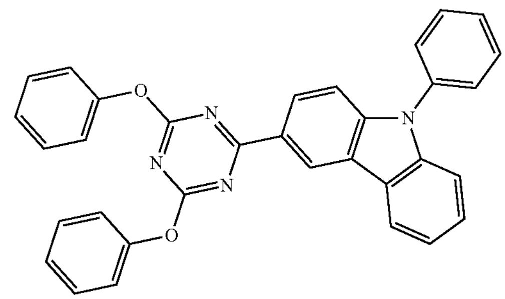

C4

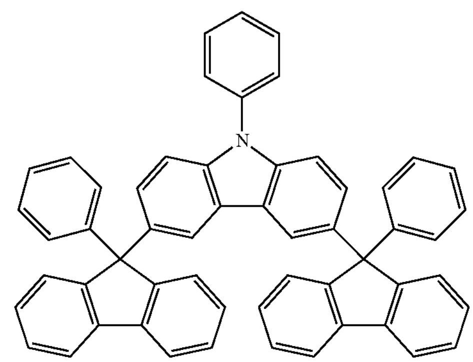

C5

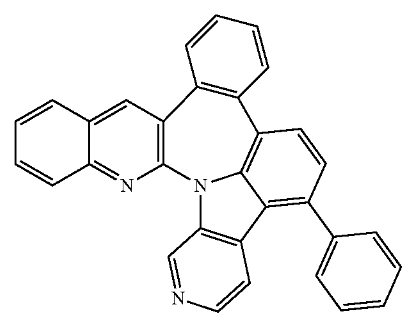

-continued
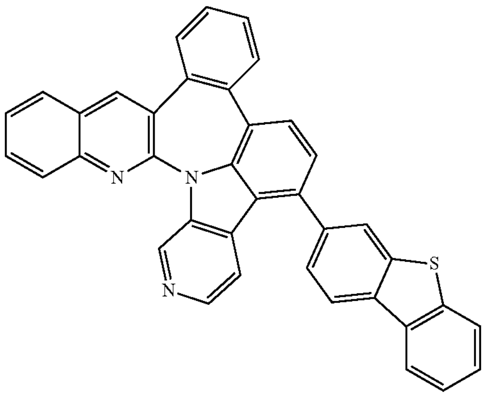
C6
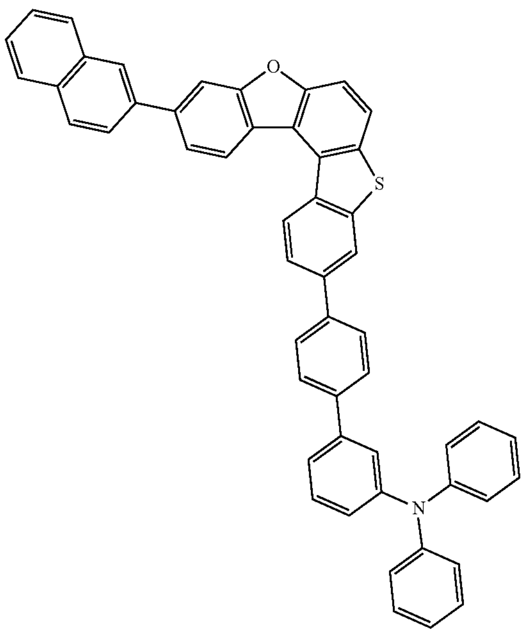
C7
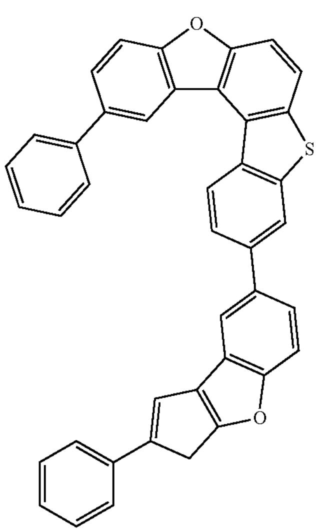
C8
-continued
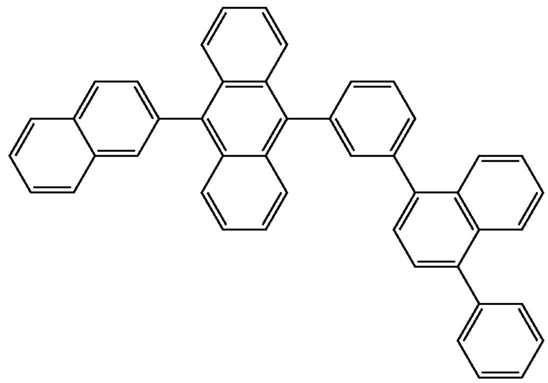
C9
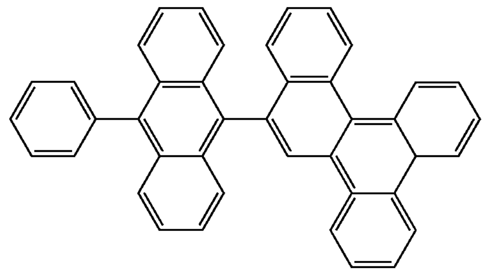
C10
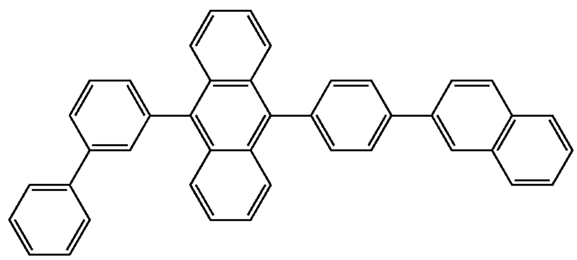
C11
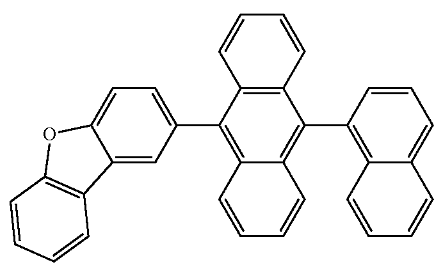
C12
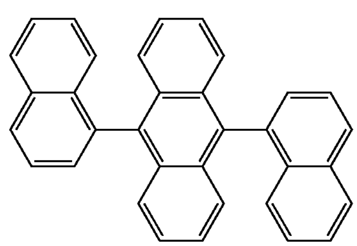
H1

-continued
H2
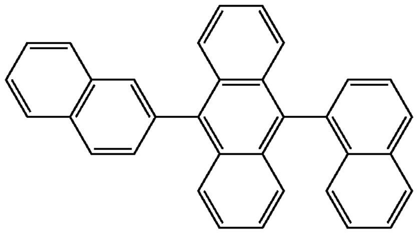
H3
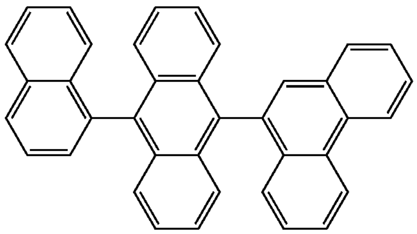
H4
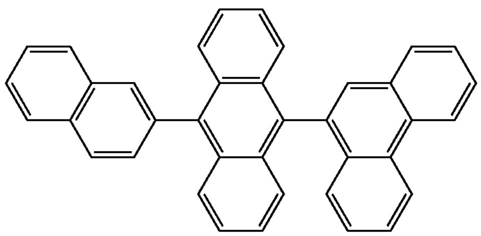
H5
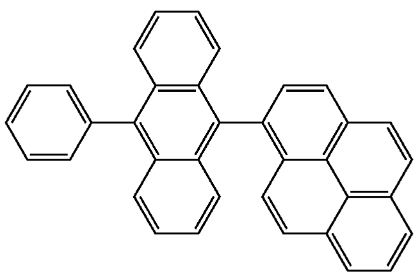
H6
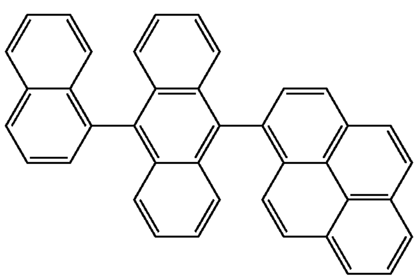
H7
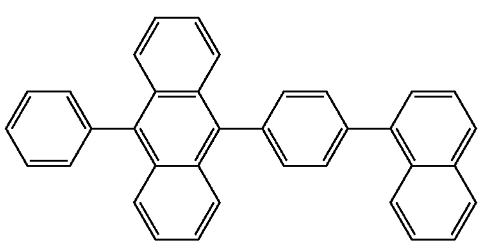
-continued
H8
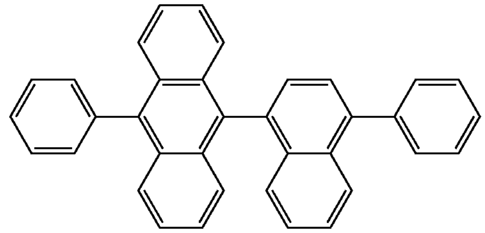
H9
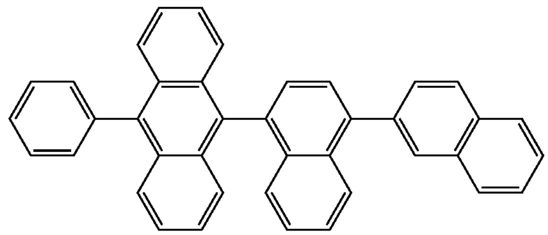
H10
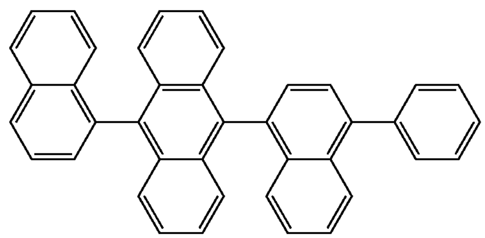
H11
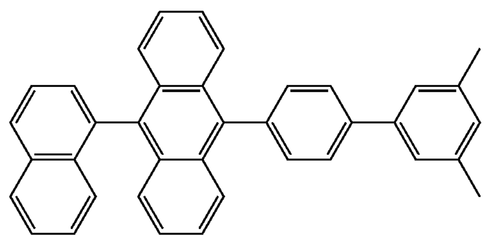
H12
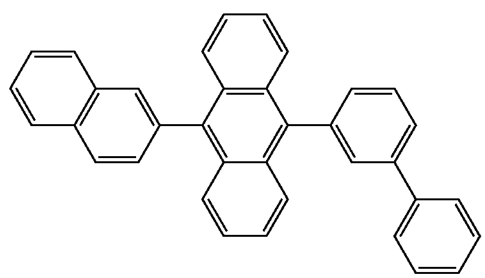
H13
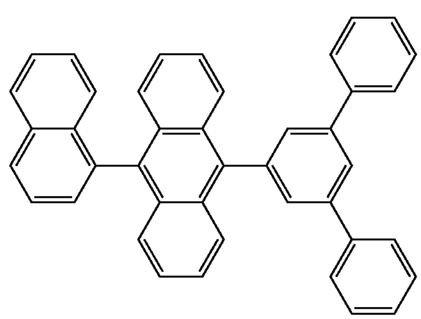

-continued
H14
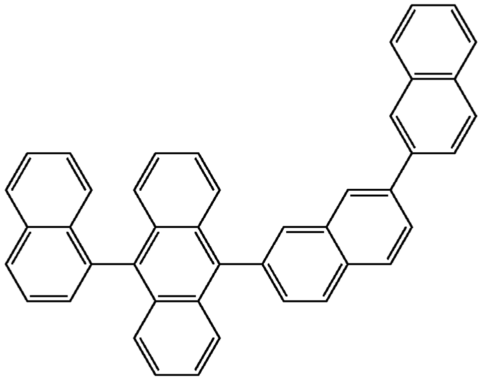
H15
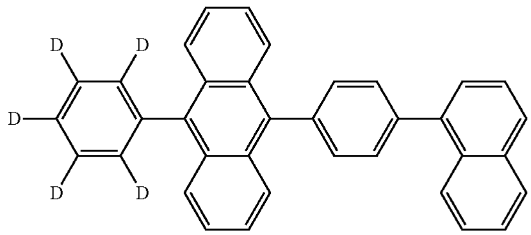
H16
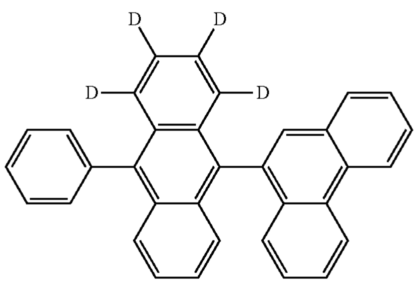
H17
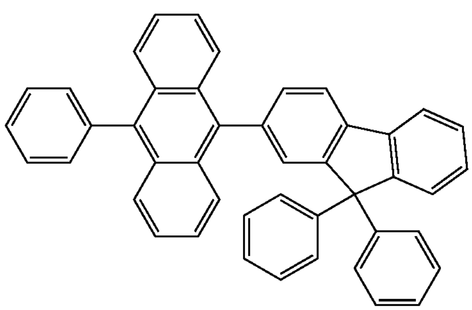
H18
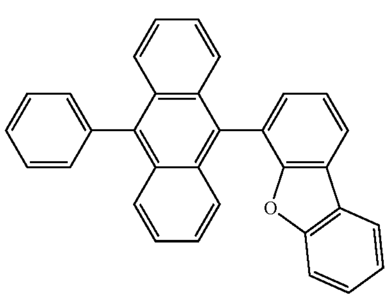
-continued
H19
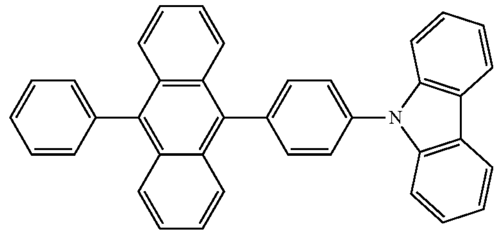
H20
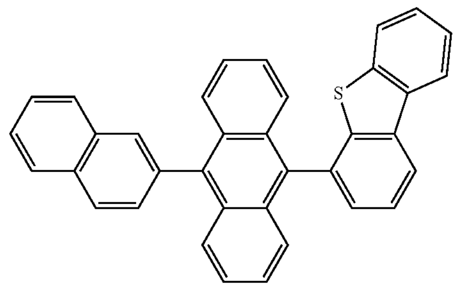
H21
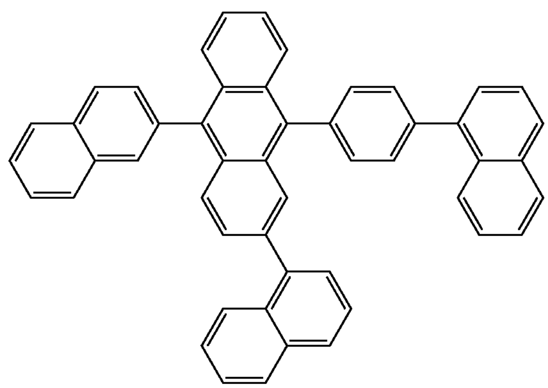
H22
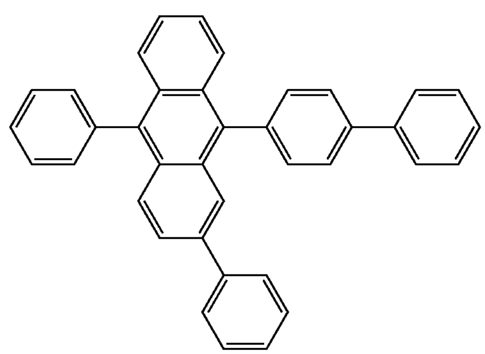

-continued
H23
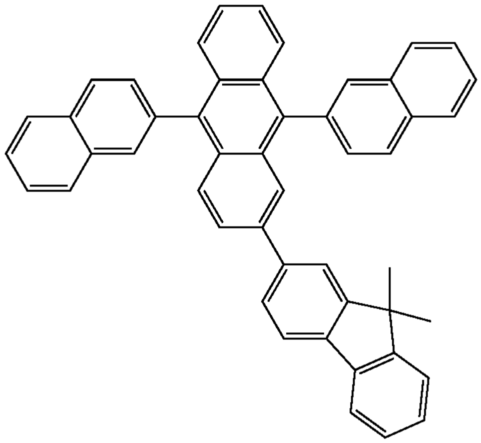
H24
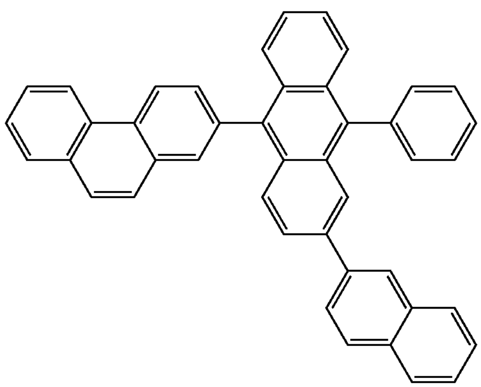
H25
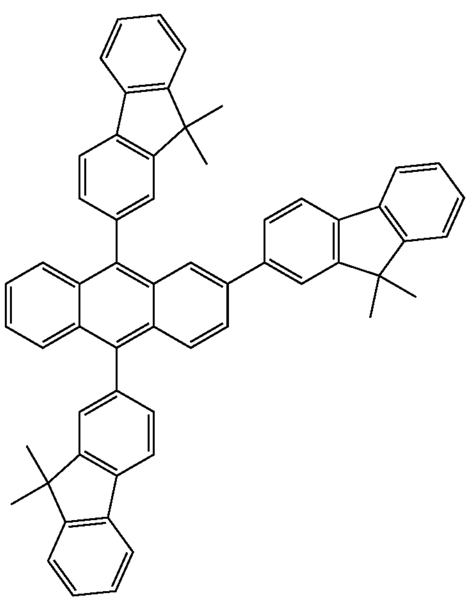
-continued
H26
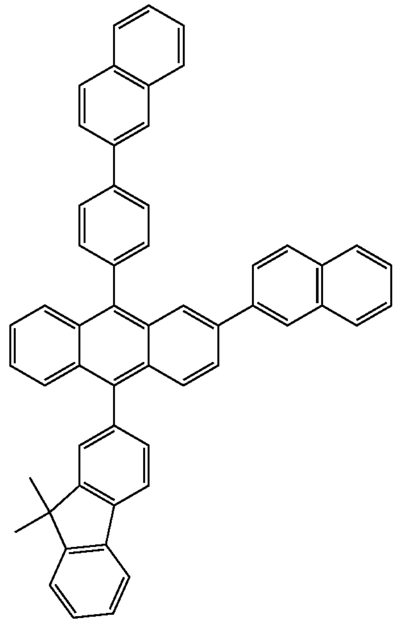
H27
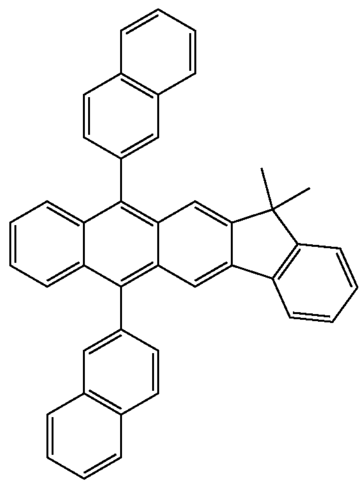
H28
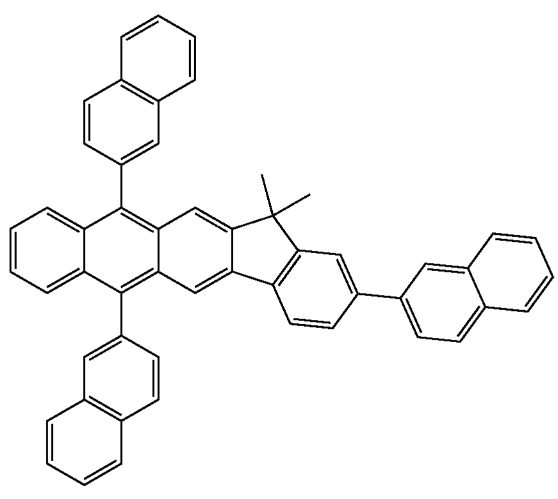

-continued
H29
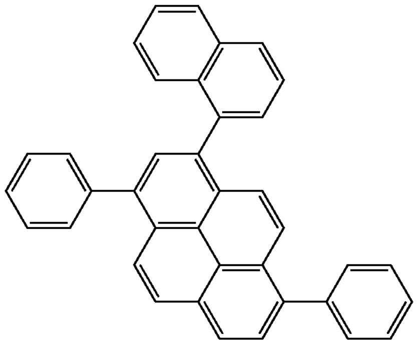
H30
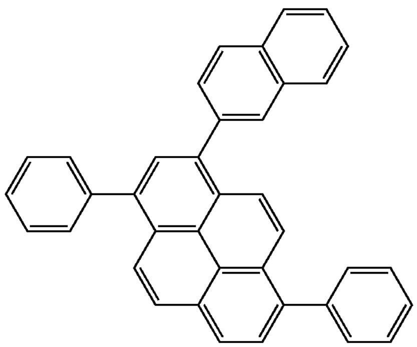
H31
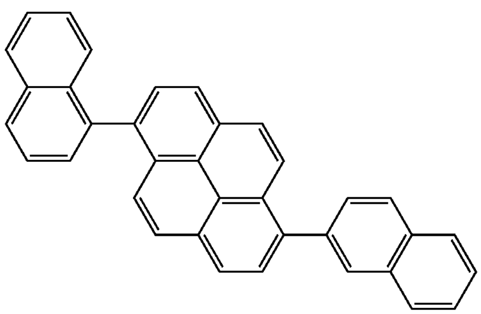
H32
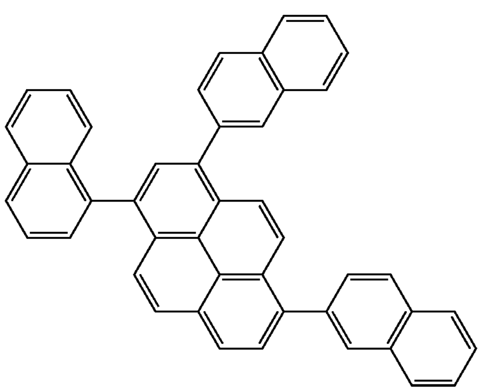
H33
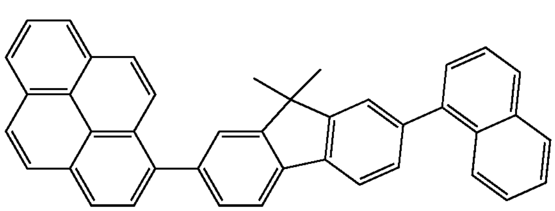
-continued
H34
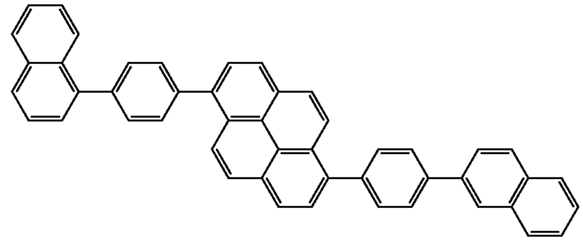
H35
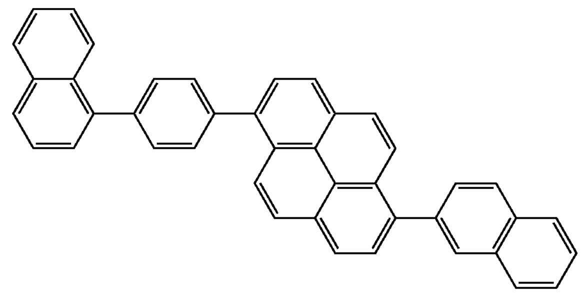
H36
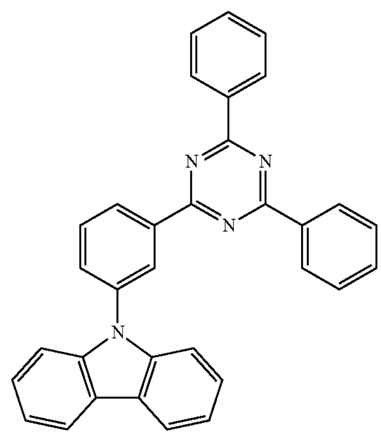
H37
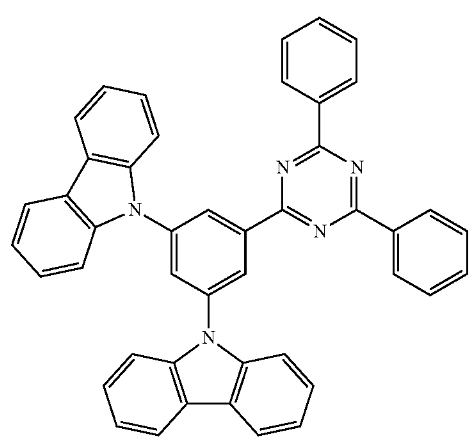

H38
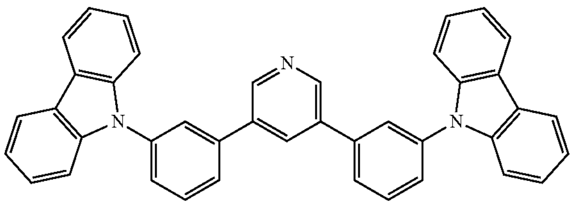
H39
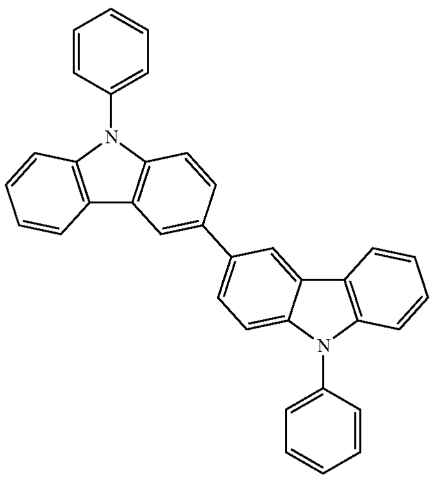
H40
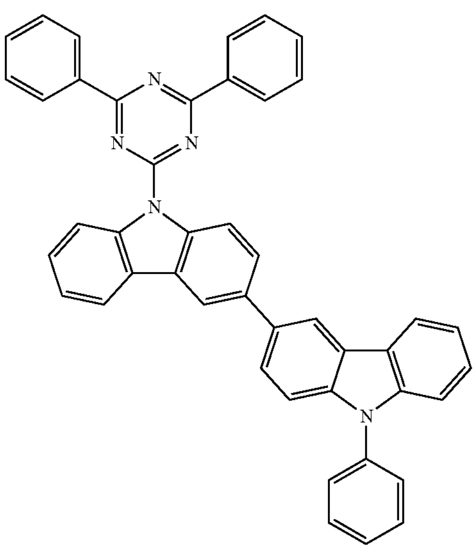
H41
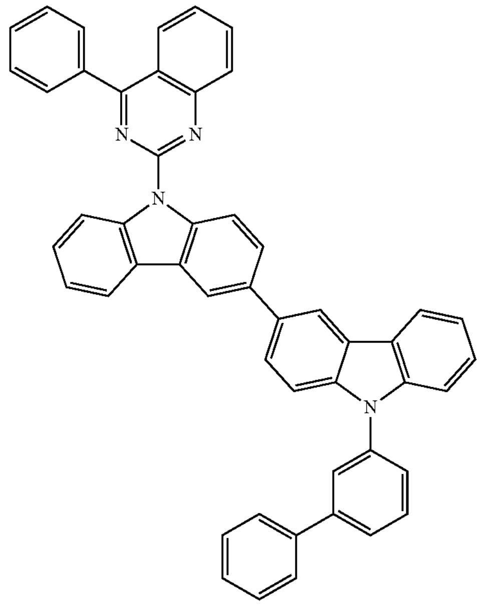
H42
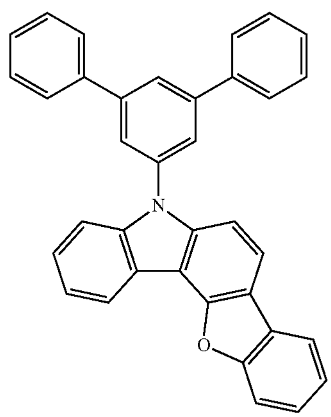
H43
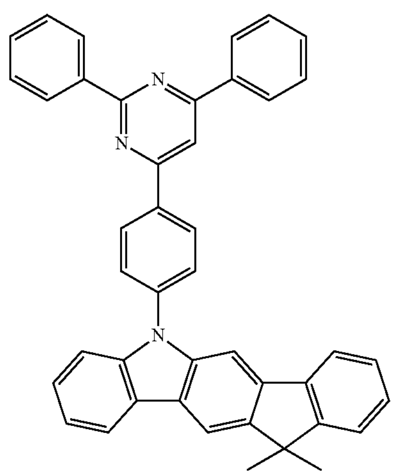

-continued
H44
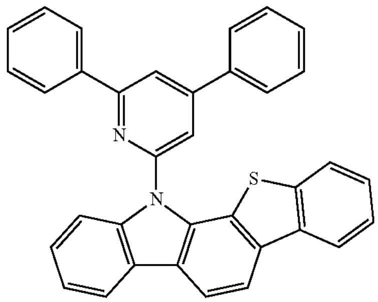
H45
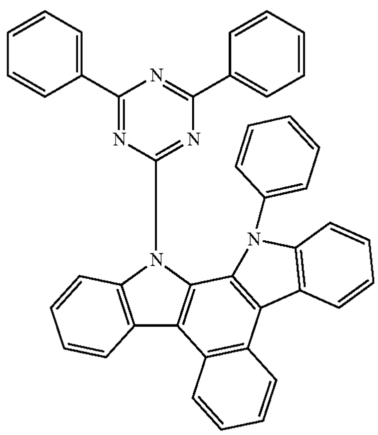
H46
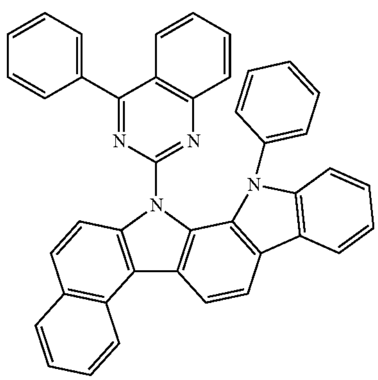
H47
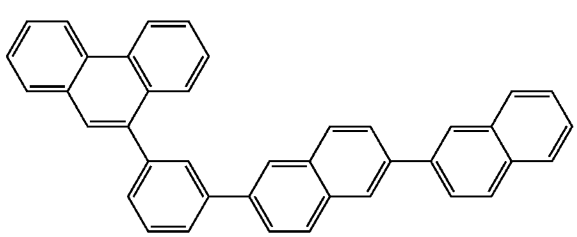
H48
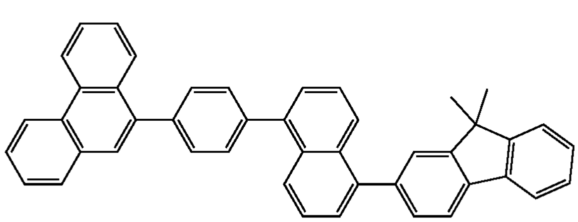
-continued
H49
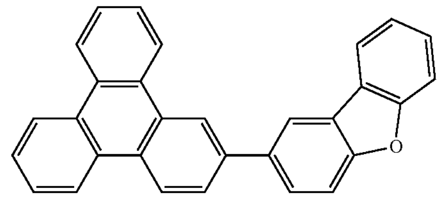
H50
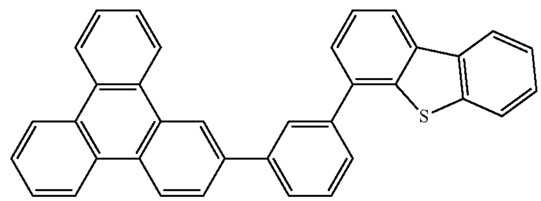
H51
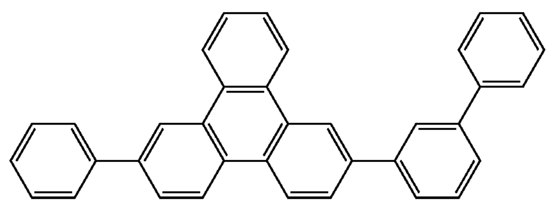
H52
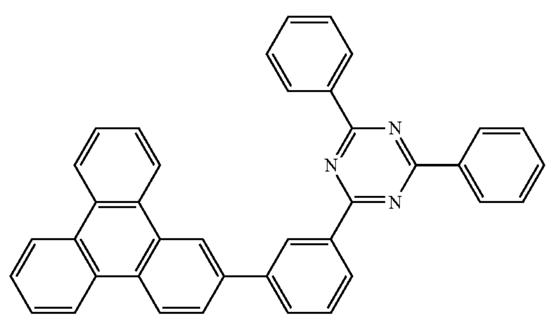
H53
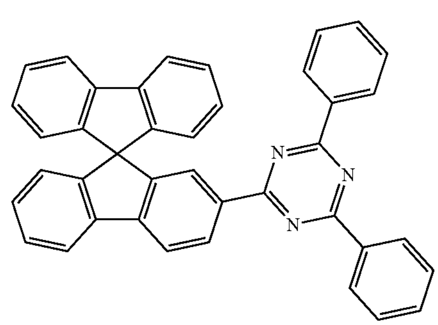

-continued

H54

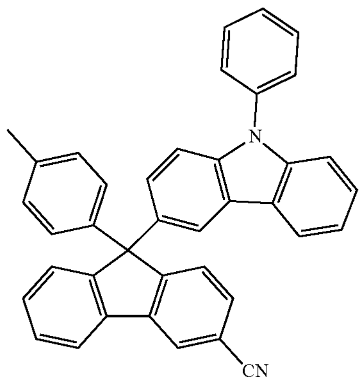

H55

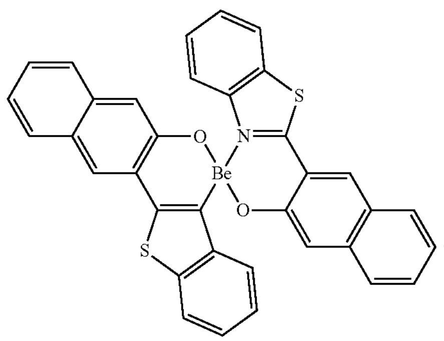

In one or more embodiments, the first compound and the second compound may each independently be selected from Compounds C1 to C12 and H1 to H55, but the first compound and the second compound are different from each other. In addition, an electron transport capability of the second compound may be smaller than that of the first compound.

When the host includes the first compound and the second compound, a weight ratio of the first compound to the second compound may be about 90:10 to about 10:90. In one or more embodiments, a weight ratio of the first compound to the second compound may be about 20:80 to about 80:20 or about 30:70 to about 70:30. When a weight ratio of the first compound to the second compound is within the range, charge balance may be maintained in the emission layer, and thus, efficiency and lifespan may be improved.

In one embodiment, the host may further include a third compound, in addition to the first compound and the second compound. The first compound, the second compound, the third compound, and the dopant are different from each other.

When the carrier transport characteristics of the first host compound and/or the second host compound are insufficient, charge balance of the emission layer may be attained by introducing a third compound that is different from the first compound and the second compound. Thus, efficiency and lifespan of an organic light-emitting device may be further improved.

In one or more embodiments, the third compound may be an electron transport host, a hole transport host, or a bipolar host.

Two (e.g., any two) of the host compounds in the emission layer may have different HOMO and LUMO energy levels and form an exciplex, and the difference between the HOMO energy level and the LUMO energy level of the exciplex ($\Delta E_{exciplex}$) may be greater than the difference between the HOMO energy level and the LUMO energy level of the dopant ($\Delta E_{dopant}$).

In respective embodiments, the first compound and the second compound may form an exciplex, the second compound and the third compound may form an exciplex, or the first compound and the third compound may form an exciplex, but embodiments of the present disclosure are not limited thereto.

In one embodiment, the first compound, the second compound, and the third compound may each have a higher triplet energy level (T1) than the dopant.

When the first compound, and the second compound, and the third compound each have a triplet energy level (T1) satisfying the described condition, excitons formed by recombination in any host or an exciplex may be efficiently transferred to a dopant.

In one embodiment, the third compound may have electron transport characteristics or hole transport characteristics.

In one or more embodiments, the first compound may be an electron transport host, and the second compound and the third compound may each be a hole transport host. In one or more embodiments, the first compound and the second compound may each be an electron transport host, and the third compound may be a hole transport host. In one or more embodiments, the first compound and the third compound may each be an electron transport host, and the second compound may be a hole transport host. The third compound may supplement carrier transport characteristics that are relatively insufficient in an emission layer including a composition of the first compound and the second compound.

In one or more embodiments, the third compound may include an electron transport moiety.

In one or more embodiments, the third compound may not include an electron transport moiety.

In one embodiment, the third compound may be selected from compounds represented by Formulae 1 to 3 above.

In one or more embodiments, the third compound may be selected from Compounds C1 to C12 and H1 to H55, but embodiments of the present disclosure are not limited thereto:

C1

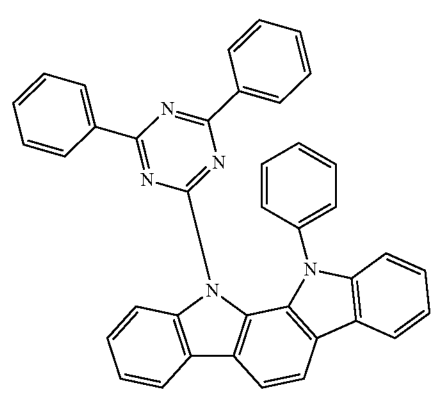

-continued
C2
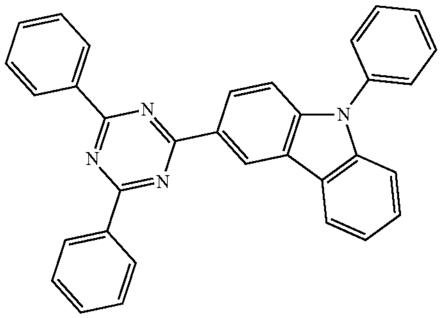
C3
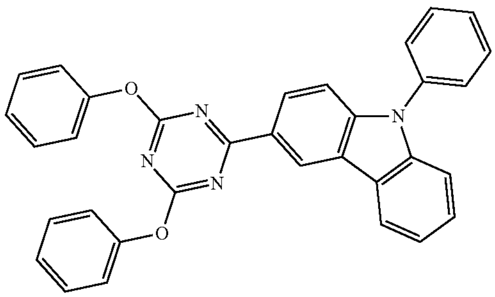
C4
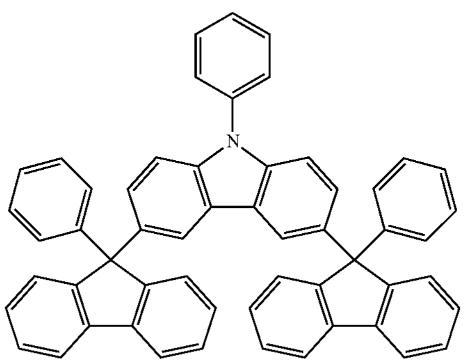
C5
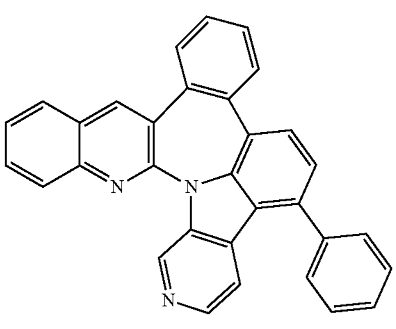
-continued
C6
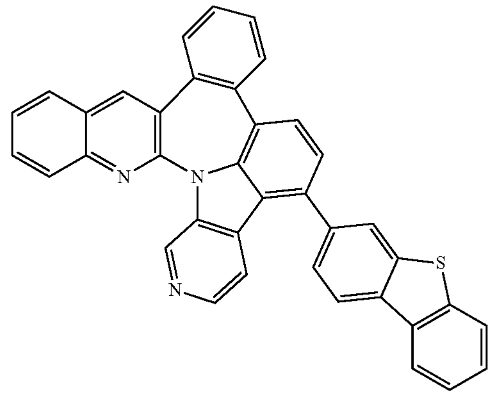
C7
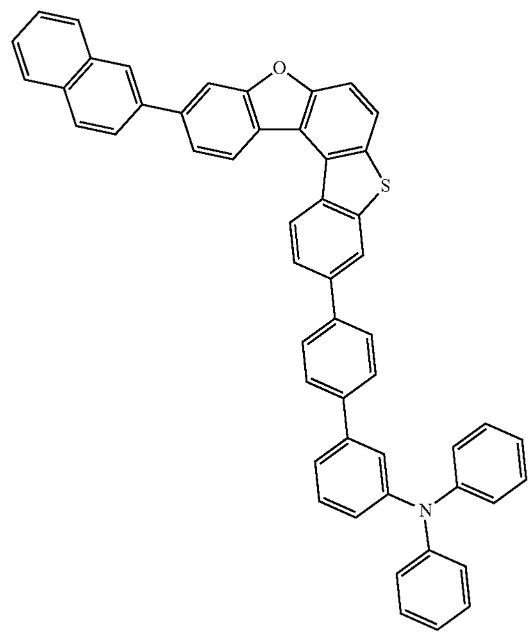
C8
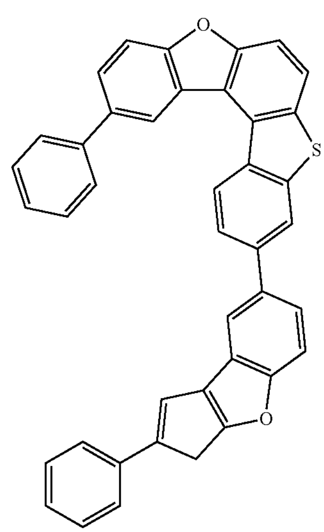

-continued
C9
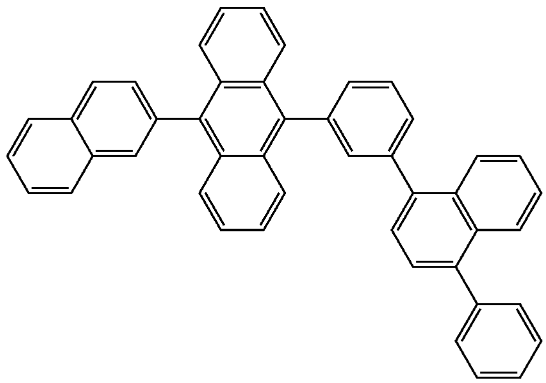
C10
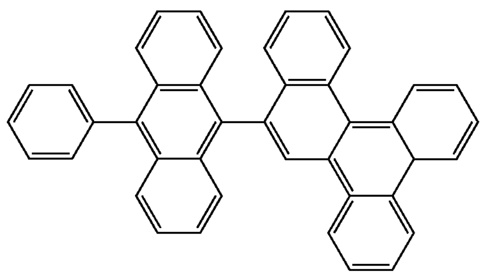
C11
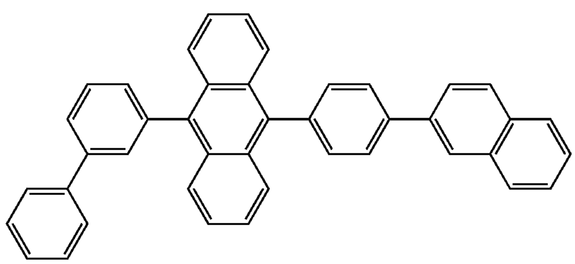
C12
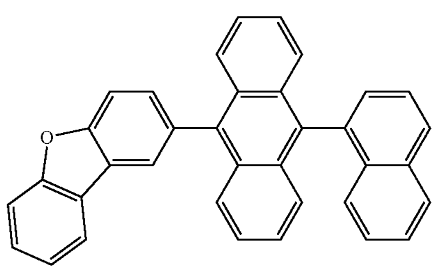
H1
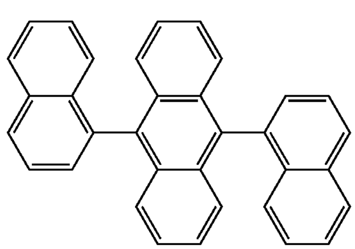
-continued
H2
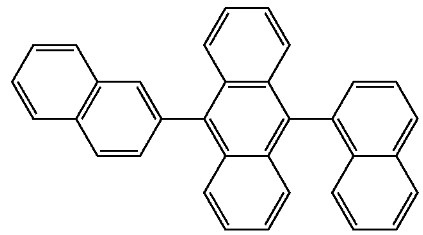
H3
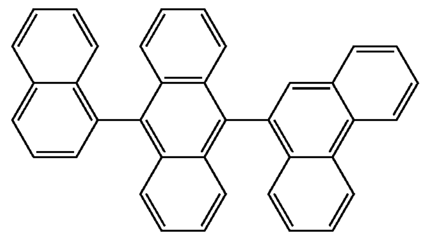
H4
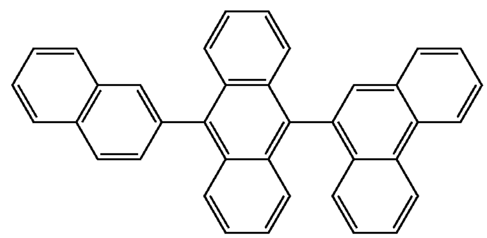
H5
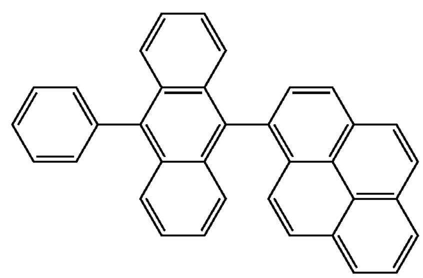
H6
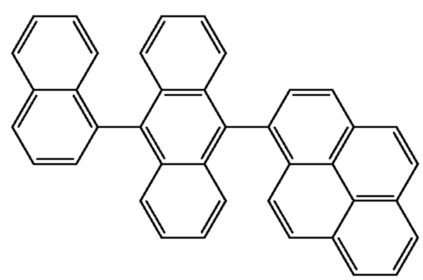
H7
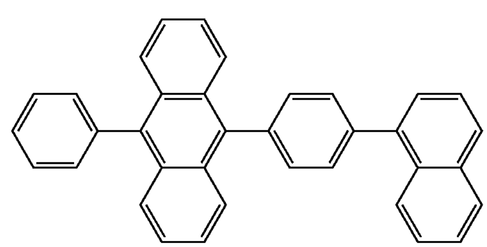

-continued
H8
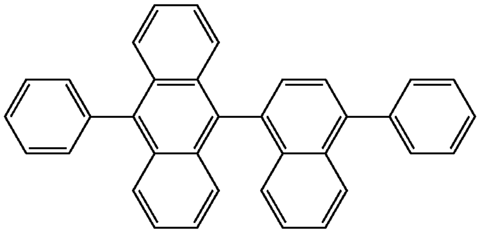
H9
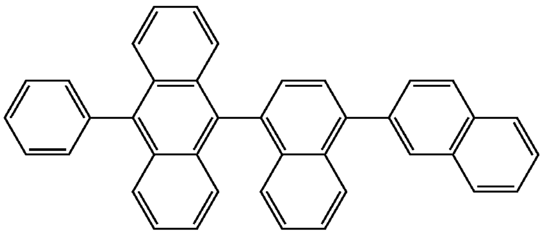
H10
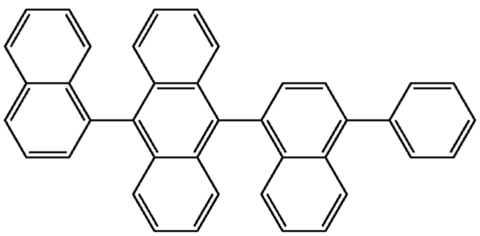
H11
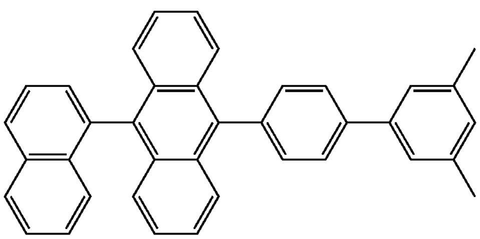
H12
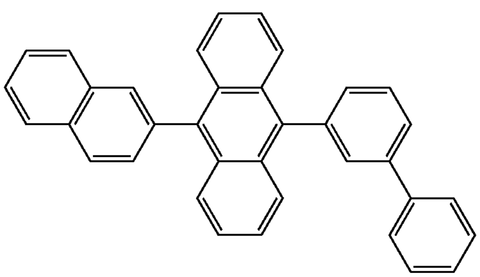
H13
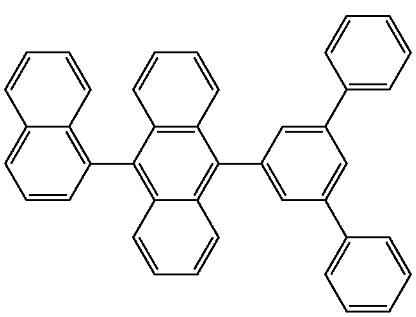
-continued
H14
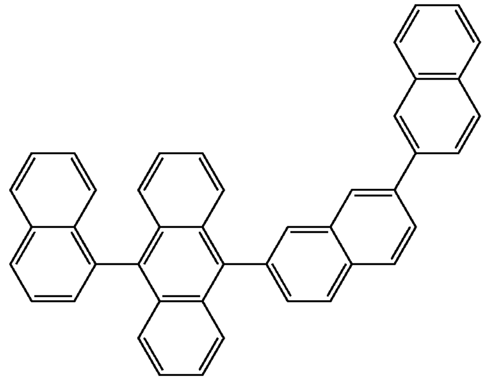
H15
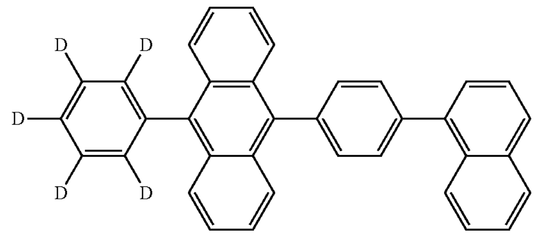
H16
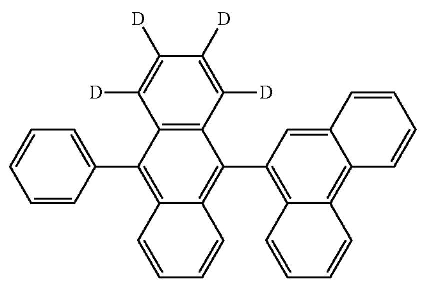
H17
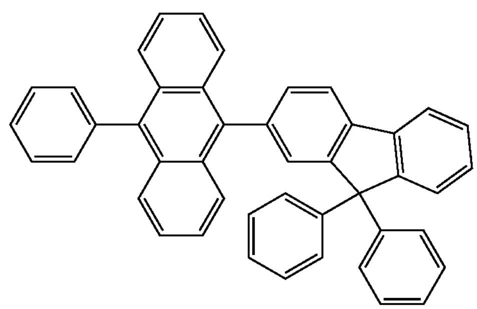
H18
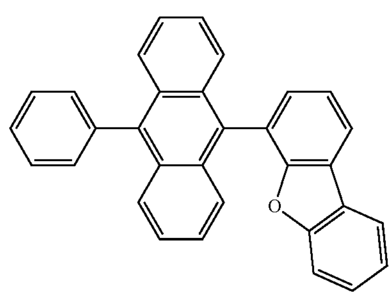

-continued
H19
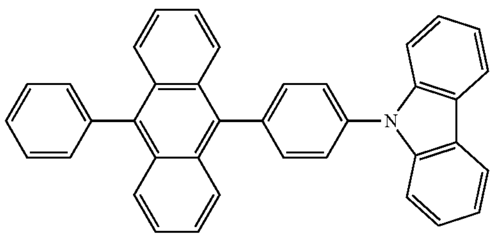
H20
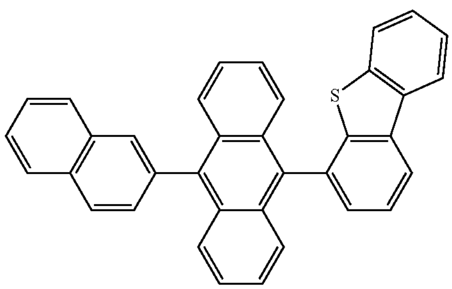
H21
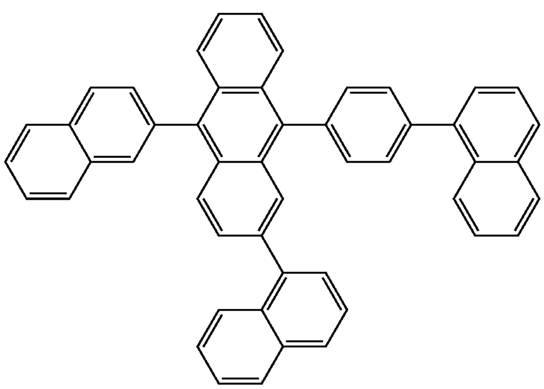
H22
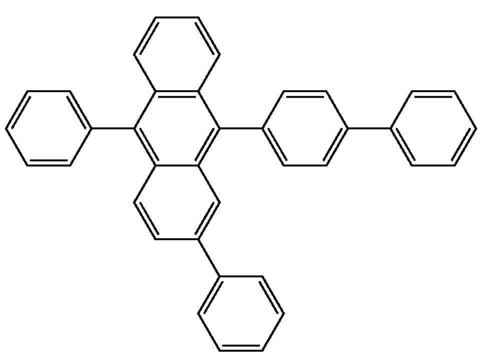
-continued
H23
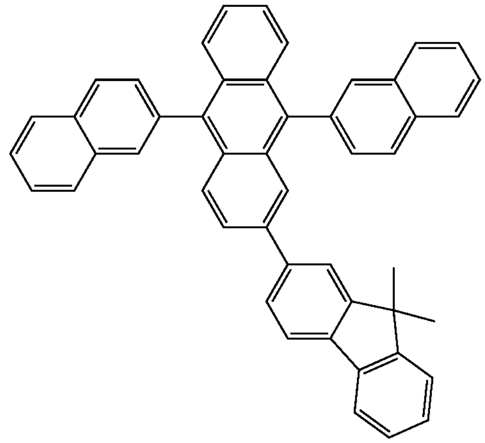
H24
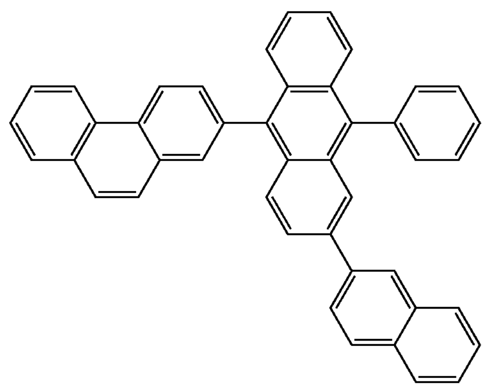
H25
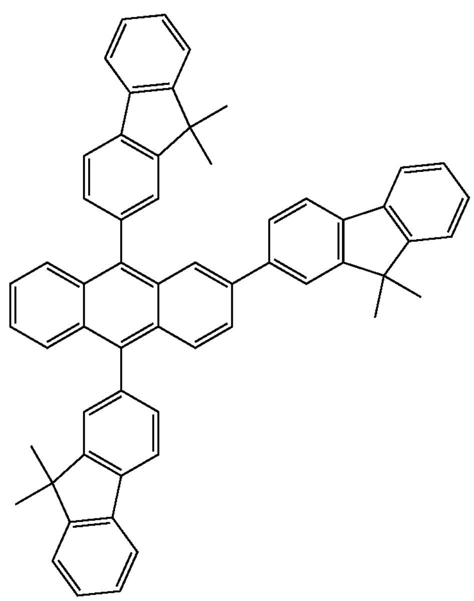

-continued
H26
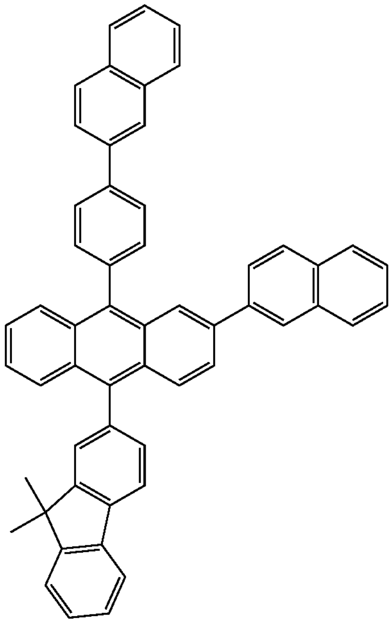
H27
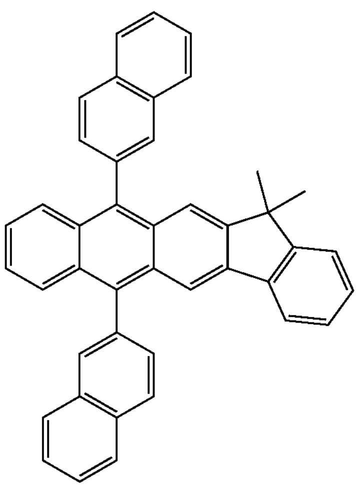
H28
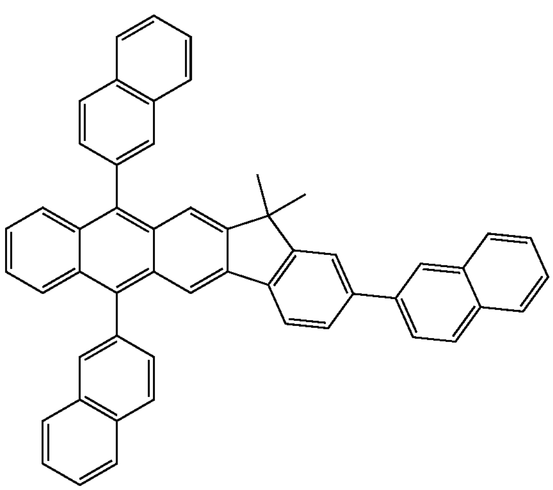
-continued
H29
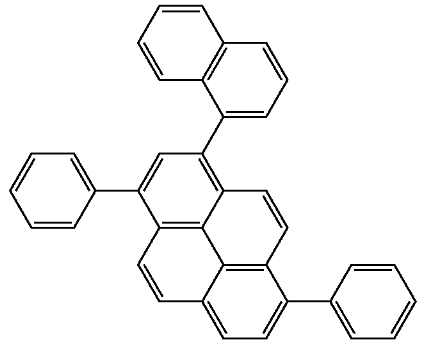
H30
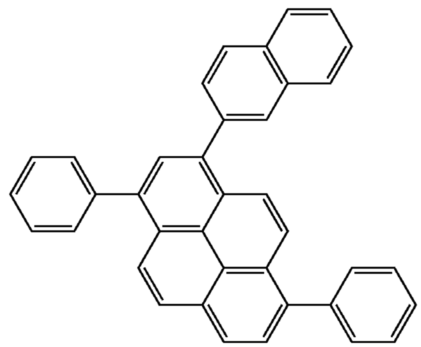
H31
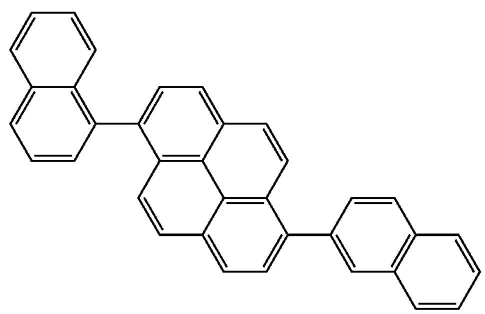
H32
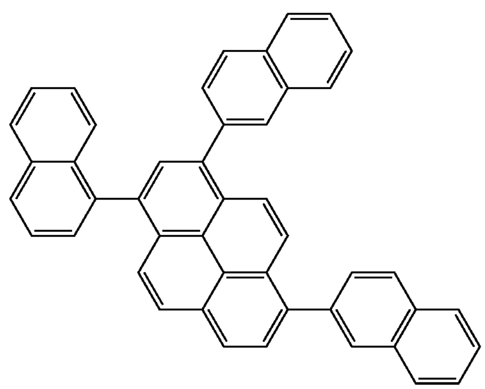
H33
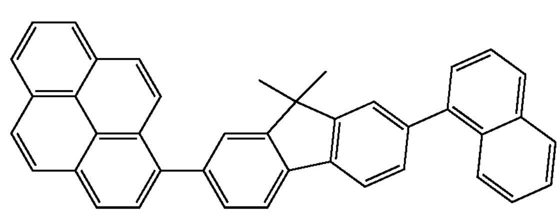

-continued
H34
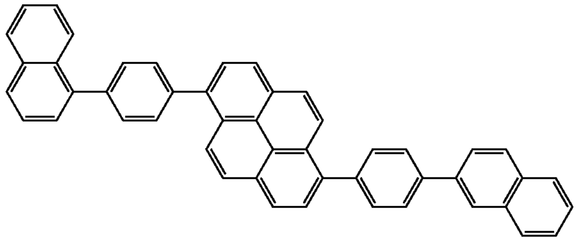
H35
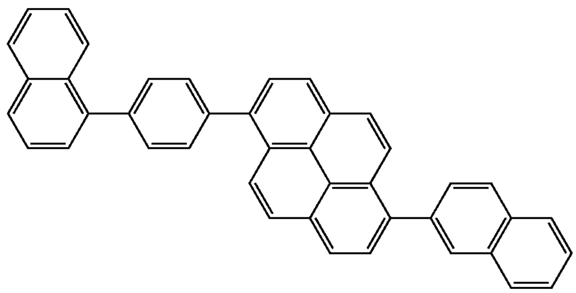
H36
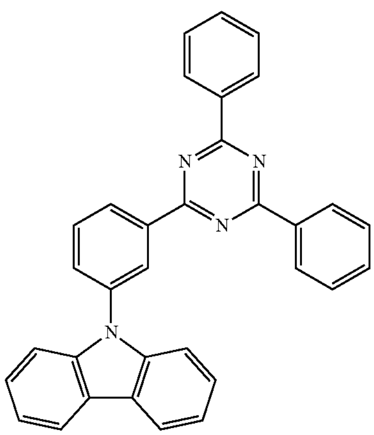
H37
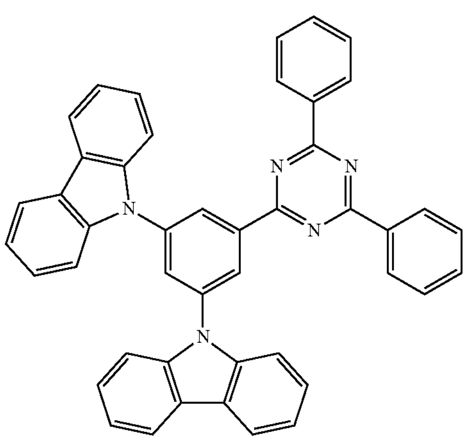
-continued
H38
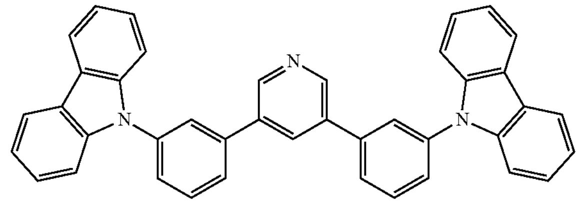
H39
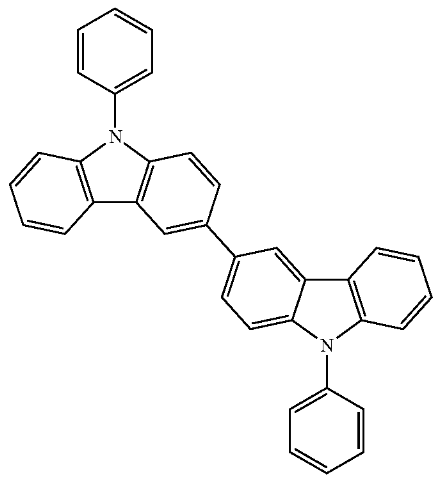
H40
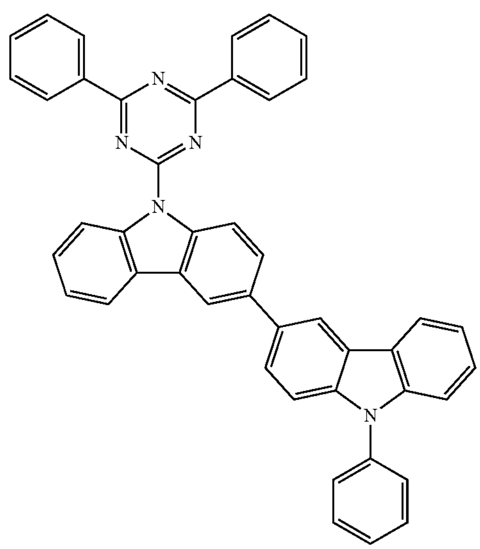

H41
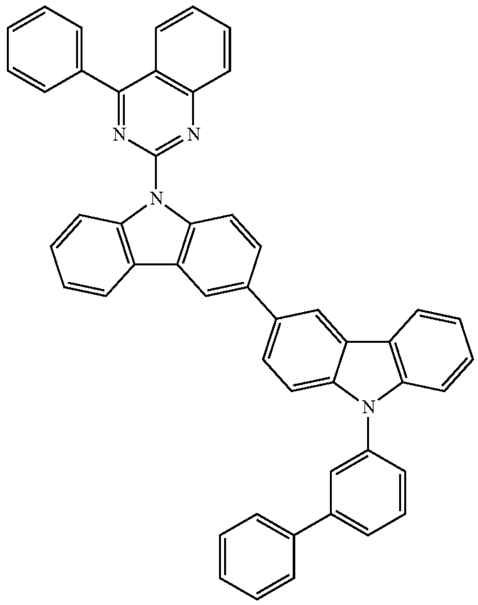
H42
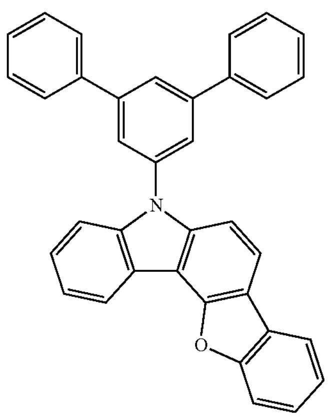
H43
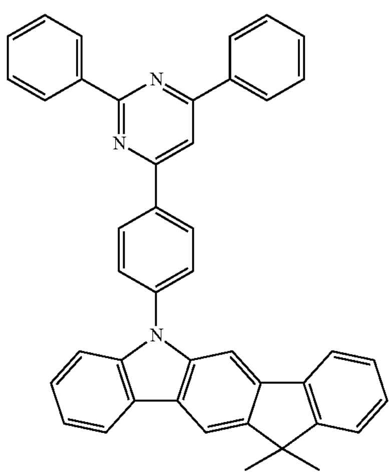
H44
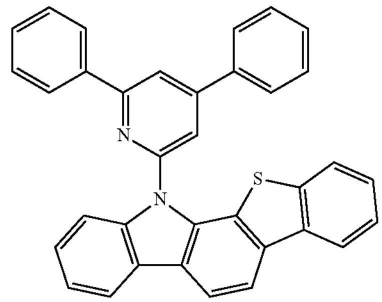
H45
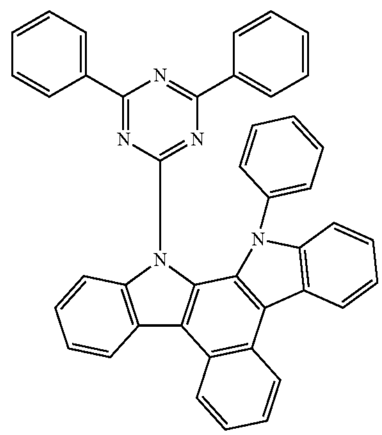
H46
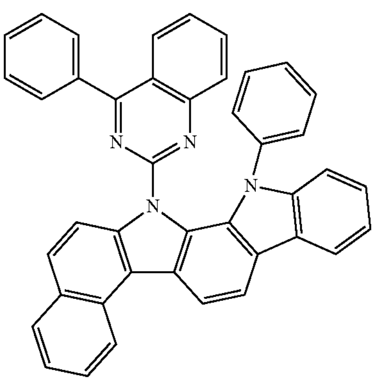
H47
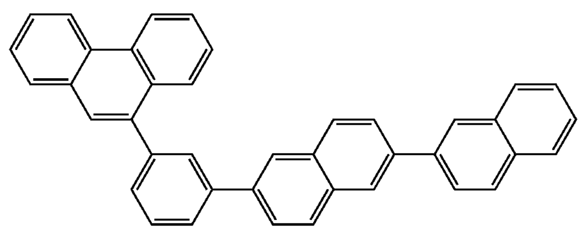
H48
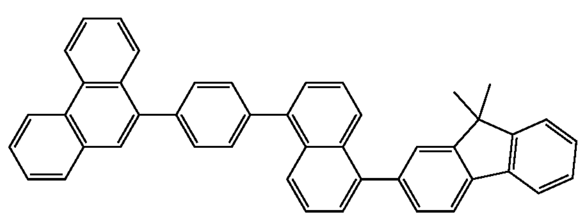

-continued

H49

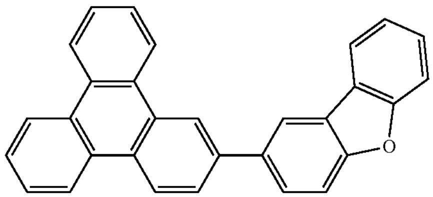

H50

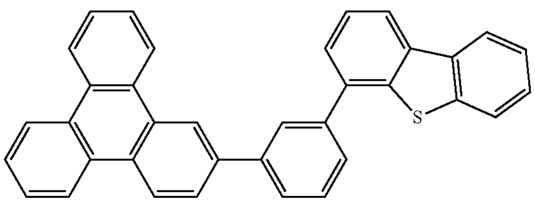

H51

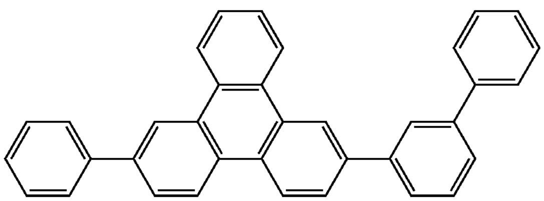

H52

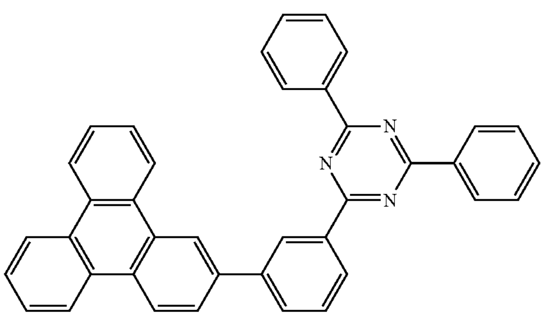

H53

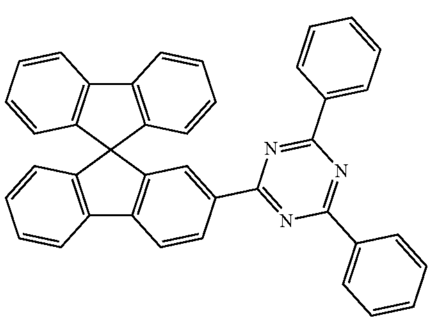

-continued

H54

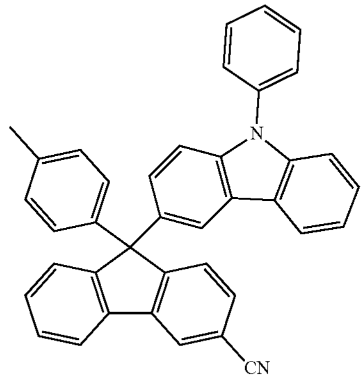

H55

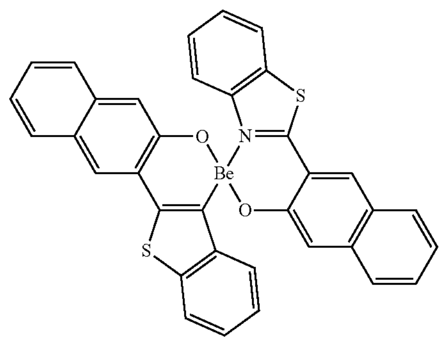

In one or more embodiments, the first compound to the third compound may each independently be selected from Compounds C1 to C12 and H1 to H55, but the first compound, the second compound, and the third compound are different from one another. At the same time (e.g., simultaneously), an electron transport capability of the second compound may be smaller than that of the first compound.

When the host includes the first compound, the second compound, and the third compound, a weight ratio of the first compound and the second compound to the third compound may be about 1:99 to about 99:1. In this case, a weight ratio of the first compound to the second compound may be about 10:90 to about 90:10. When theses ranges are satisfied, the electron transporting capacity of the first compound and the hole transport capacity of the second compound may be balanced, such that bipolar characteristics may be realized, and the third compound may supplement the carrier transport characteristics that are relatively insufficient in an emission layer. Thus, the efficiency and/or lifespan of an organic light-emitting device may be improved. In one or more embodiments, a weight ratio of the first compound and the second compound to the third compound may be about 10:90 to about 90:10, about 20:80 to about 80:20, about 30:70 to about 70:30, about 40:60 to about 70:30, or about 50:50 to about 70:30.

In one or more embodiments, the emission layer may further include two or more hosts (e.g., at least four or more host compounds in total), and the two or more hosts, the first compound, the second compound, and the dopant may be different from each other.

In this case, two of the compounds having different HOMO and LUMO energy levels among the N hosts included in the emission layer (where N is an integer of 4 or more) may form an exciplex, and a difference between the HOMO energy level and the LUMO energy level of the exciplex ($\Delta E_{exciplex}$) may be greater than the difference between the HOMO energy level and the LUMO energy level of the dopant ($\Delta E_{dopant}$).

When there are N different hosts included in the emission layer, the emission layer may include a first compound to an Nth compound.

For example, the emission layer of the organic light-emitting device (10) may include one of the following combinations:

i) a first compound, a second compound, and a dopant;

ii) a first compound, a second compound, a third compound, and a dopant; and iii) a first compound, a second compound, a third compound, . . . , an (N−1)th compound, an Nth compound, and a dopant.

The exciplex may have an energy band gap ($\Delta E_{exciplex}$) of, for example, about 2.5 eV to about 3.5 eV.

When the dopant is a red dopant, the dopant may have an energy band gap ($\Delta E_{dopant}$) of about 1.7 eV to about 3.2 eV. When the dopant is a green dopant, the dopant may have an energy band gap ($\Delta E_{dopant}$) of about 1.9 eV to about 3.2 eV. When the dopant is a blue dopant, the dopant may have an energy band gap ($\Delta E_{dopant}$) of about 2.0 eV to about 3.0 eV.

The dopant may be, for example, a phosphorescent dopant or a fluorescent dopant. The phosphorescent dopant or a fluorescent dopant may each be a red, green, or blue dopant. In one or more embodiments, the phosphorescent dopant may be a red or green phosphorescent dopant, and/or the fluorescent dopant may be a blue fluorescent dopant.

In one or more embodiments, an amount of the dopant in the emission layer may be about 0.01 parts by weight to about 30 parts by weight based on about 100 parts by weight of the host, but embodiments of the present disclosure are not limited thereto.

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers may contact each other or may be separated from each other. In one or more embodiments, the emission layer may include two or more materials selected from a red light-emitting material, a green light-emitting material, and a blue light-emitting material, in which the two or more materials are mixed with each other in a single layer to emit white light.

When the emission layer is patterned into a red emission layer, a green emission layer, or a blue emission layer, according to a subpixel, at least one of the red emission layer, the green emission layer, and the blue emission layer may include the first compound, the second compound, and the dopant, or in some embodiments may include the first compound, the second compound, the third compound, and the dopant.

A thickness of the emission layer may be about 100 Å to about 1,000 Å, for example, about 200 Å to about 600 Å. When the thickness of the emission layer is within this range, excellent light-emission characteristics may be obtained without a substantial increase in driving voltage.

The organic layer 150 may further include a hole transport region between the first electrode 110 and the emission layer and an electron transport region between the emission layer and the second electrode 190.

Hole Transport Region in Organic Layer 150

The hole transport region may have: i) a single-layered structure including (e.g., consisting of) a single material, ii) a single-layered structure including (e.g., consisting of) a plurality of different materials, or iii) a multi-layered structure having a plurality of layers including (e.g., consisting of) a plurality of different materials.

The hole transport region may include at least one layer selected from a hole injection layer, a hole transport layer, an emission auxiliary layer, and an electron blocking layer.

For example, the hole transport region may have a single-layered structure including (e.g., consisting of) a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein constituting layers of each structure are sequentially stacked from the first electrode 110 in each stated order, but the structure of the hole transport region is not limited thereto.

The hole transport region may include an arylamine compound or a hole transport polymer.

In one or more embodiments, the hole transport region may include at least one selected from m-MTDATA, TDATA, 2-TNATA, NPB(NPD), β-NPB, TPD, spiro-TPD, spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201, and a compound represented by Formula 202:

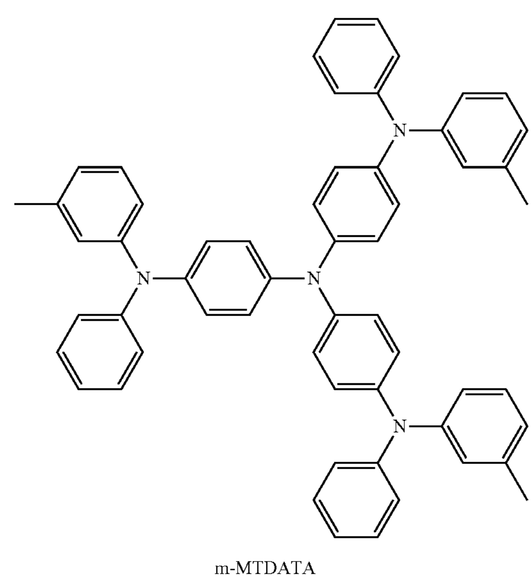

m-MTDATA

-continued
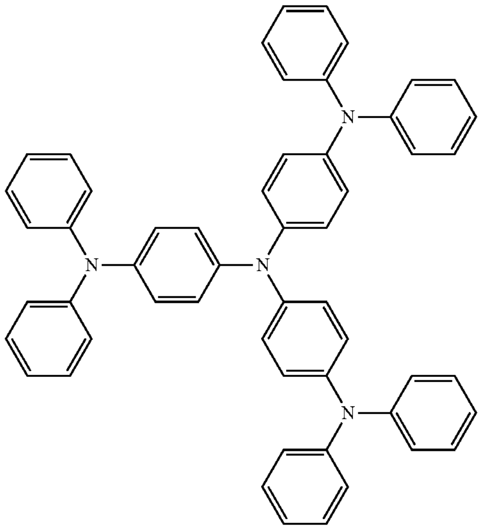
TDATA
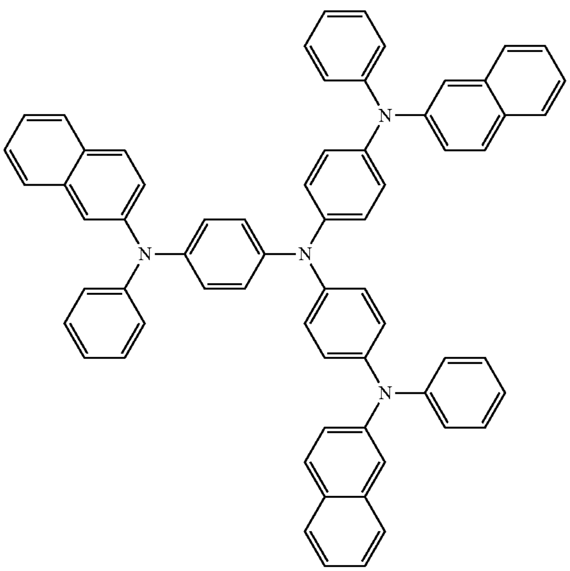
2-TNATA
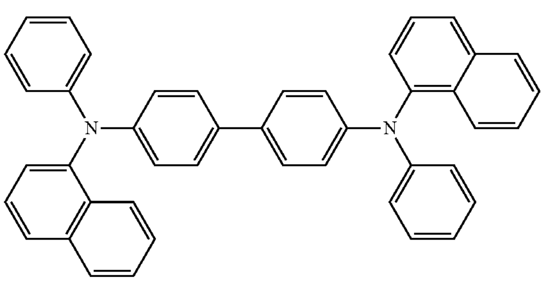
NPB
-continued
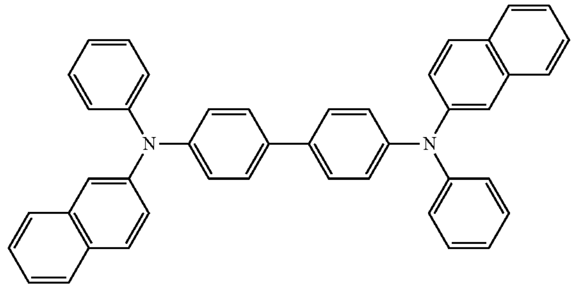
β-NPB
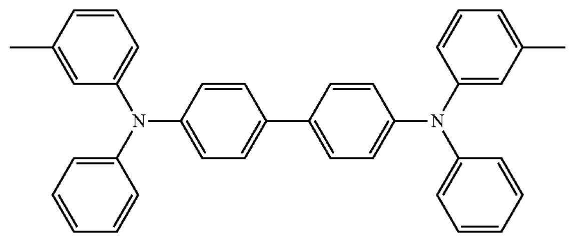
TPD
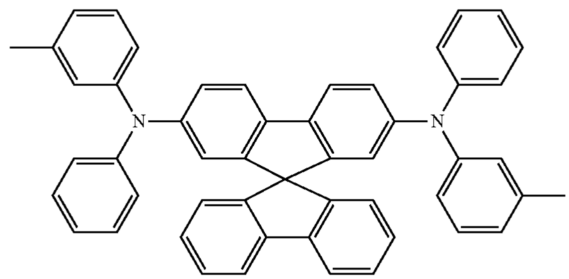
Spiro-TPD
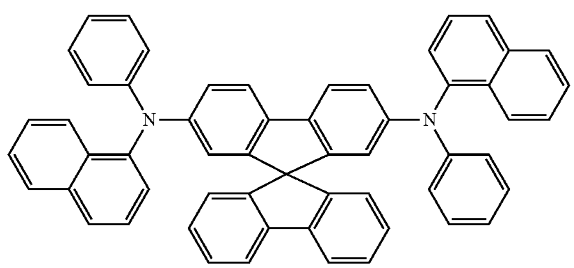
Spiro-NPB
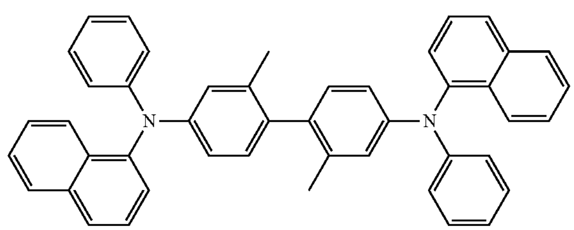
methylated NPB -continued

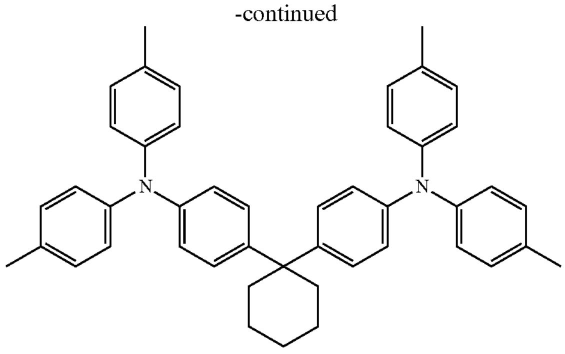

TAPC

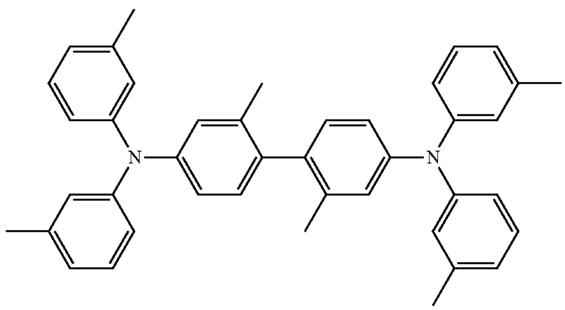

HMTPD

Formula 201

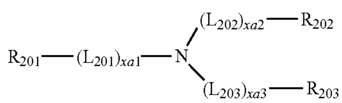

Formula 202

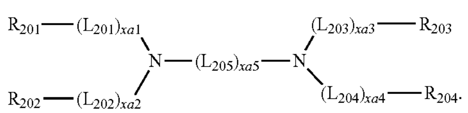

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one embodiment, xa1 to xa4 may each independently be 0, 1, or 2.

In one embodiment, xa5 may be 1, 2, 3, or 4.

In one embodiment, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be the same as described above.

In one embodiment, at least one of $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one embodiment, in Formula 202, i) $R_{201}$ and $R_{202}$ may be linked to each other via a single bond, and/or ii) $R_{203}$ and $R_{204}$ may be linked to each other via a single bond.

In one embodiment, at least one of $R_{201}$ to $R_{204}$ in Formula 202 may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201-1:

Formula 201-1

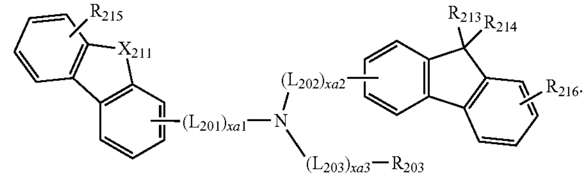

In one embodiment, the compound represented by Formula 201 may be represented by Formula 201-2, but embodiments of the present disclosure are not limited thereto:

Formula 201-2

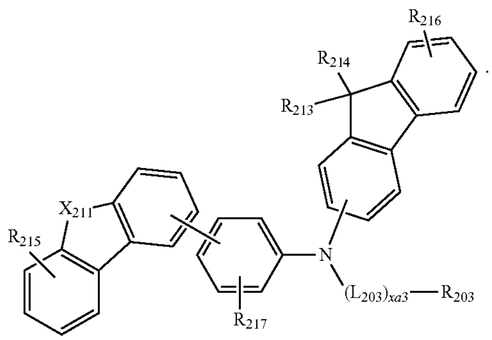

In one or more embodiments, the compound represented by Formula 201 may be represented by Formula 201-2(1), but embodiments of the present disclosure are not limited thereto:

Formula 201-2(1)

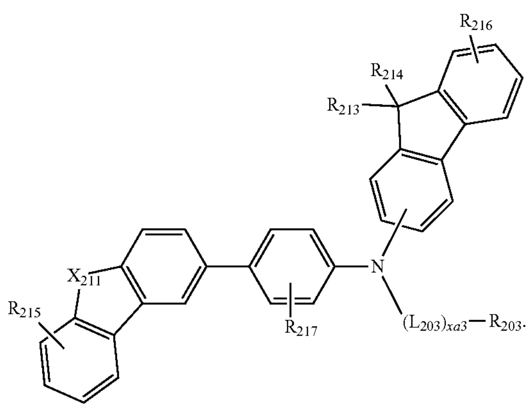

In one or more embodiments, the compound represented by Formula 201 may be represented by Formula 201A:

Formula 201A

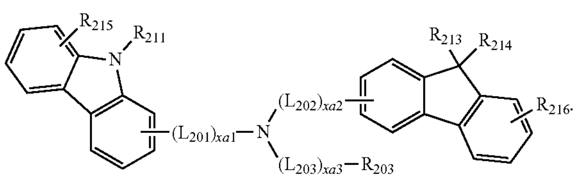

In one or more embodiments, the compound represented by Formula 201 may be represented by Formula 201A(1), but embodiments of the present disclosure are not limited thereto:

Formula 201A(1)

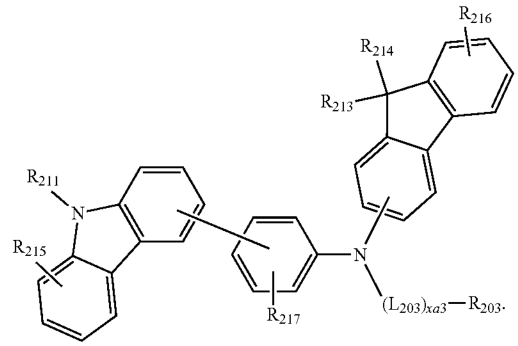

In one or more embodiments, the compound represented by Formula 201 may be represented by Formula 201A-1, but embodiments of the present disclosure are not limited thereto:

Formula 201A-1

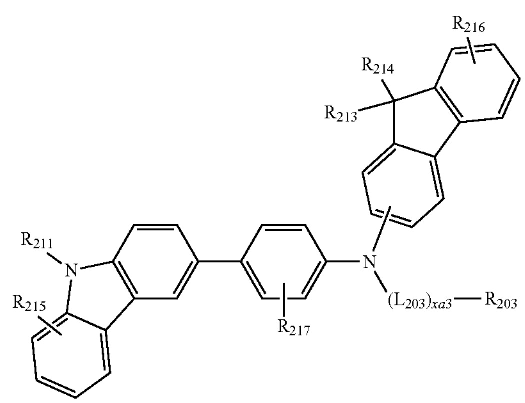

In one or more embodiments, the compound represented by Formula 202 may be represented by Formula 202-1:

Formula 202-1

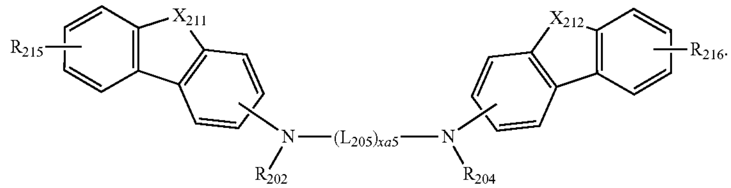

In one or more embodiments, the compound represented by Formula 202 may be represented by Formula 202-1(1):

Formula 202-1(1)

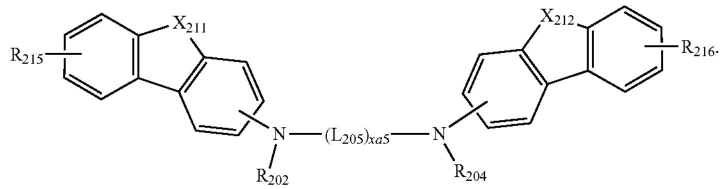

In one embodiment, the compound represented by Formula 202 may be represented by Formula 202A:

Formula 202A

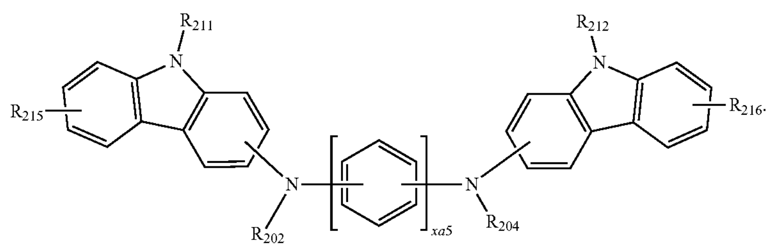

In one or more embodiments, the compound represented by Formula 202 may be represented by Formula 202A-1:

Formula 202A-1

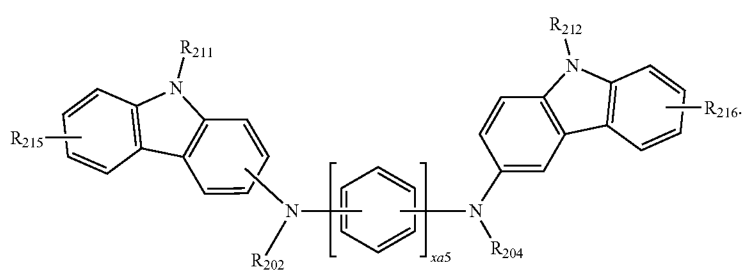

In Formulae 201-1, 201-2, 201-2(1), 201A, 201A(1), 201A-1, 202-1, 202-1(1), 202A, and 202A-1, $L_{201}$ to $L_{203}$, xa1 to xa3, xa5, and $R_{202}$ to $R_{204}$ may each independently be the same as described above, $L_{205}$ may be selected from a phenylene group, and a fluorenylene group, $X_{211}$ may be selected from O, S, and $N(R_{211})$, $X_{212}$ may be selected from O, S, and $N(R_{212})$, $R_{211}$ and $R_{212}$ may each independently be the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT72, but compounds to be included in the hole transport region are not limited thereto:

HT1

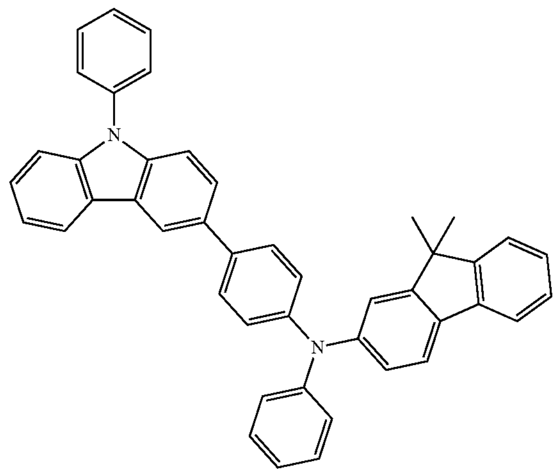

HT2

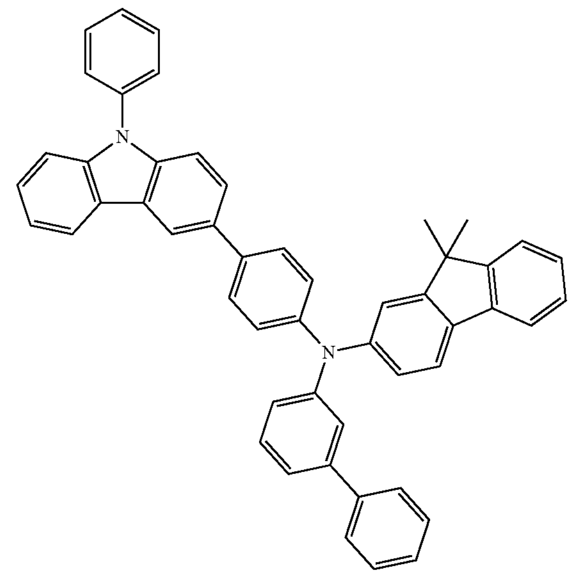

HT3

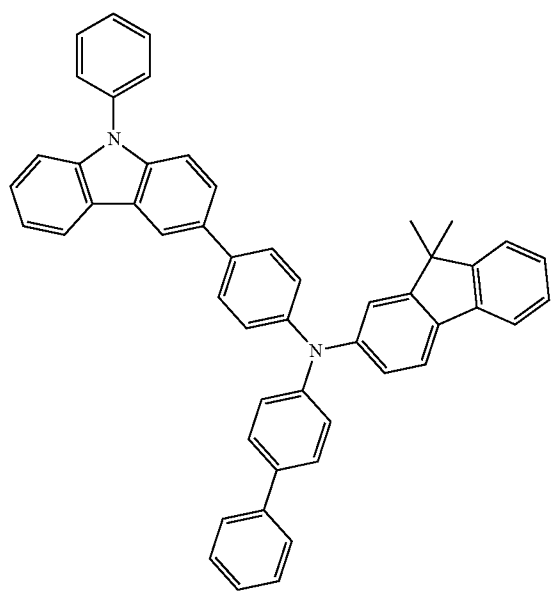

HT4

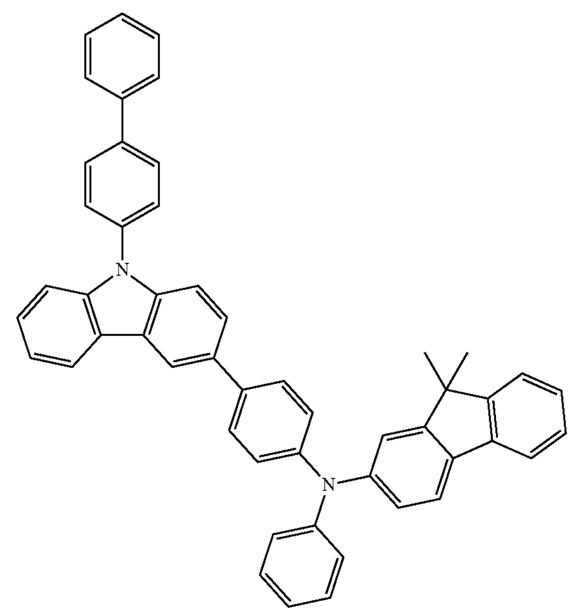

-continued
HT5
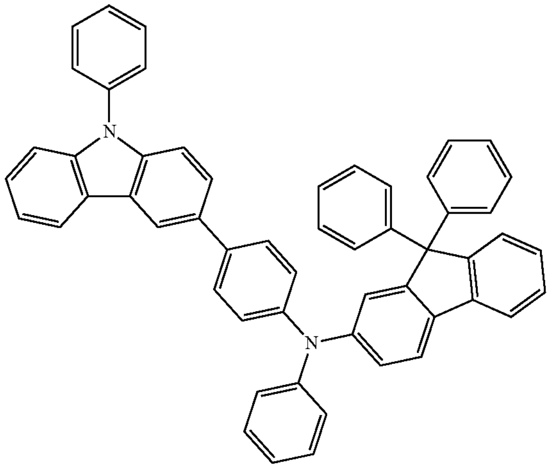
HT6
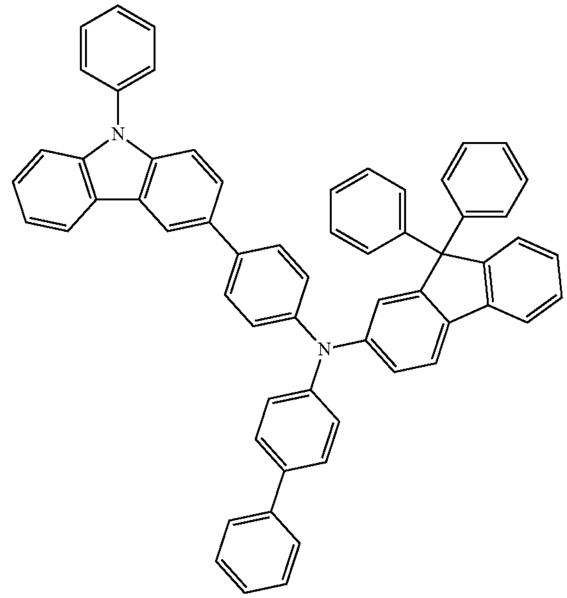
HT7
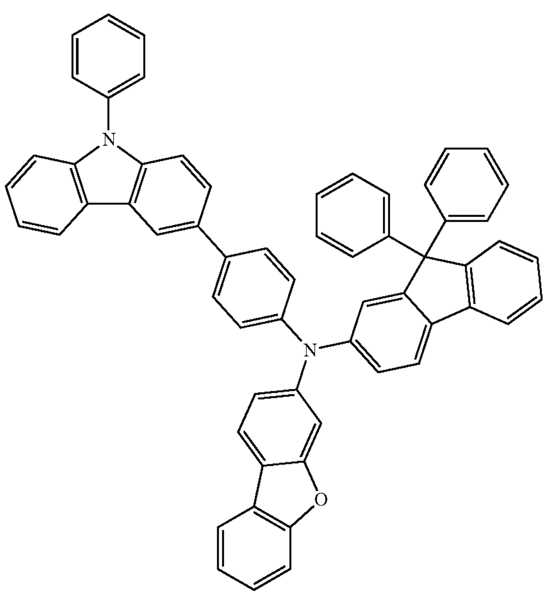
HT8
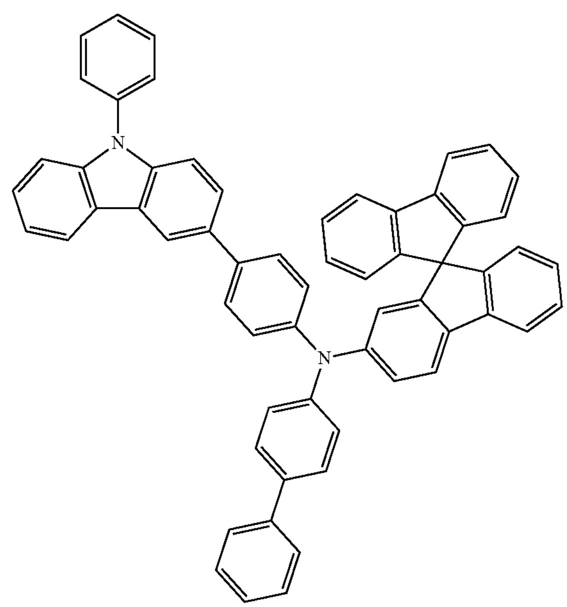

-continued
HT9
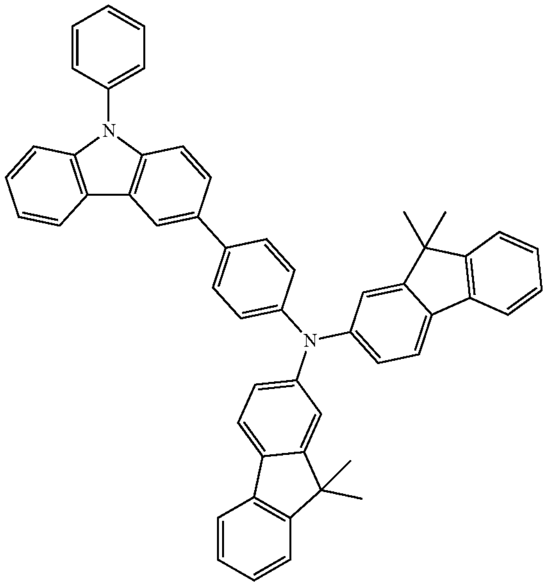
HT10
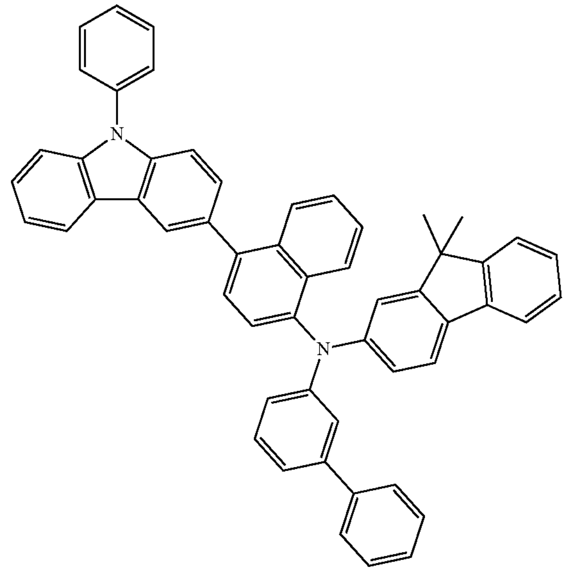
HT11
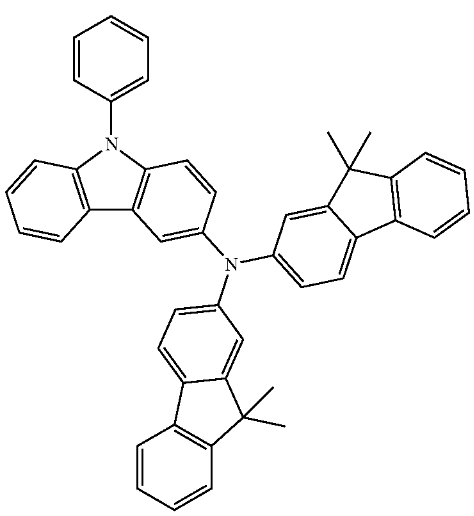
HT12
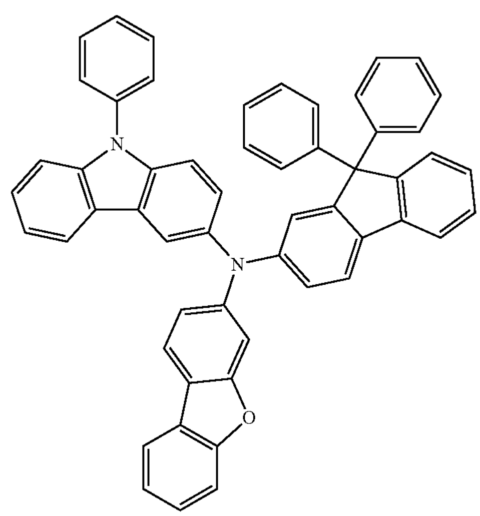

-continued
HT13
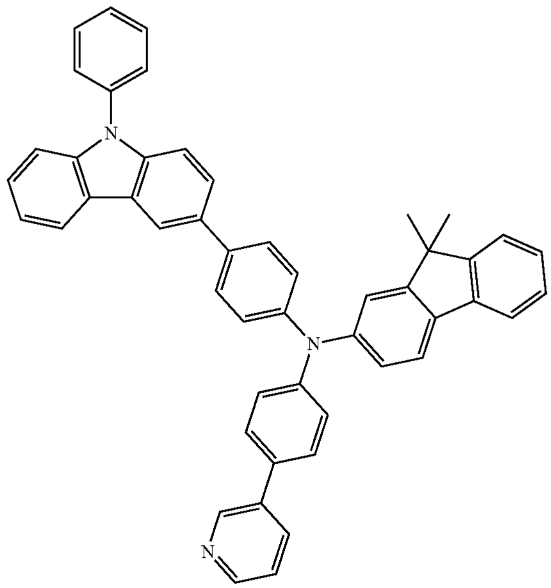
HT14
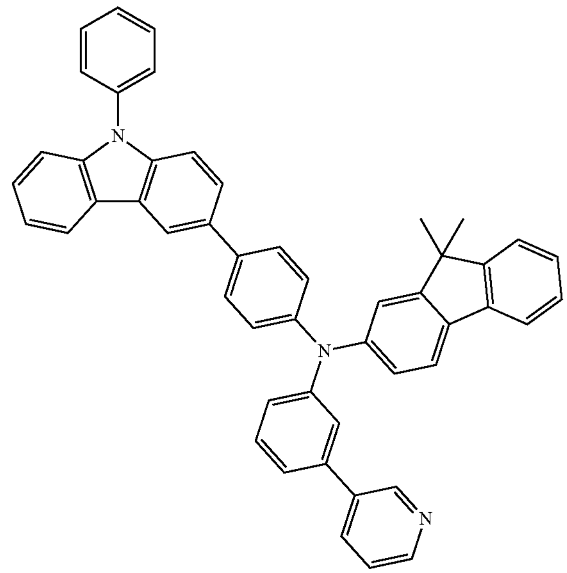
HT15
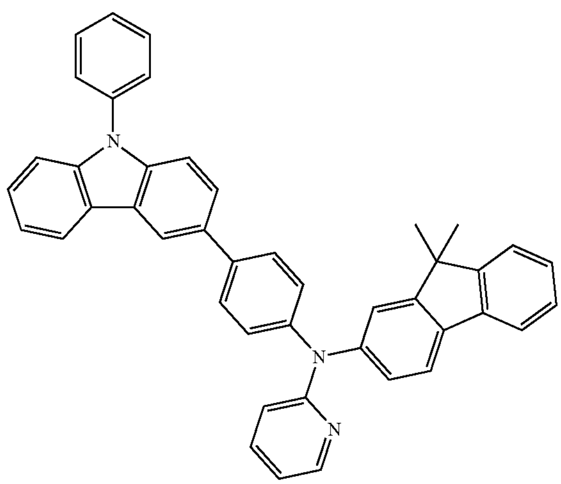
HT16
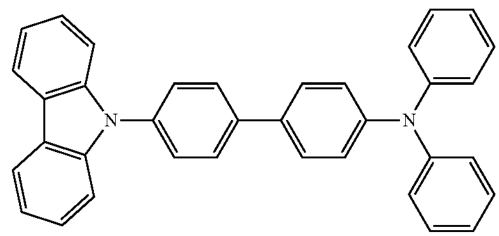
HT17
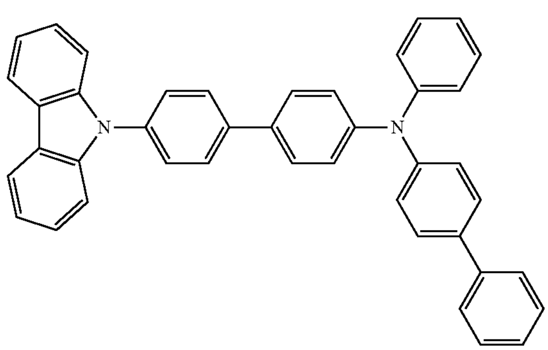
HT18
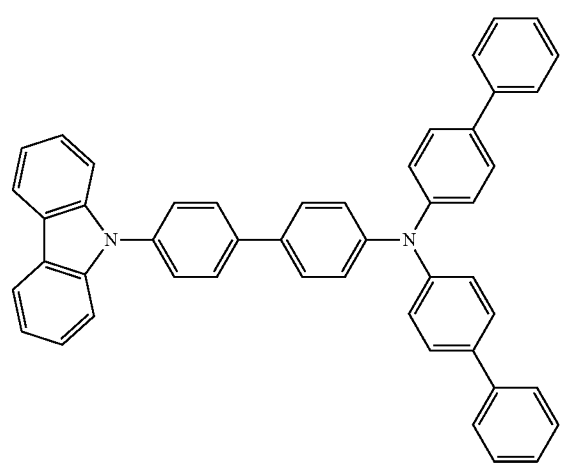

-continued
HT19
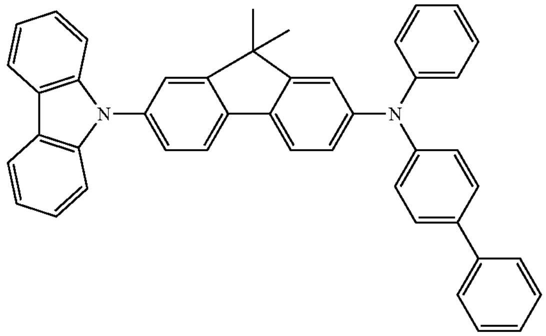
HT20
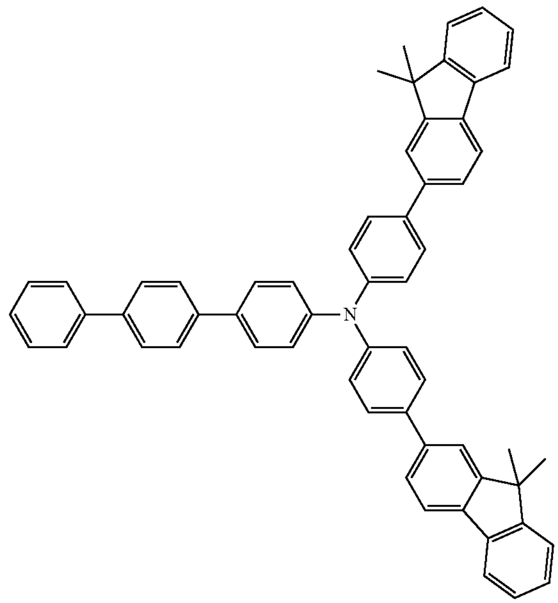
HT21
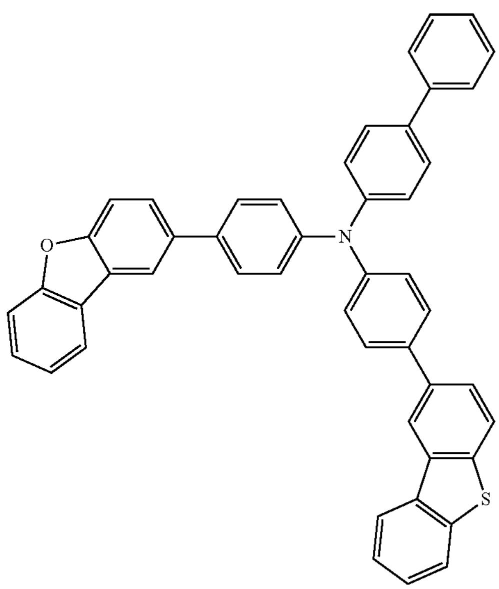
HT22
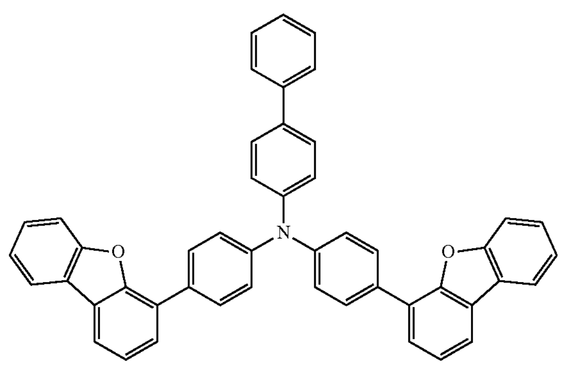

-continued
HT23
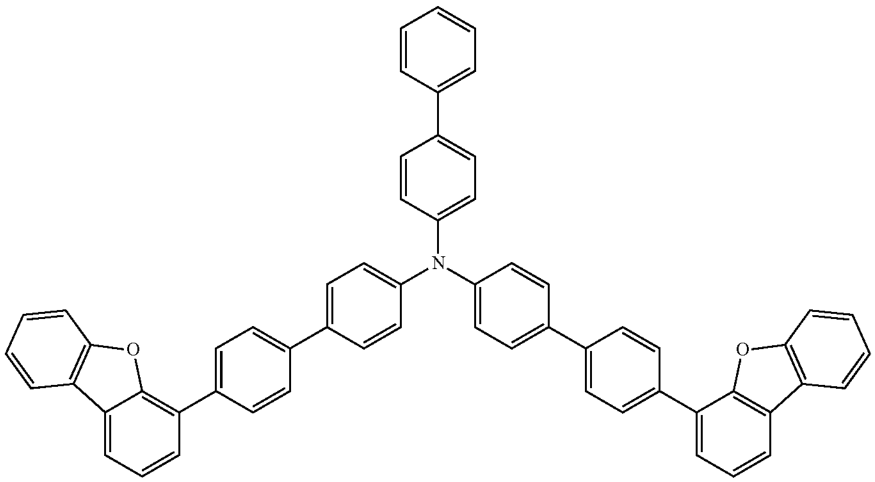
HT24
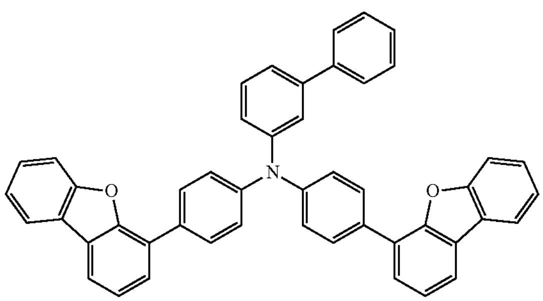
HT25
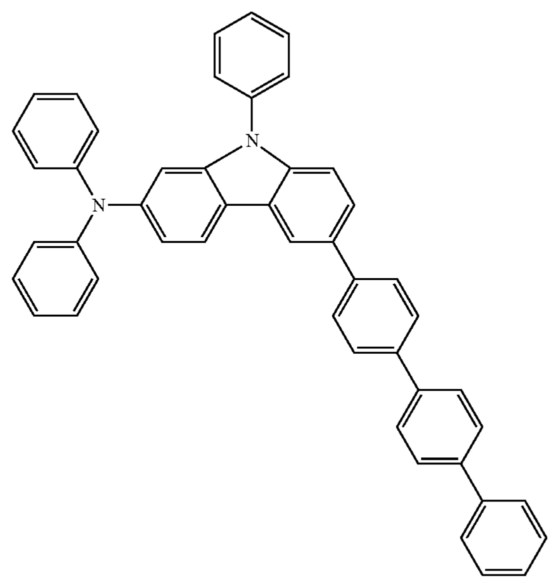
HT26
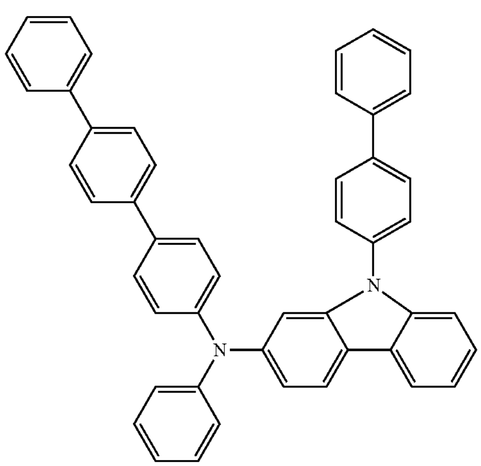
HT27
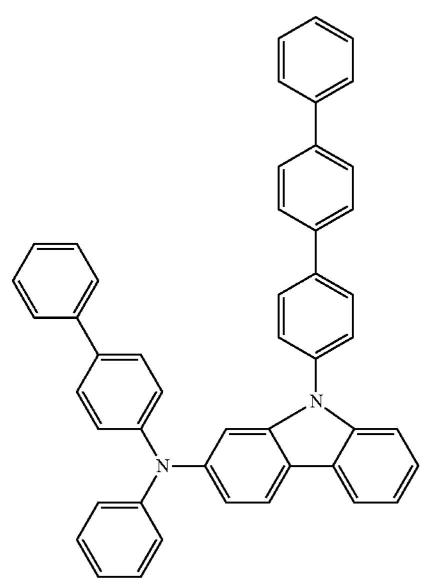

-continued
HT28
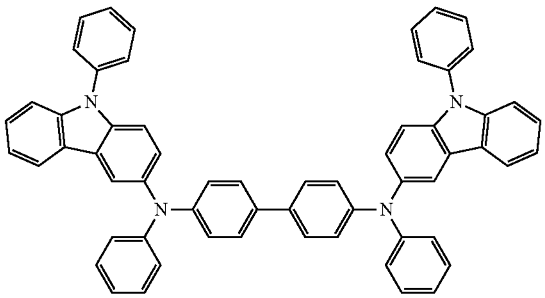
HT29
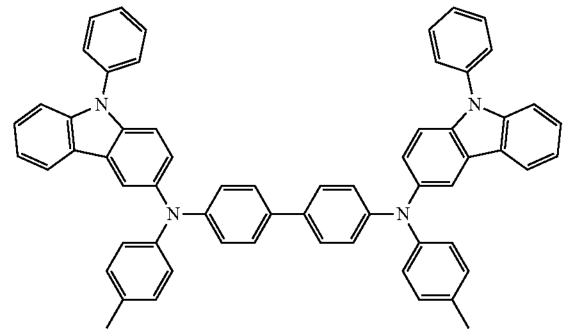
HT30
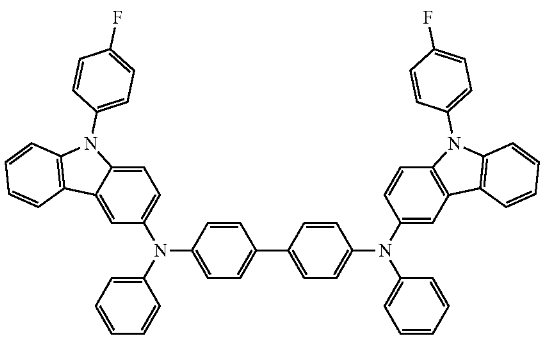
HT31
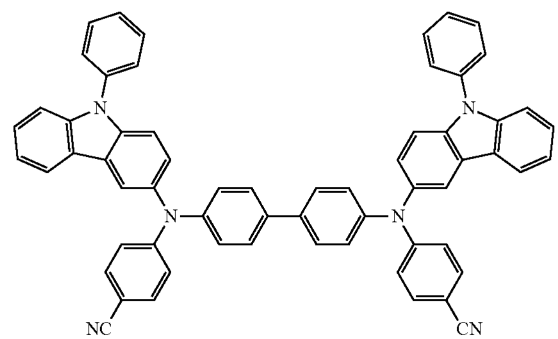
HT32
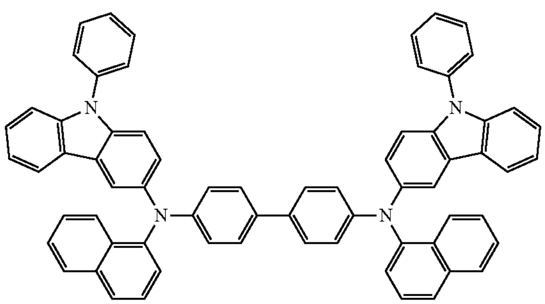
HT33
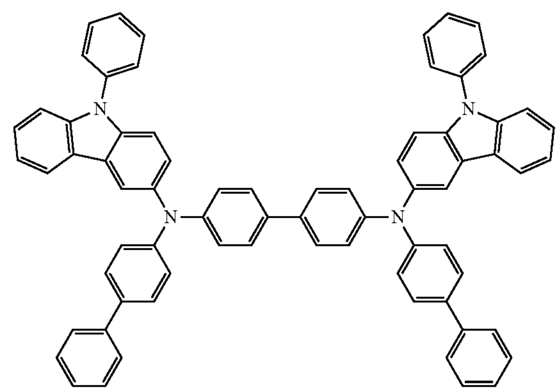
HT34
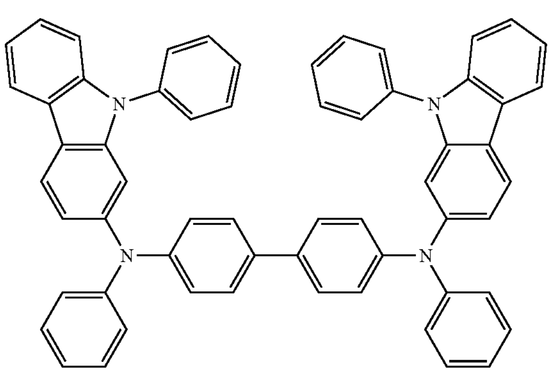
HT35
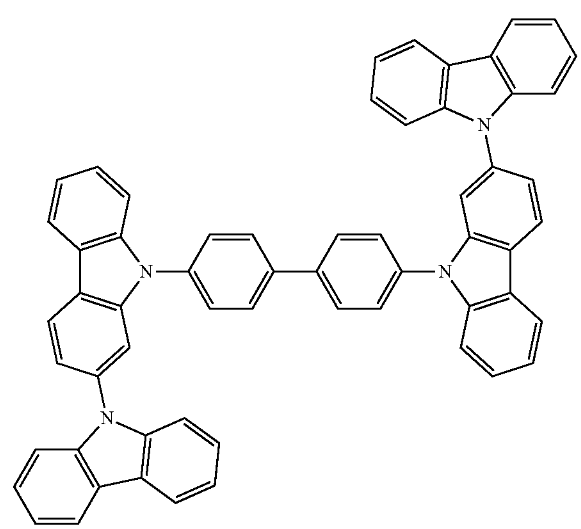

-continued
HT36
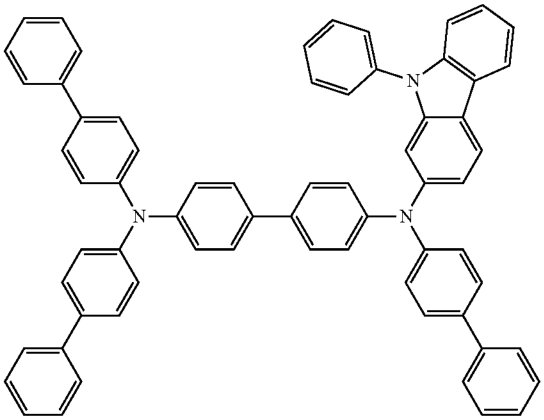
HT37
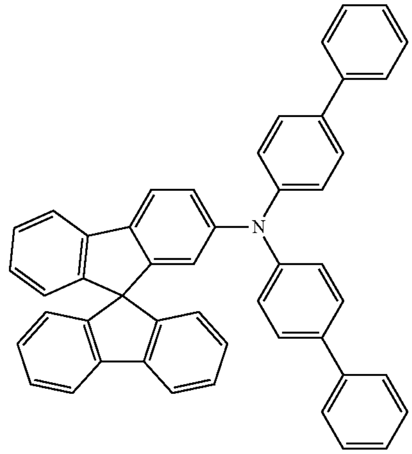
HT38
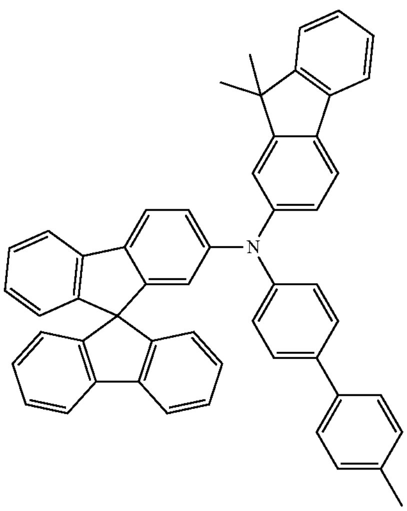
HT39
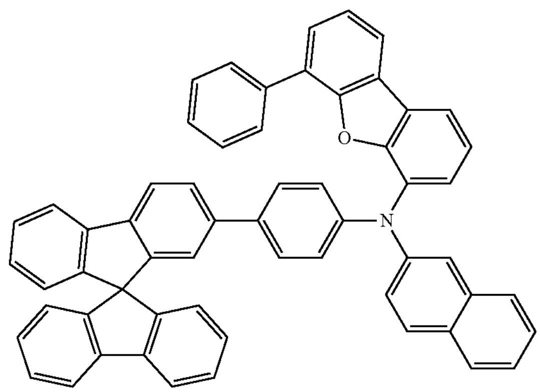
HT40
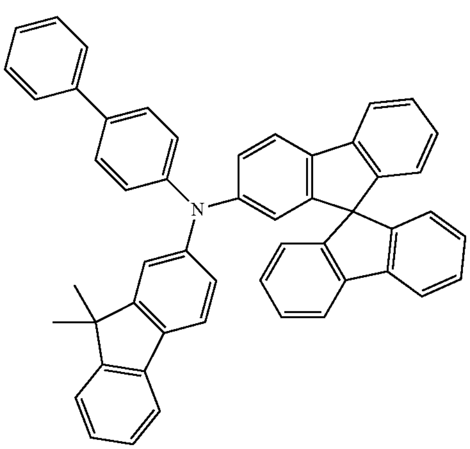
HT41
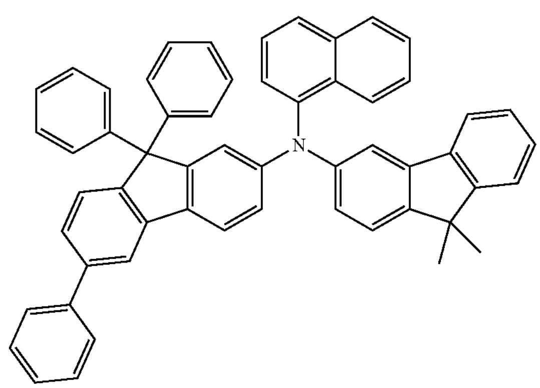

-continued
HT42
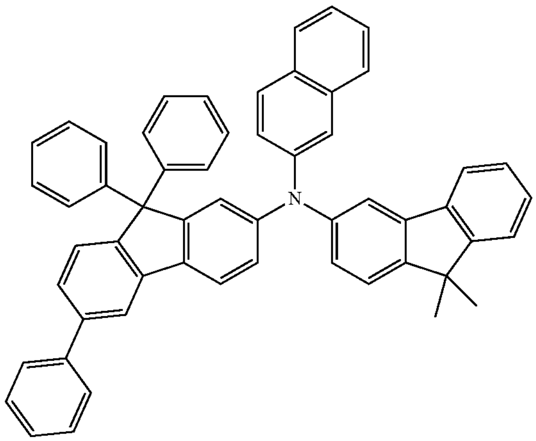
HT43
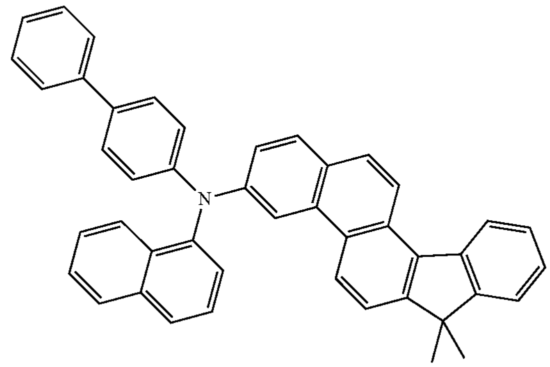
HT44
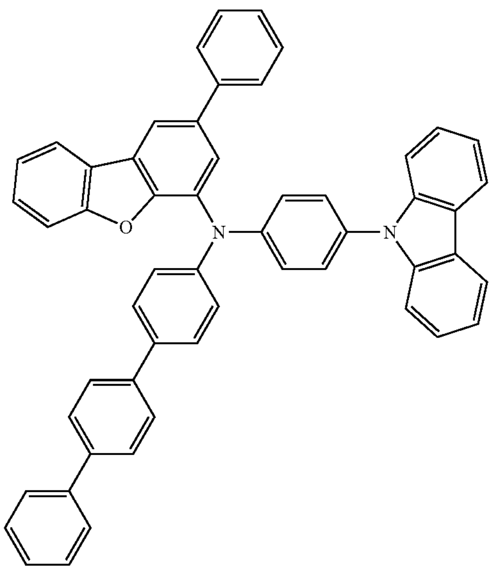
HT45
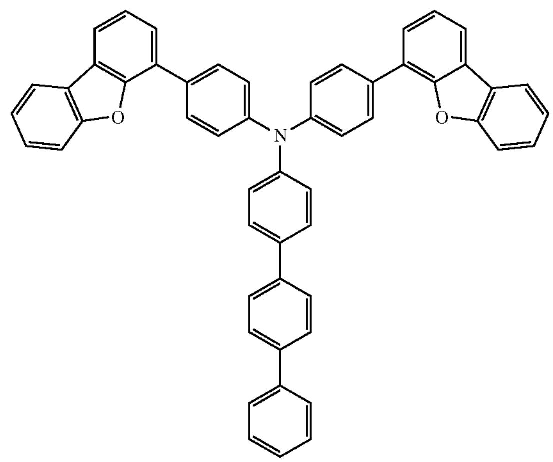
HT46
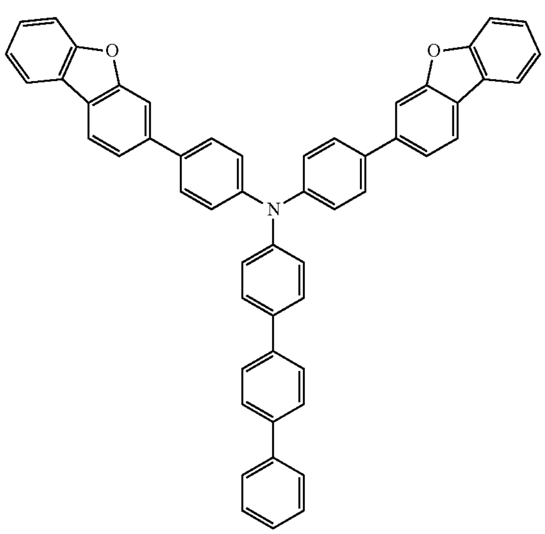
HT47
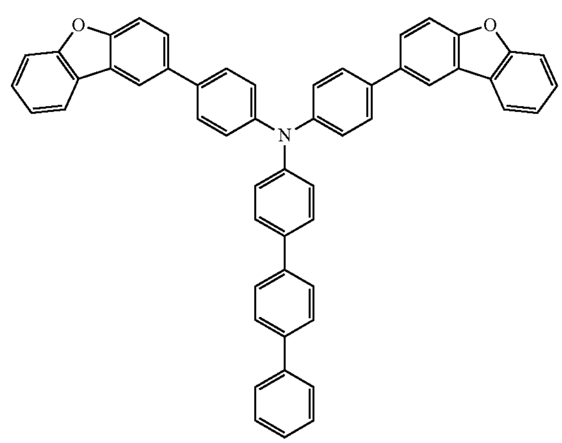

-continued
HT48
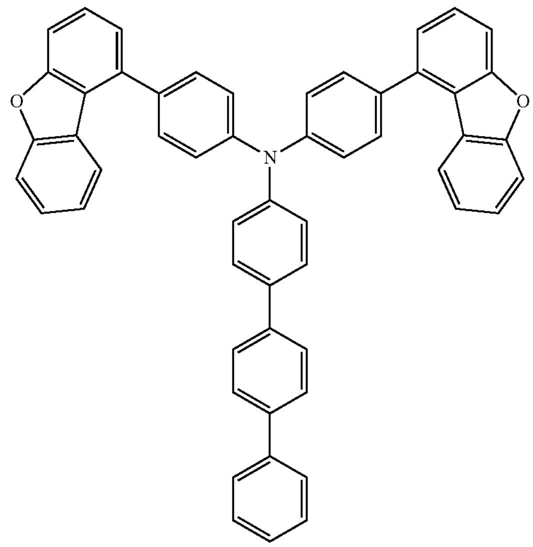
HT49
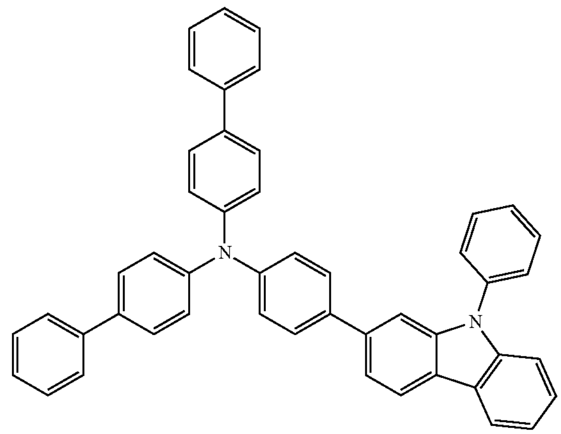
HT50
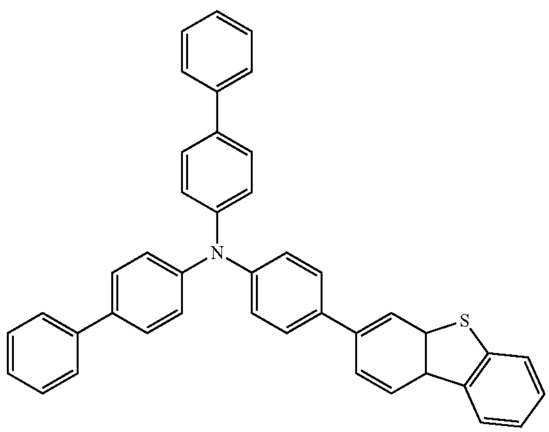
HT51
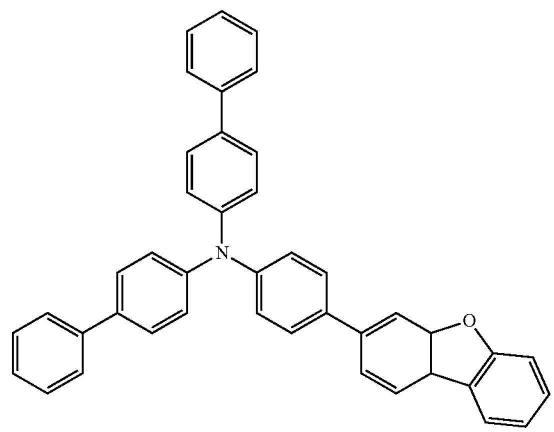
HT52
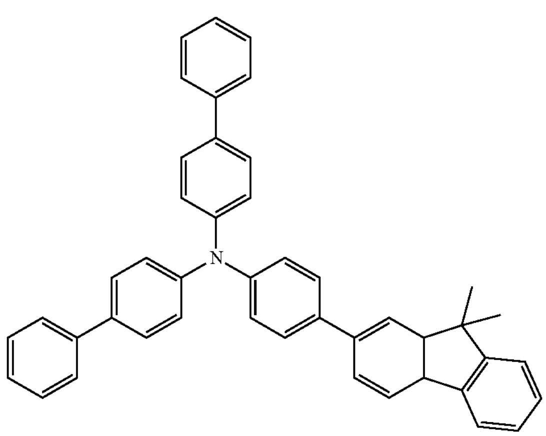
HT53
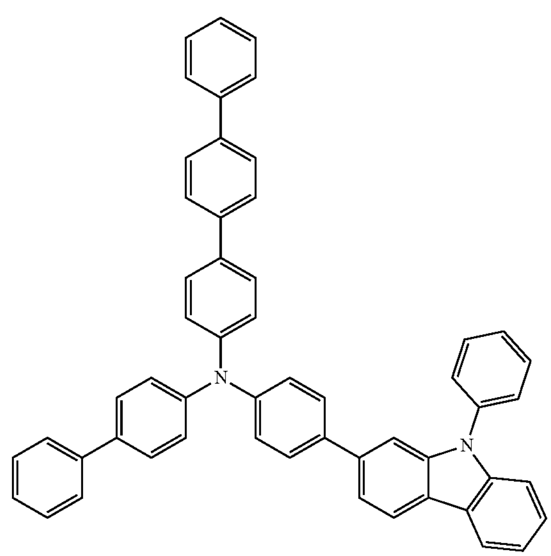

-continued
HT54
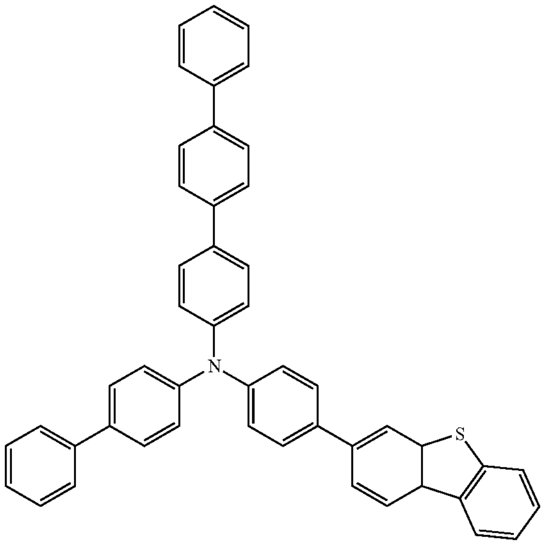
HT55
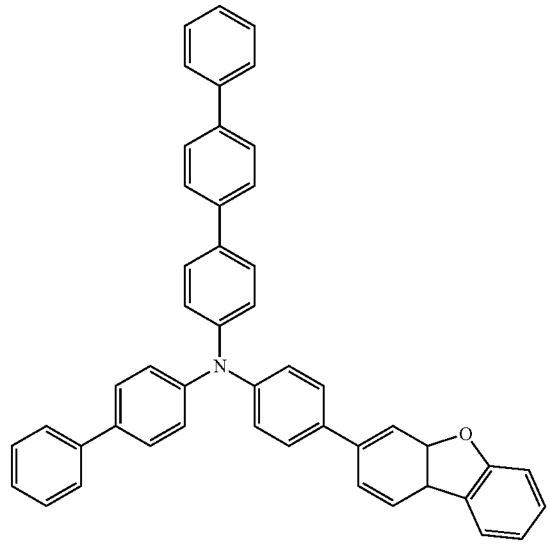
HT56
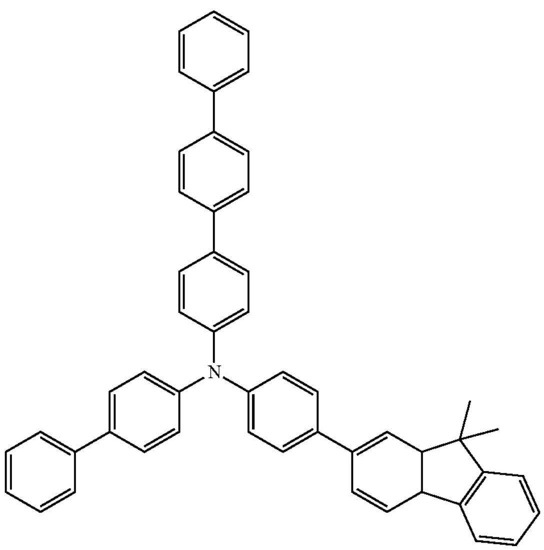
HT57
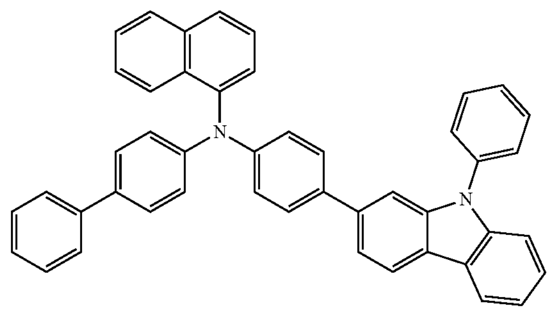
HT58
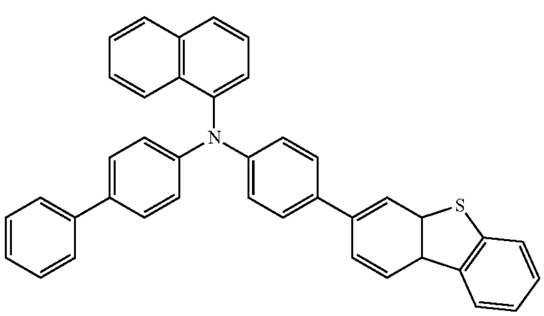
HT59
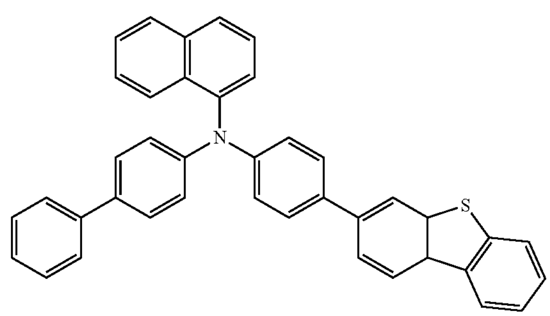

-continued
HT60
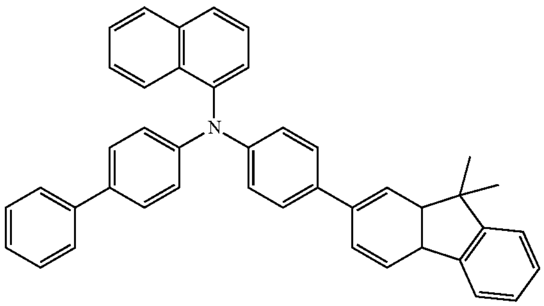
HT61
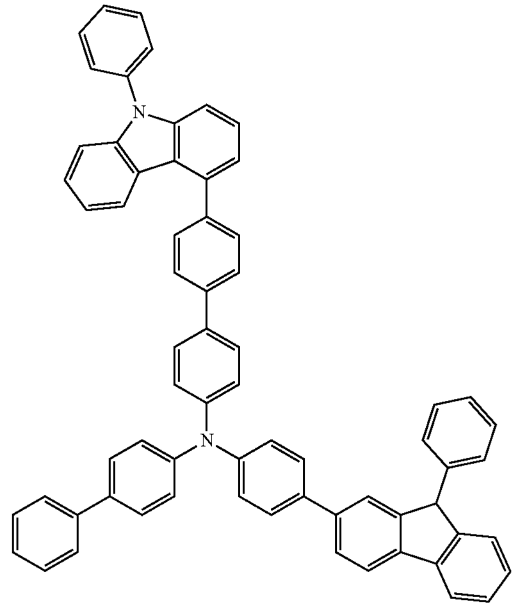
HT62
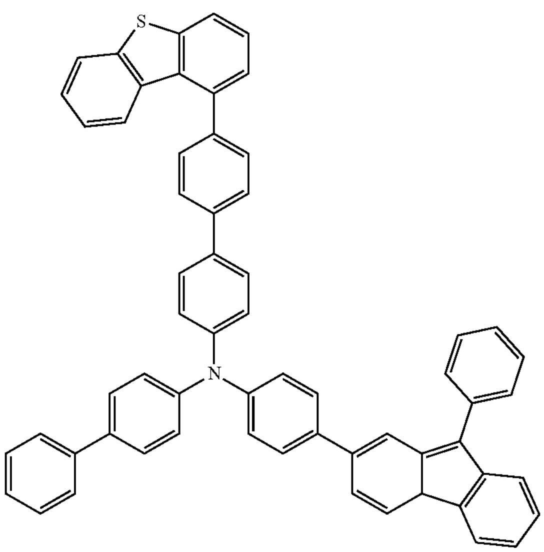
HT63
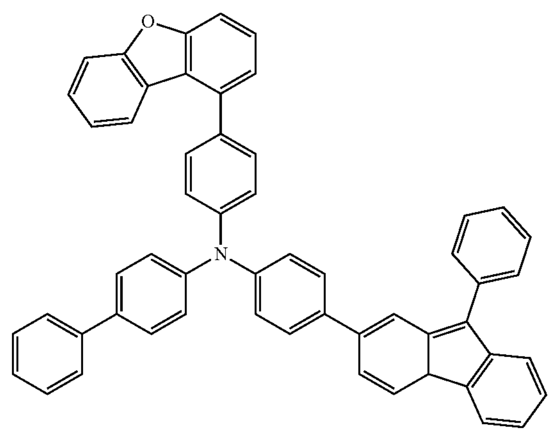
HT64
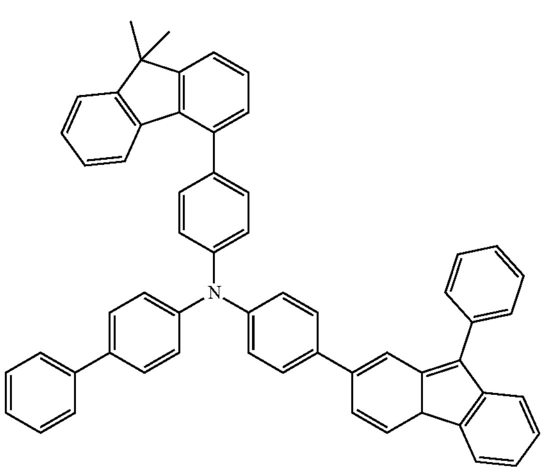
HT65
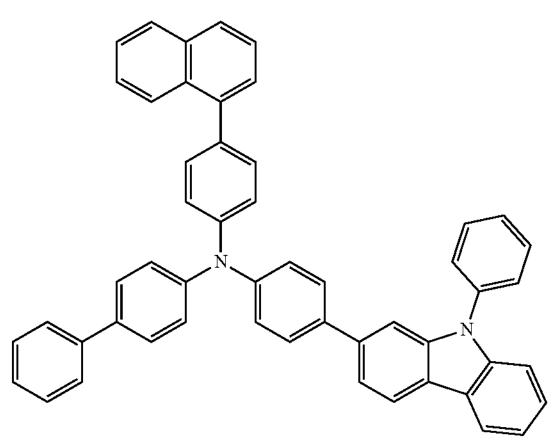

-continued
HT66
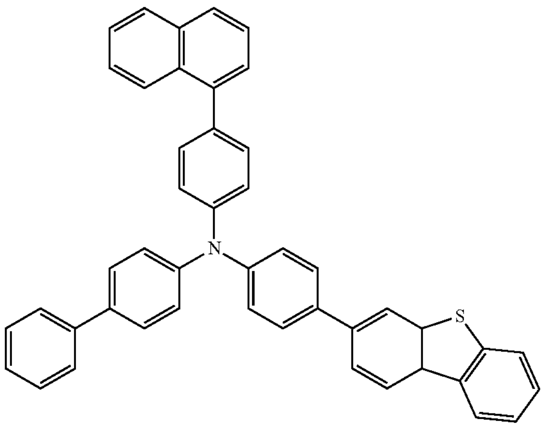
HT67
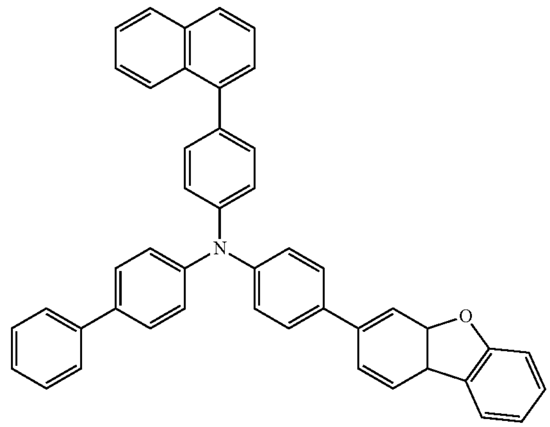
HT68
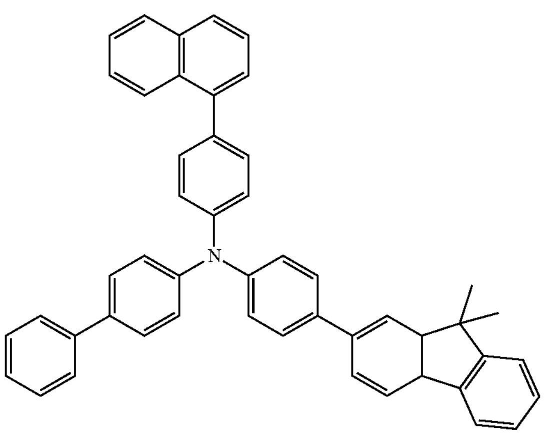
HT69
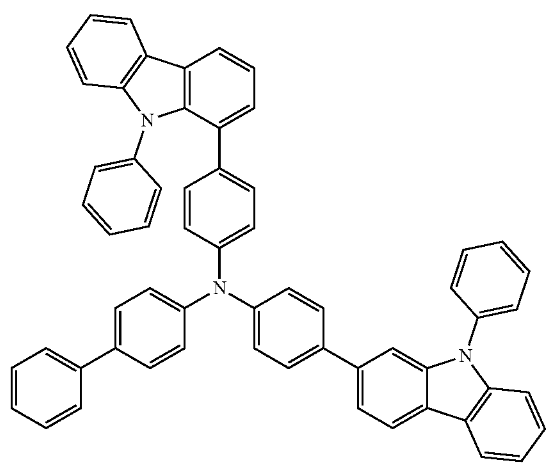
HT70
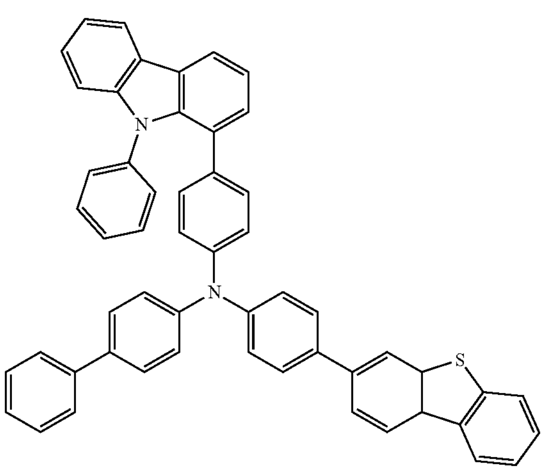
HT71
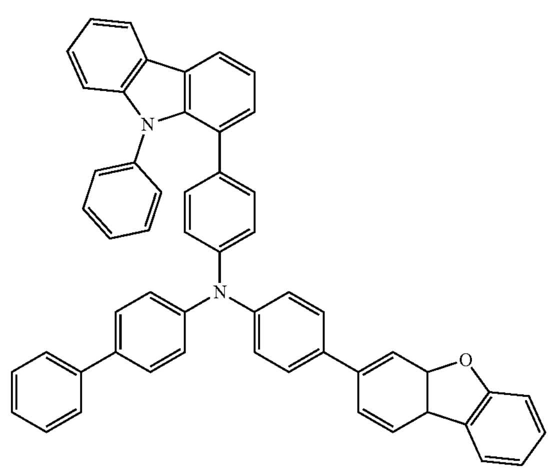

-continued

HT72

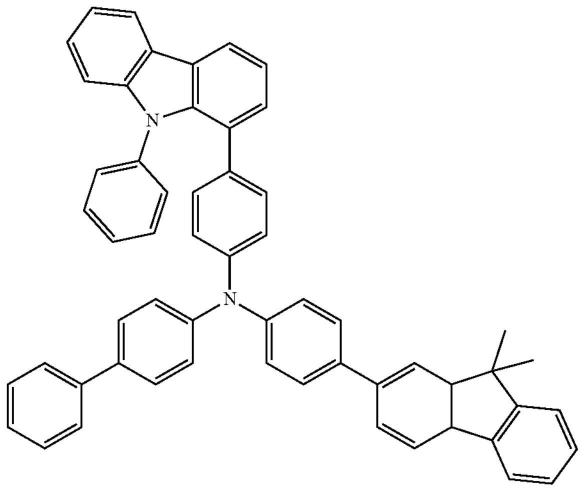

A thickness of the hole transport region may be about 100 Å to about 10,000 Å, for example, about 100 Å to about 1,000 Å. When the thickness of the hole transport region is within the range described above, satisfactory hole transportation characteristics may be obtained without a substantial increase in driving voltage.

The emission auxiliary layer may increase light-emission efficiency by compensating for an optical resonance distance of the wavelength of light emitted by an emission layer, and the electron blocking layer may block or reduce the flow of electrons from an electron transport region. The emission auxiliary layer and the electron blocking layer may each include the materials as described above.

p-Dopant

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, a LUMO energy level of the p-dopant may be −3.5 eV or less.

The p-dopant may include at least one selected from a quinone derivative, a metal oxide, and a cyano group-containing compound, but embodiments of the present disclosure are not limited thereto.

In one embodiment, the p-dopant may include at least one selected from:

a quinone derivative, such as tetracyanoquinodimethane (TCNQ) or 2,3,5,6-tetrafluoro-7,7,8,8-tetracyanoquinodimethane (F4-TCNQ);

a metal oxide, such as a tungsten oxide or a molybdenum oxide;

1,4,5,8,9,12-hexaazatriphenylene-hexacarbonitrile (HAT-CN); and a compound represented by Formula 221, but embodiments of the present disclosure are not limited thereto:

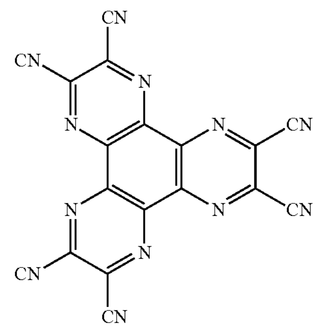

HAT-CN

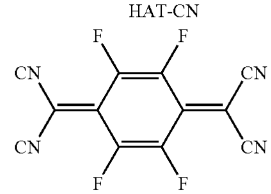

F4-TCNQ

Formula 221

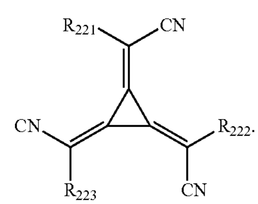

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one of $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Phosphorescent Dopant in Emission Layer

The phosphorescent dopant may include an organometallic complex represented by Formula 401:

Formula 401

$$M(L_{401})_{xc1}(L_{402})_{xc2}$$

Formula 402

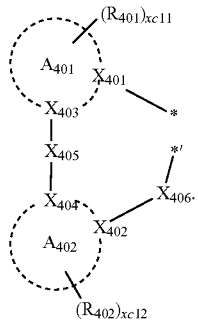

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein when xc1 is two or more, two or more of $L_{401}$(s) may be identical to or different from each other, $L_{402}$ may be an organic ligand, and xc2 may be an integer from 0 to 4, wherein when xc2 may be two or more, two or more of $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O-', *—S—*I, *—C(═O)—*', *—N($Q_{411}$)—*', *—C($Q_{411}$)($Q_{412}$)—*', *—C($Q_{411}$)═C($Q_{412}$)—', *—C($Q_{411}$)=*', or *═C($Q_{411}$)=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 each indicate a binding site to a M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen and $X_{402}$ may be carbon, or ii) both $X_{401}$ and $X_{402}$ may be nitrogen.

In one or more embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantly group, a norbornanyl group, and a norbornenyl group;

a cyclopentyl group, a cyclohexyl group, an adamantly group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantly group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantly group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, and —$P(=O)(Q_{401})(Q_{402})$, wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is two or more, two $A_{401}$(s) in two or more $L_{401}$(s) may optionally be linked to each other via $X_{407}$ (which is a linking group, and two $A_{402}$(s) may optionally be linked to each other via $X_{408}$ (which is a linking group) (see Compounds PD1 to PD4 and PD7). $X_{407}$ and $X_{408}$ may each independently be a single bond, *—C(=O)—*', *—N($Q_{413}$)—*', *—C($Q_{413}$)($Q_{414}$)—*' or *—C($Q_{413}$)=C($Q_{414}$)—*' (where $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from a halogen, a diketone (for example, acetylacetonate), a carboxylic acid (for example, picolinate), —C(=O), an isonitrile, —CN, and a phosphorus-based ligand (for example, phosphine or phosphite), but embodiments of the present disclosure are not limited thereto.

In one or more embodiments, the phosphorescent dopant may be selected from, for example, Compounds PD1 to PD25, but embodiments of the present disclosure are not limited thereto:

PD1

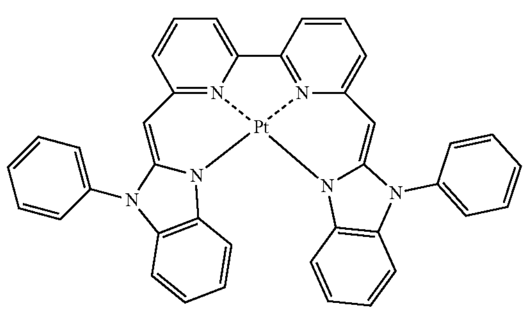

-continued

PD2

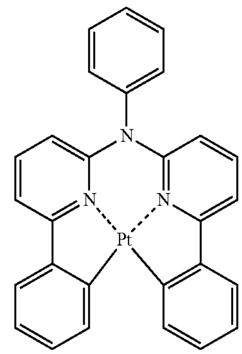

PD3

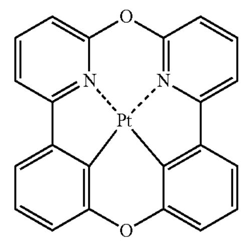

PD4

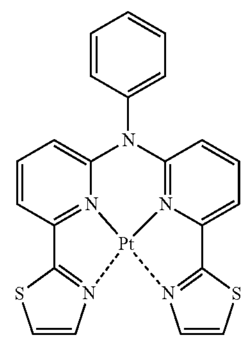

PD5

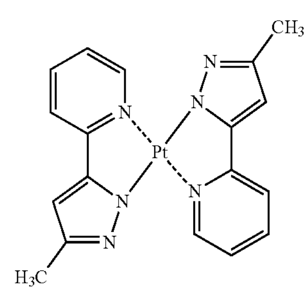

PD6

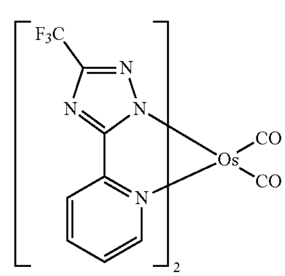

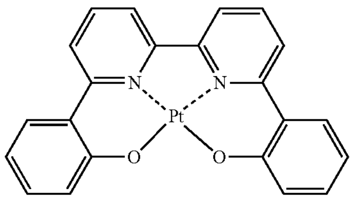
PD7
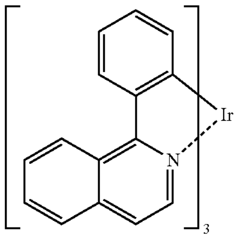
PD8
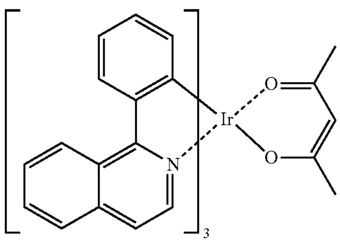
PD9
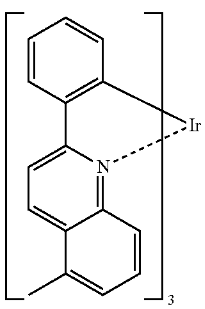
PD10
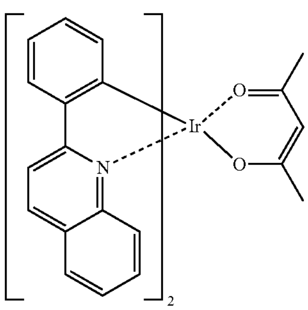
PD11
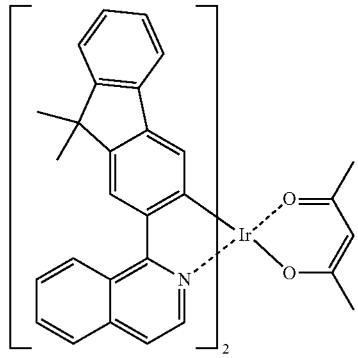
PD12
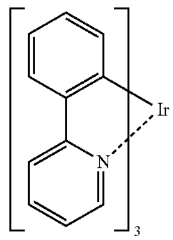
PD13
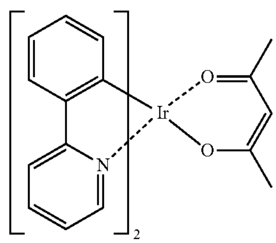
PD14
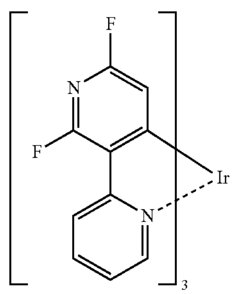
PD15
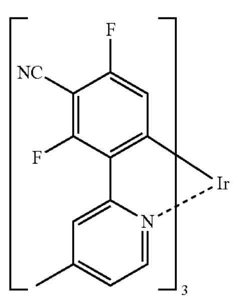
PD16

PD17
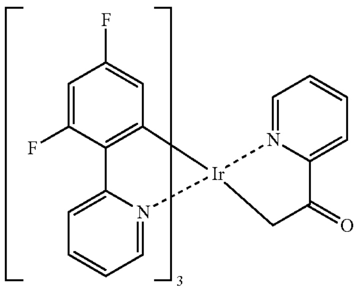
PD18
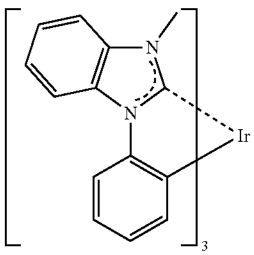
PD19
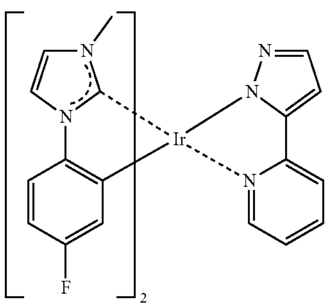
PD20
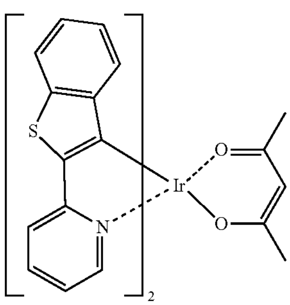
PD21
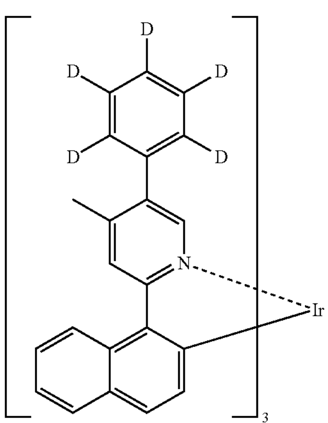
PD22
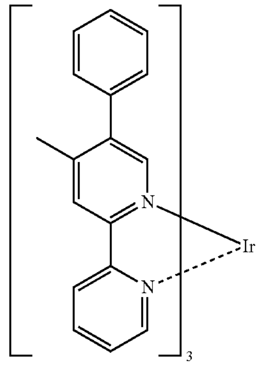
PD23
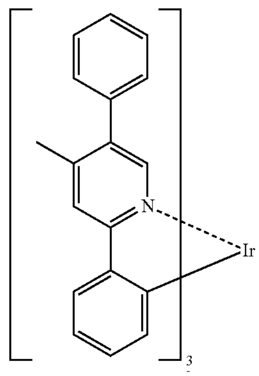
PD24
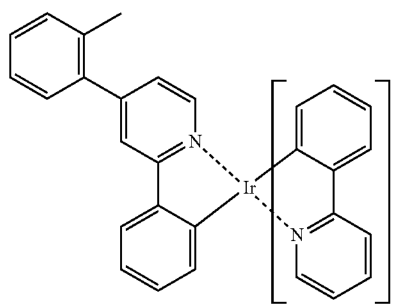
PD25
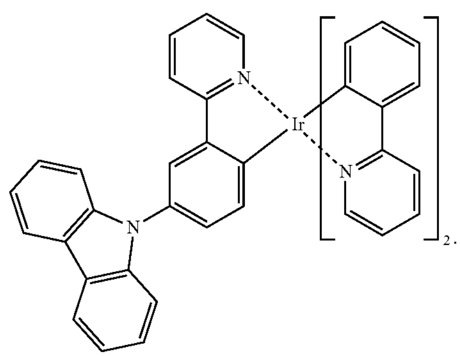
Fluorescent Dopant in Emission Layer
The fluorescent dopant may include an arylamine compound or a styrylamine compound.
The fluorescent dopant may include a compound represented by Formula 501:

Formula 501

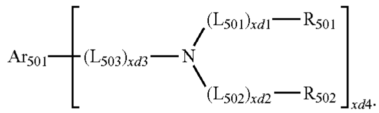

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD22:

FD1

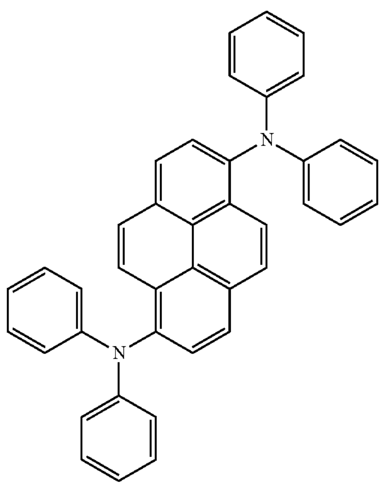

FD2

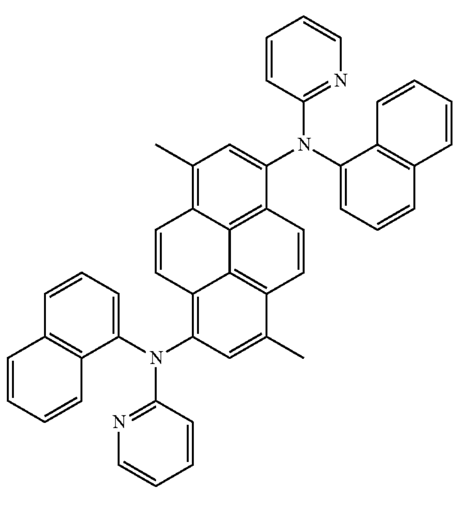

-continued

FD3

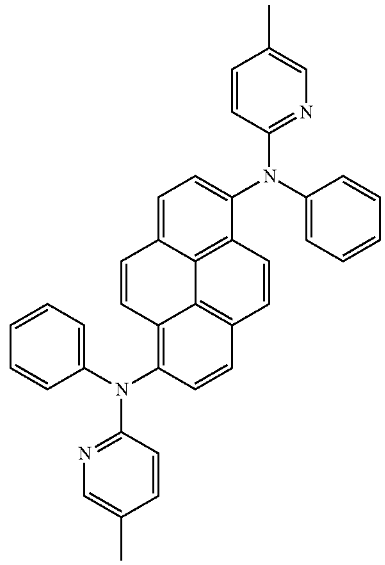

FD4

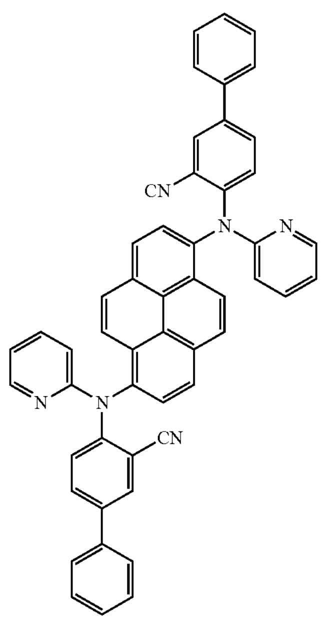

-continued
FD5
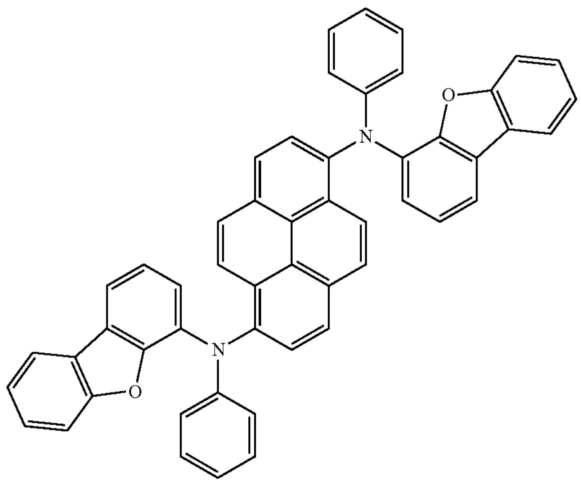
FD6
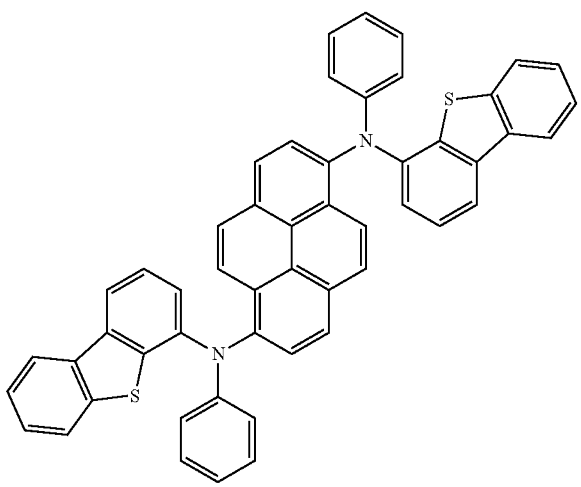
FD7
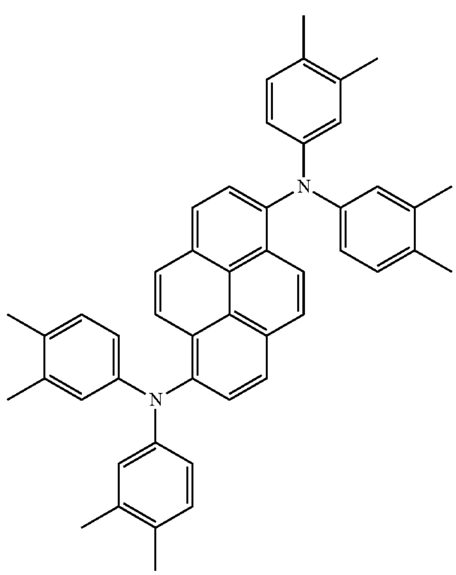
-continued
FD8
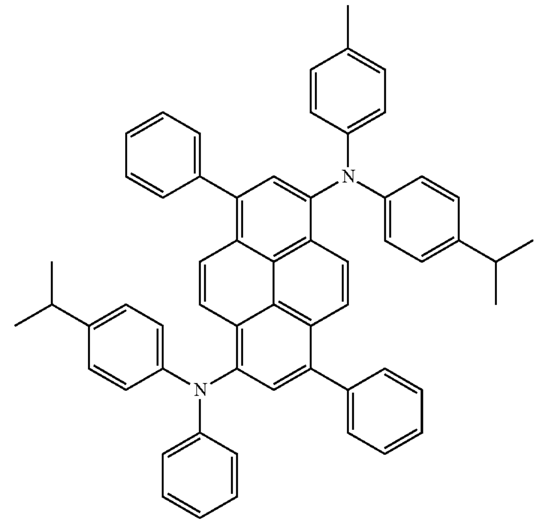
FD9
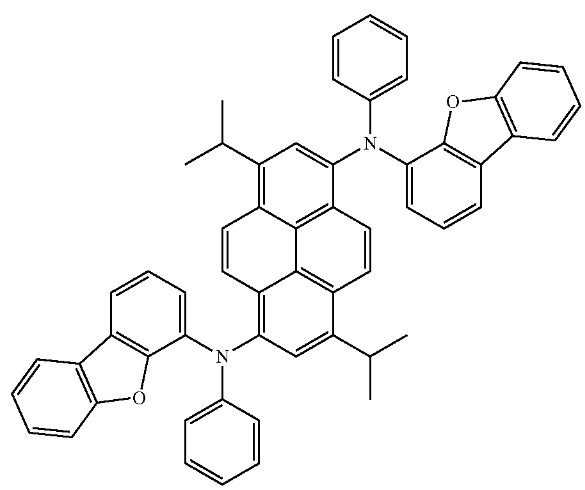
FD10
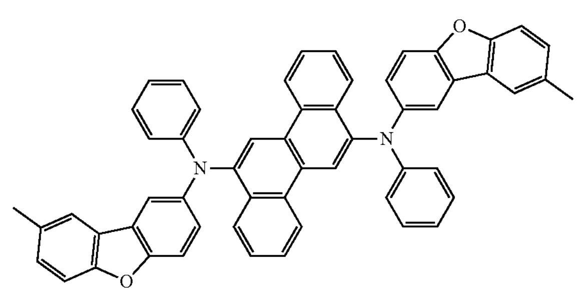

FD11
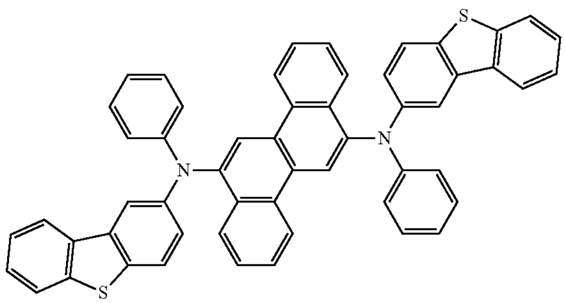
FD12
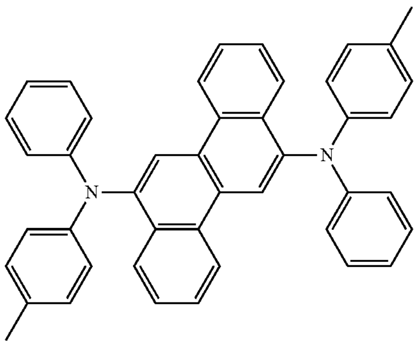
FD13
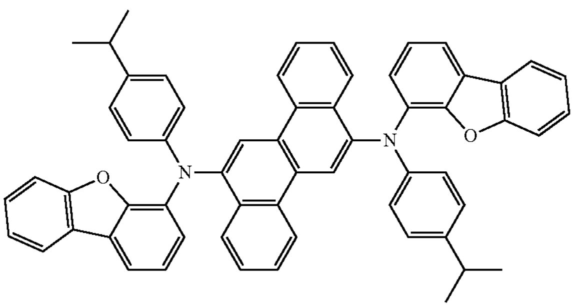
FD14
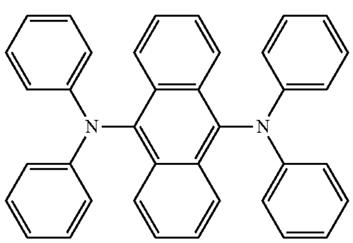
FD15
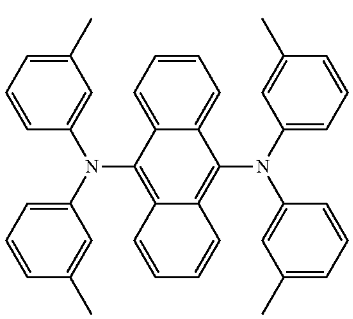
FD16
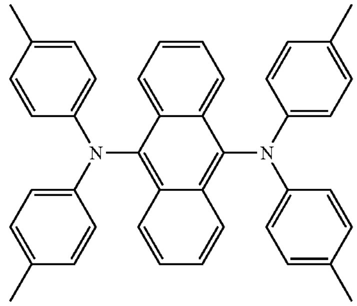
FD17
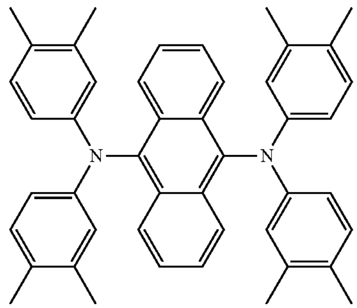
FD18
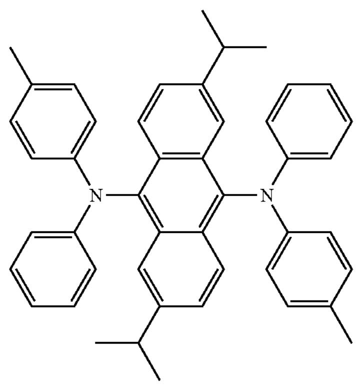
FD19
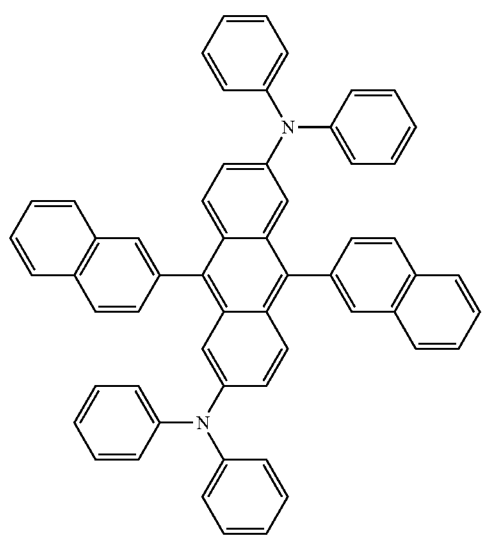

FD20
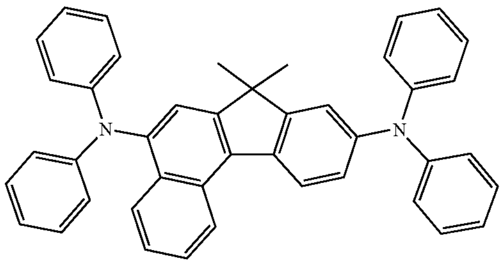
FD21
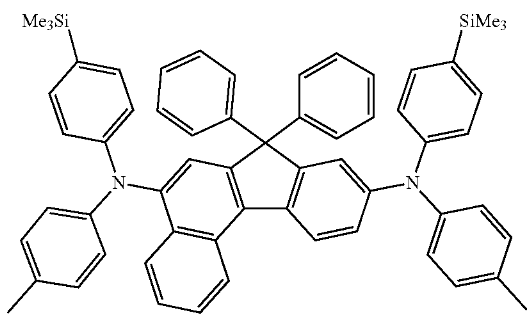
FD22
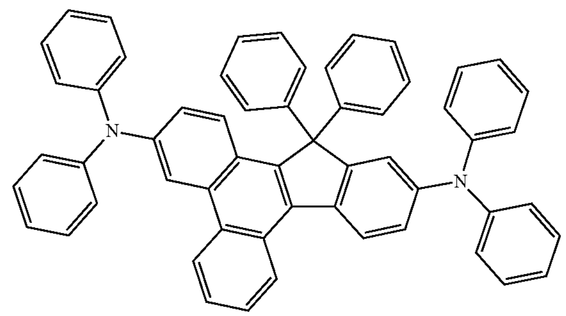
In one or more embodiments, the fluorescent dopant may be selected from the following compounds, but embodiments of the present disclosure are not limited thereto:
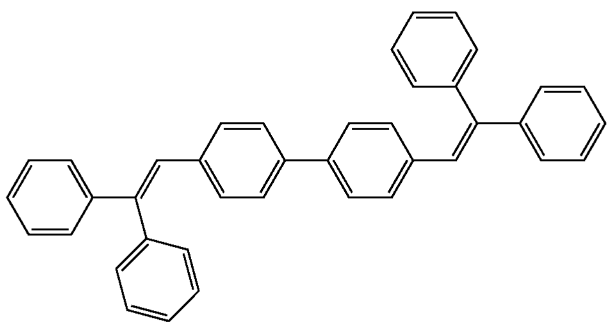
DPVBi
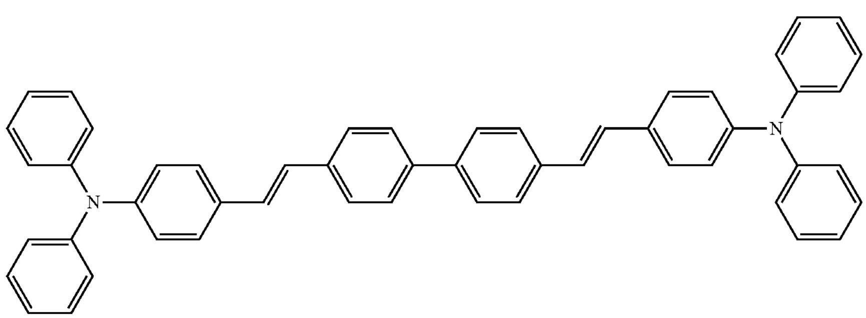
DPAVBi -continued

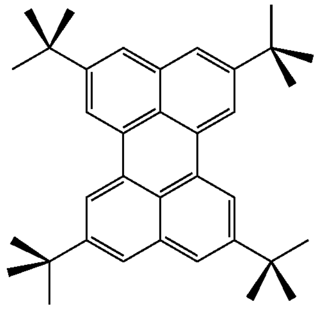

TBPe

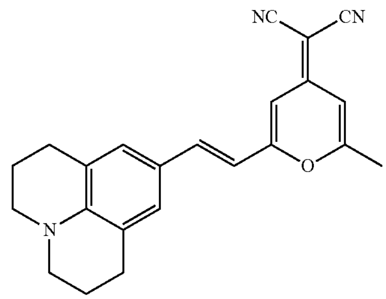

DCM

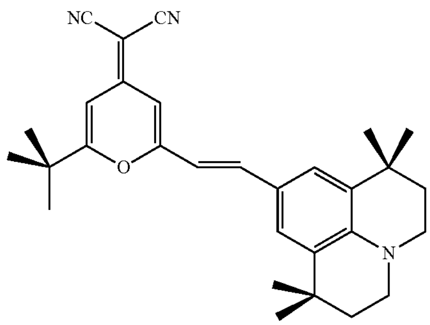

DCJTB

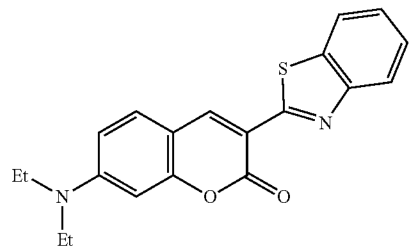

Coumarin 6

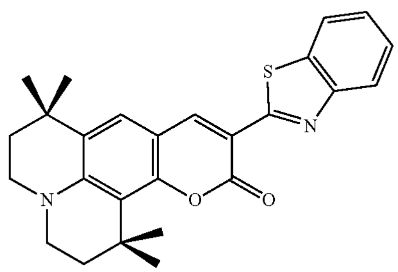

C545T

Electron Transport Region in Organic Layer 150

The electron transport region may have i) a single-layered structure including (e.g., consisting of) a single material, ii) a single-layered structure including (e.g., consisting of) a plurality of different materials, or iii) a multi-layered structure having a plurality of layers including (e.g., consisting of) a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituting layers of each structure are sequentially stacked from an emission layer. However, embodiments of the structure of the electron transport region are not limited thereto.

The electron transport region (for example, a buffer layer, a hole blocking layer, an electron control layer, and/or an electron transport layer in the electron transport region) may include a metal-free compound containing at least one π-electron-deficient nitrogen-containing ring.

The "π-electron-deficient nitrogen-containing ring" indicates a $C_1$-$C_{60}$ heterocyclic group having at least one *—N=*' moiety as a ring-forming moiety.

For example, the "7-electron-deficient nitrogen-containing ring" may be: i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Non-limiting examples of the π-electron-deficient nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring.

For example, the electron transport region may include a compound represented by Formula 601:

$$[Ar_{601}]_{xe11}\text{-}[(L_{601})_{xe1}\text{-}R_{601}]_{xe21}. \quad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, and —$P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of the xe11 $Ar_{601}$(s) and the xe21 $R_{601}$ (s) may include the π-electron-deficient nitrogen-containing ring.

In one embodiment, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, and —$P(=O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In one embodiment, $Ar_{601}$ in Formula 601 may be an anthracene group.

In one or more embodiments, the compound represented by Formula 601 may be represented by Formula 601-1:

Formula 601-1

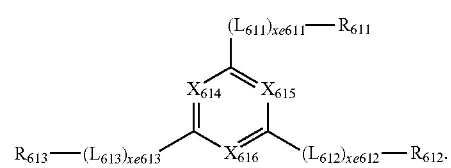

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one embodiment, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and $—S(=O)_2(Q_{601})$ and $—P(=O)(Q_{601})(Q_{602})$, wherein $Q_{601}$ and $Q_{602}$ may each independently be the same as described above.

The electron transport region may include at least one compound selected from Compounds ET1 to ET96, but compounds to be included in the electron transport region are not limited thereto:

ET1

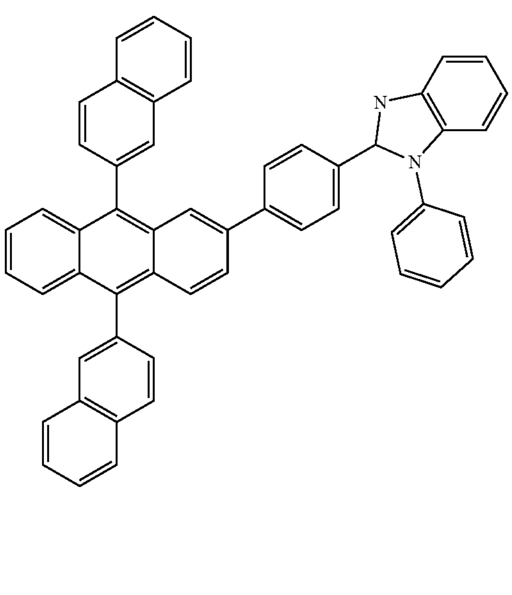

-continued

ET2

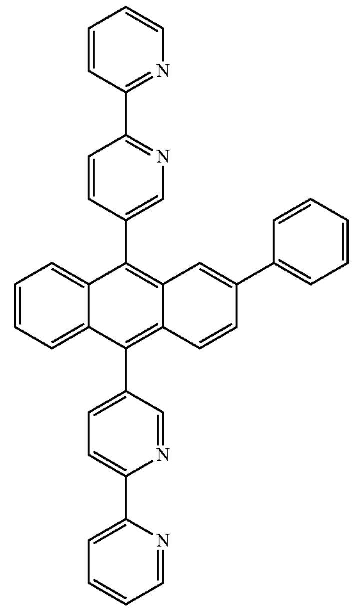

ET3

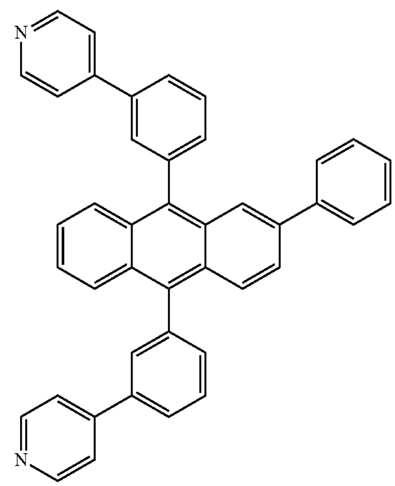

ET4

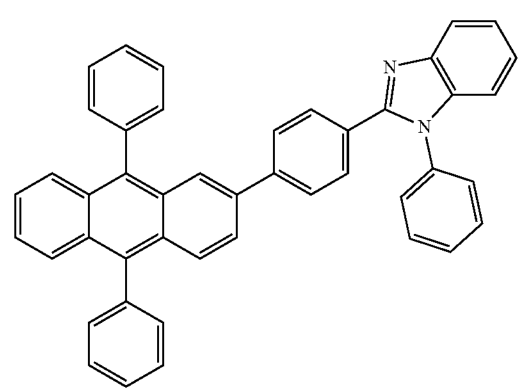

-continued
ET5
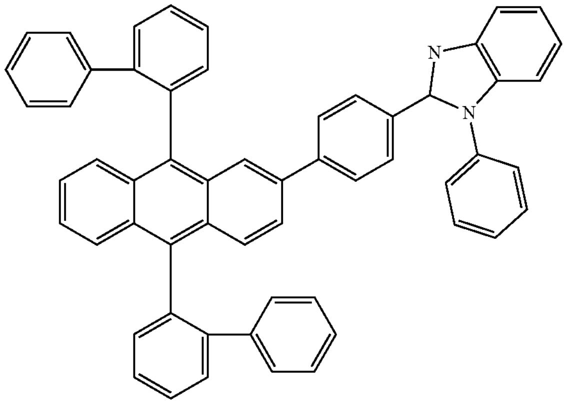
ET6
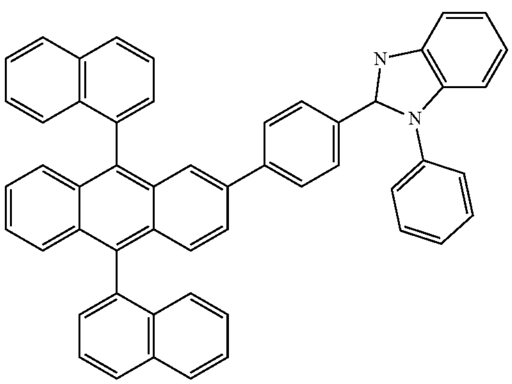
ET7
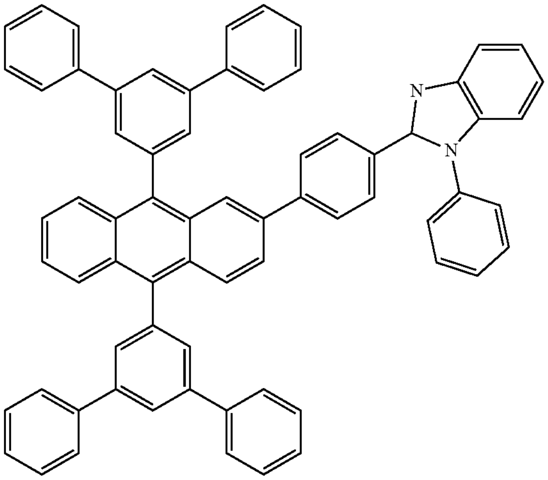
-continued
ET8
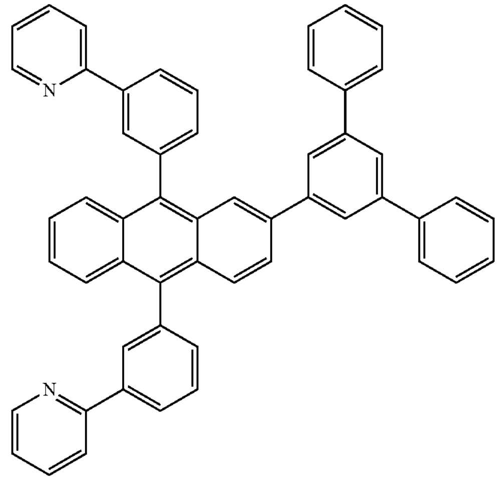
ET9
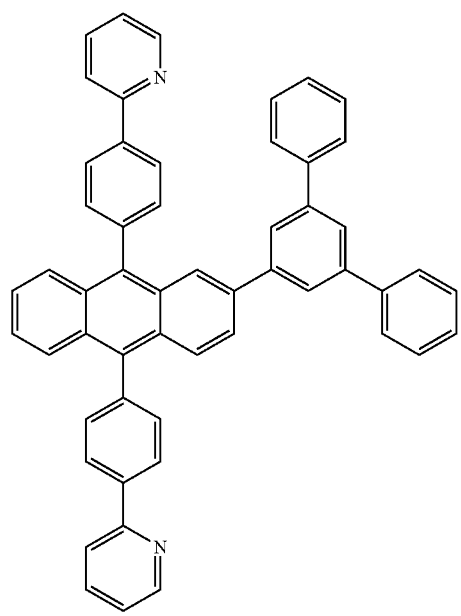

-continued
ET10
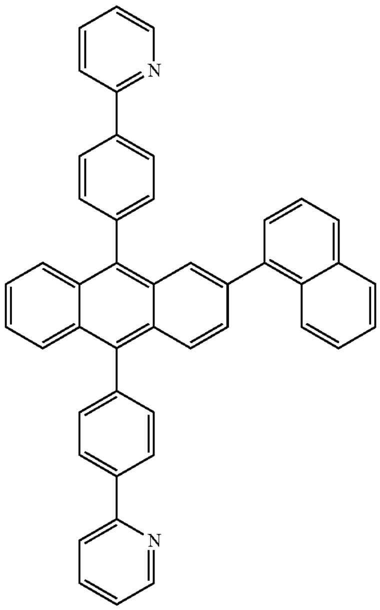
ET11
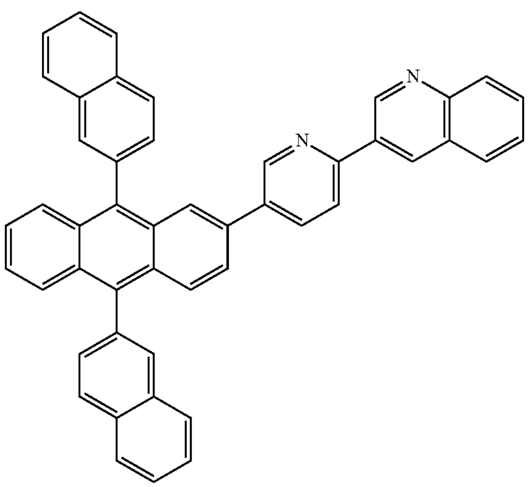
ET12
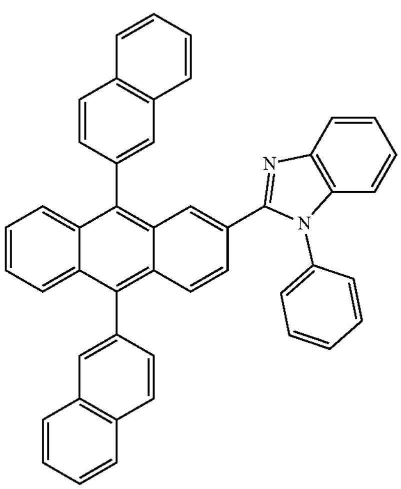
-continued
ET13
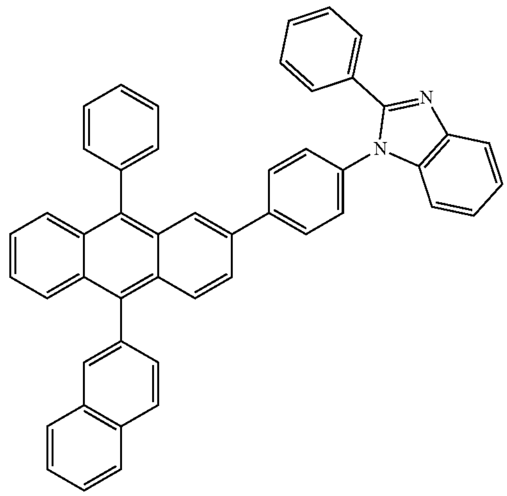
ET14
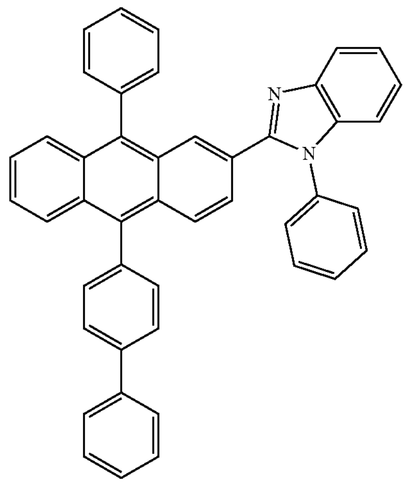
ET15
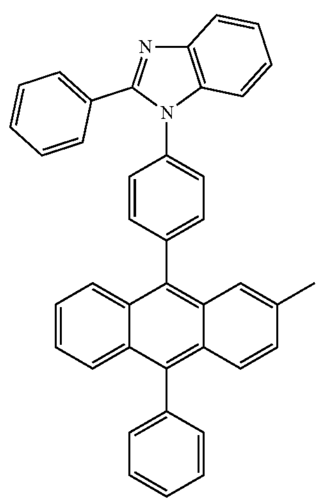

-continued
ET16
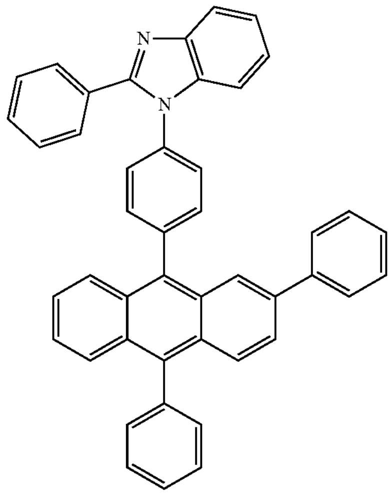
ET17
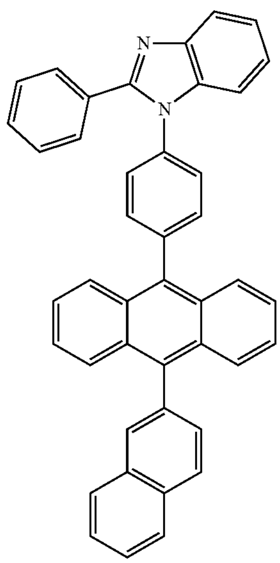
ET18
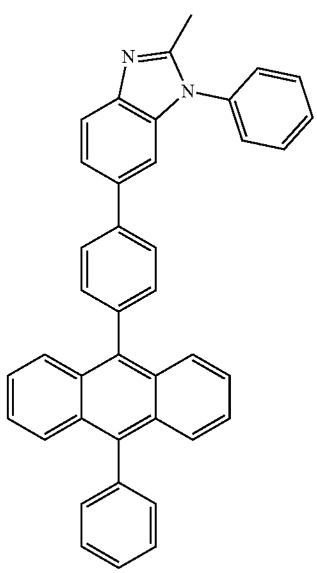
-continued
ET19
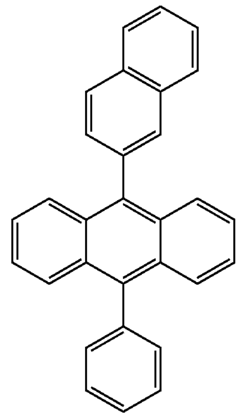
ET20
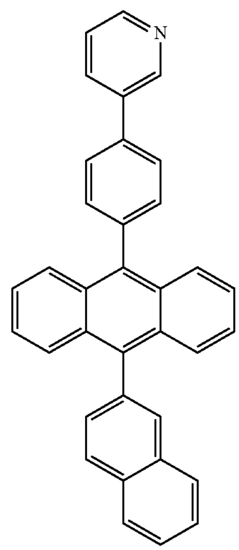
ET21
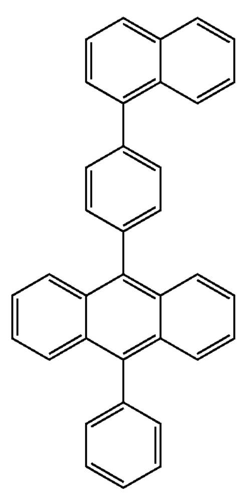

-continued
ET22
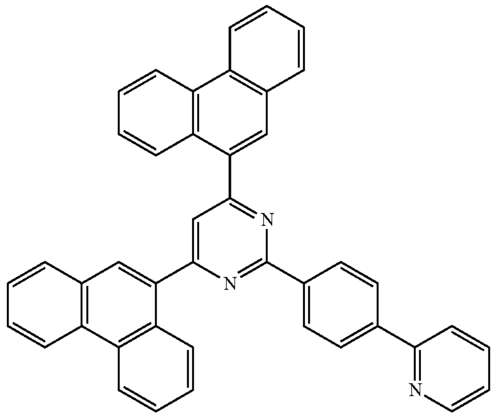
ET23
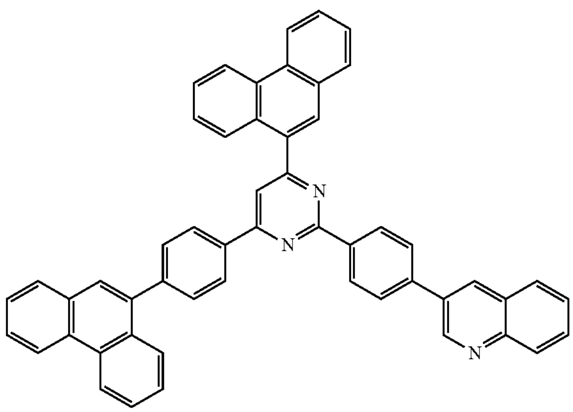
ET24
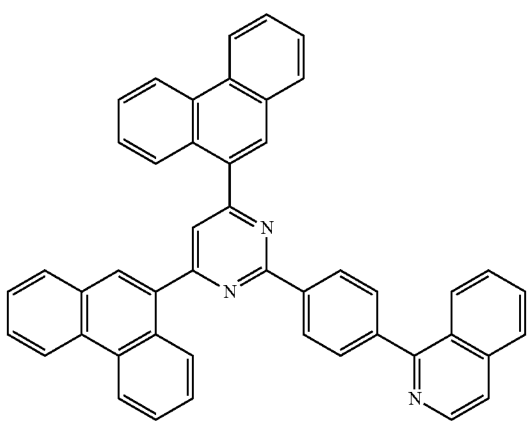
ET25
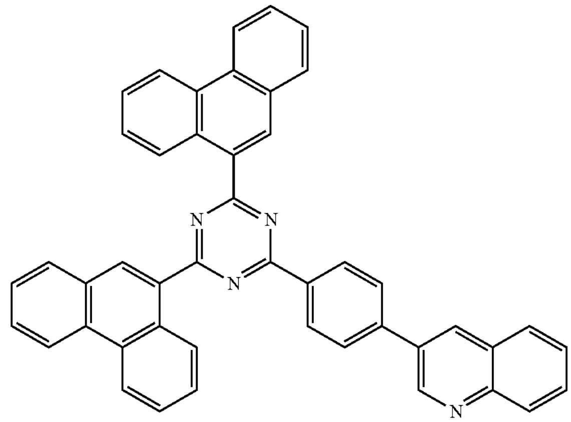
ET26
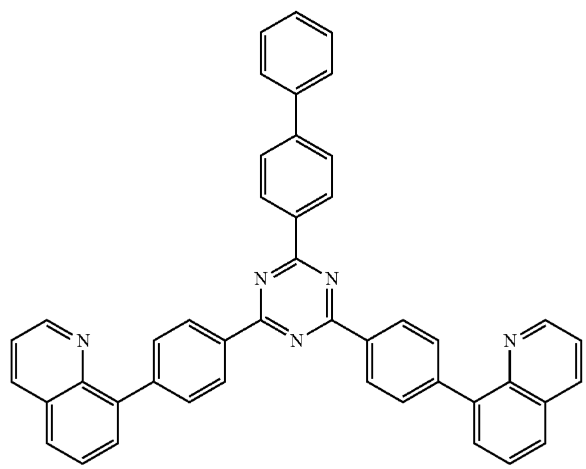
ET27
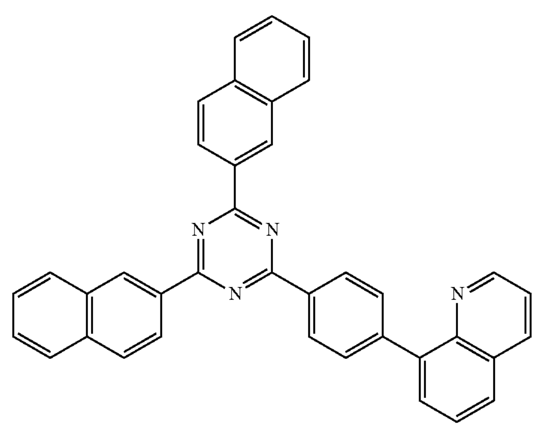

-continued
ET28
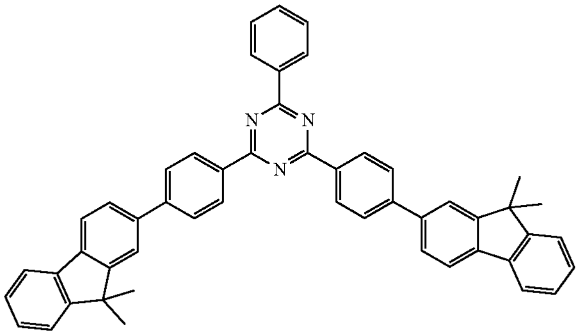
ET29
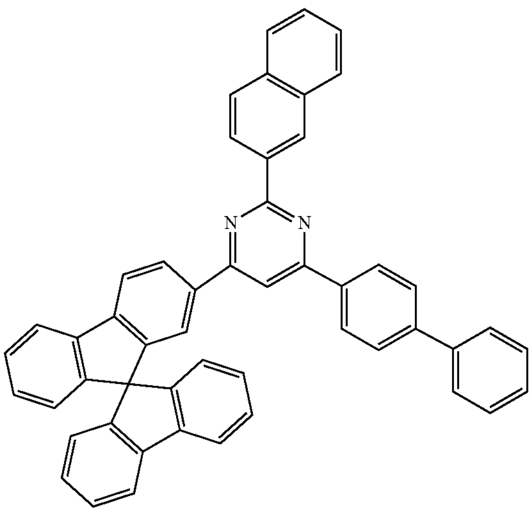
ET30
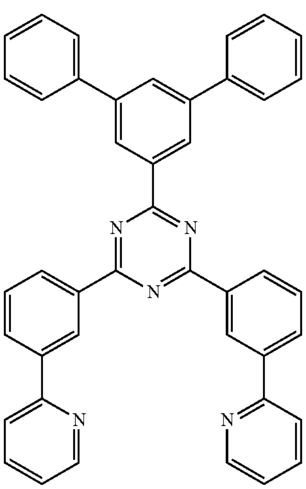
-continued
ET31
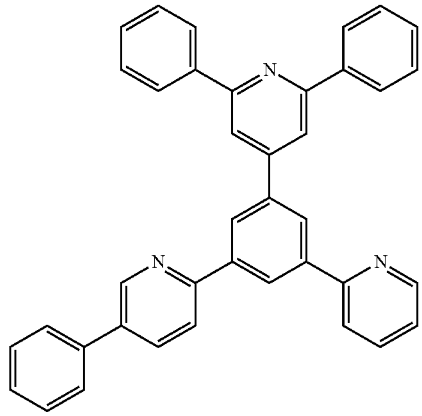
ET32
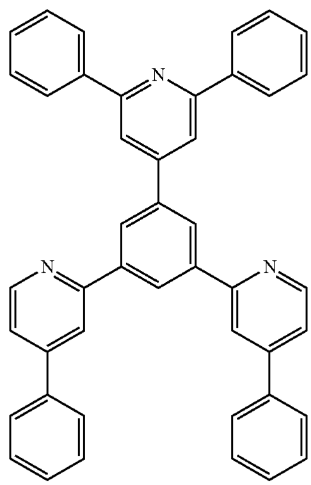
ET33
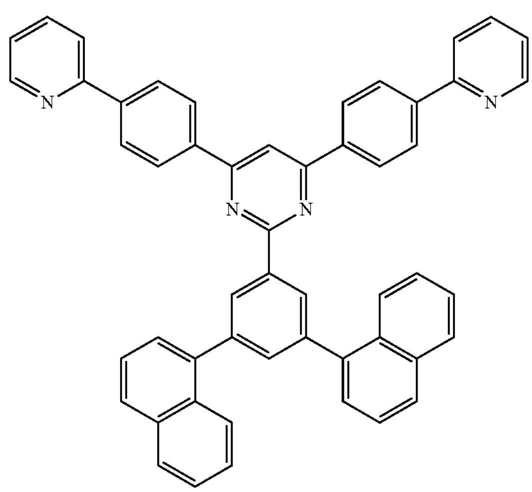

-continued
ET34
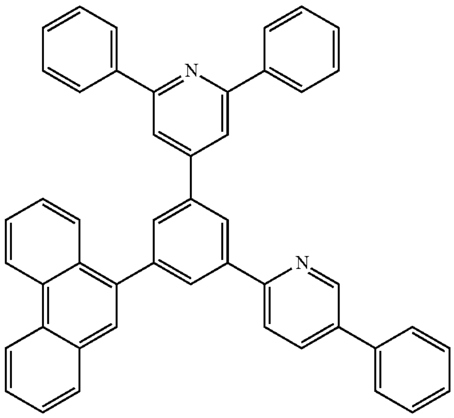
ET35
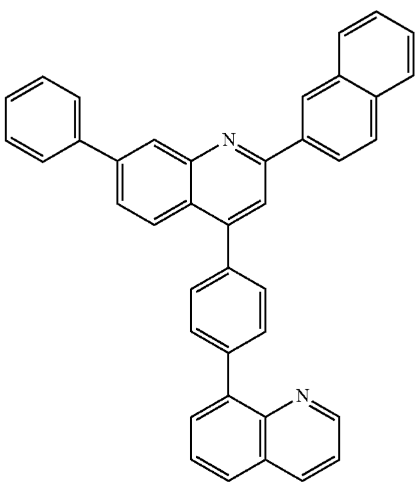
ET36
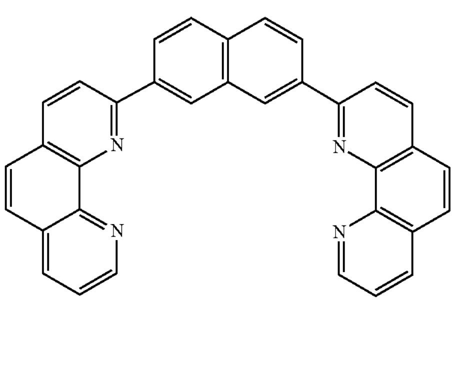
-continued
ET37
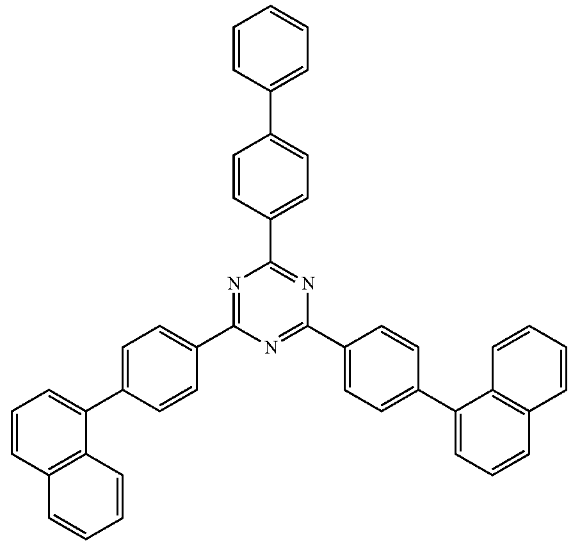
ET38
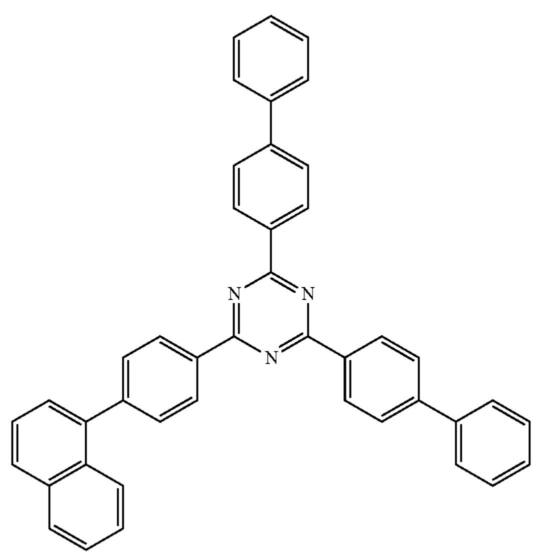

-continued
ET39
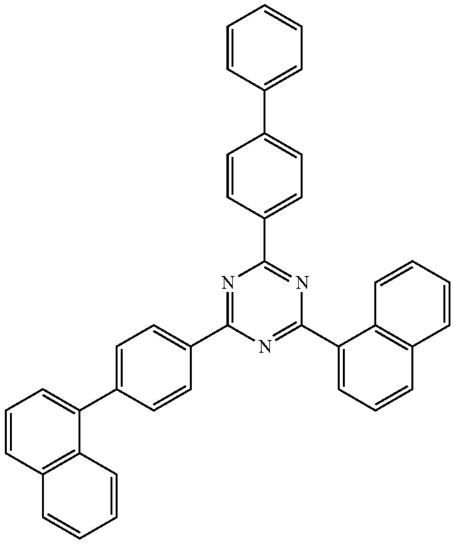
ET40
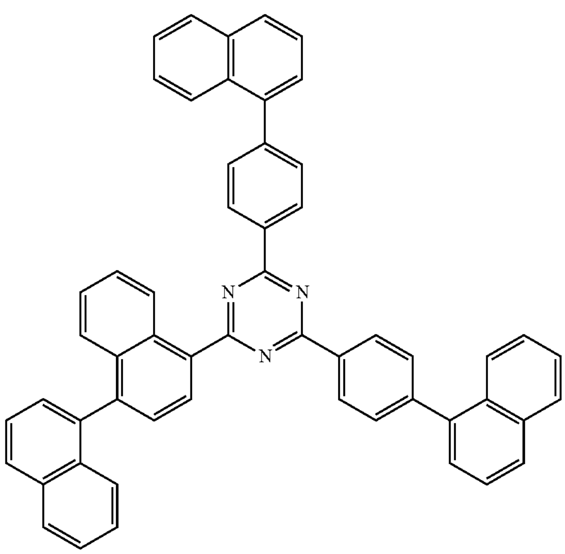
-continued
ET41
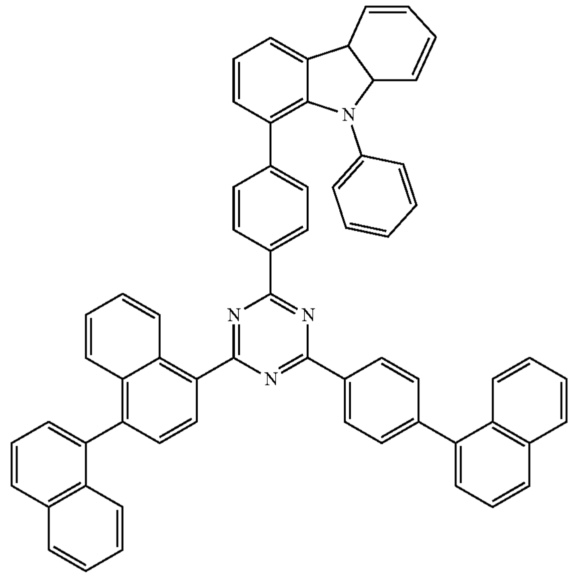
ET42
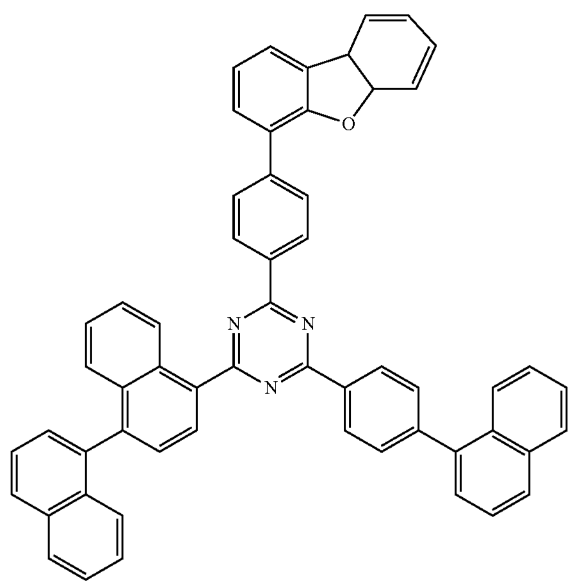

-continued
ET43
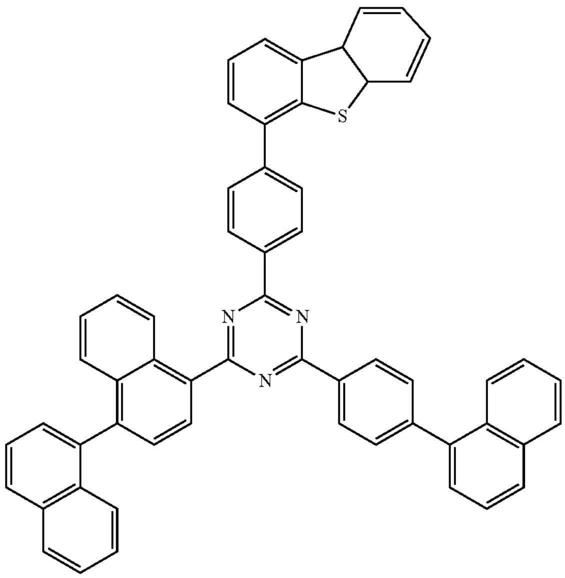
ET44
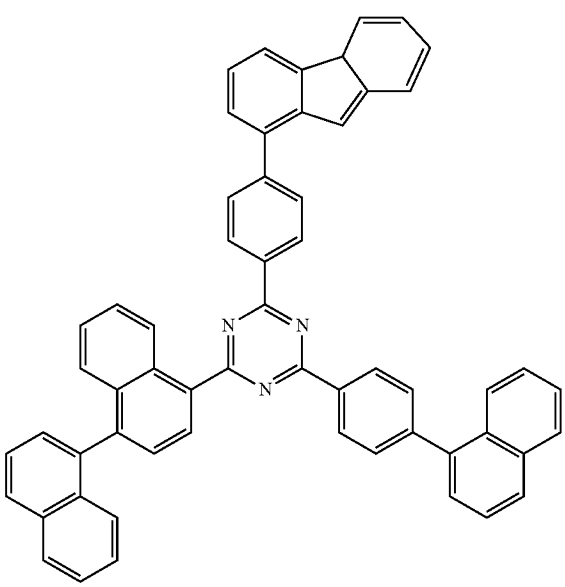
-continued
ET45
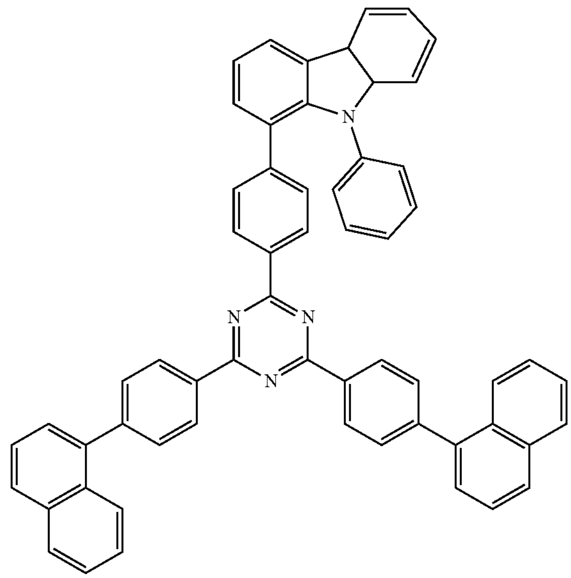
ET46
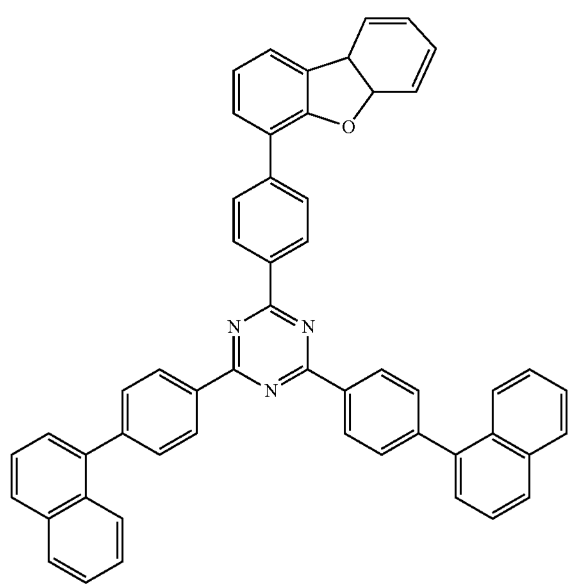

-continued
ET47
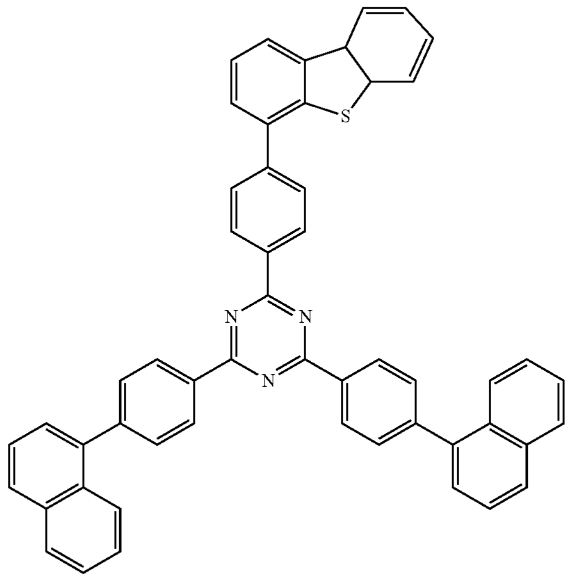
ET48
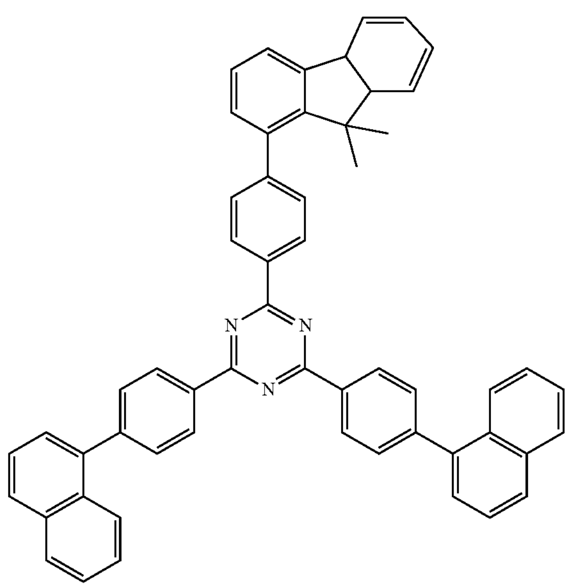
-continued
ET49
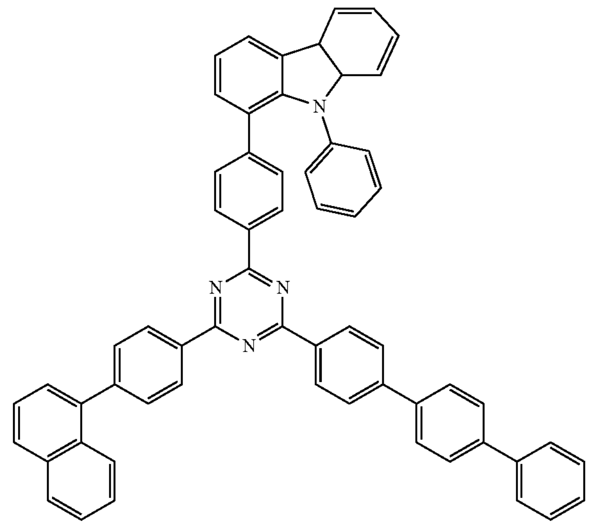
ET50
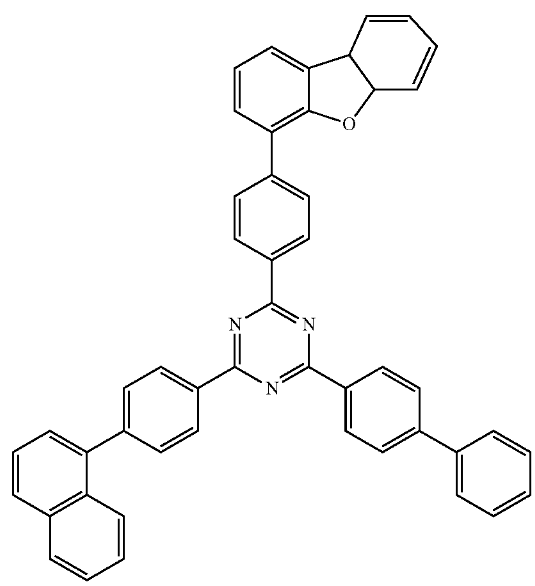

-continued
ET51
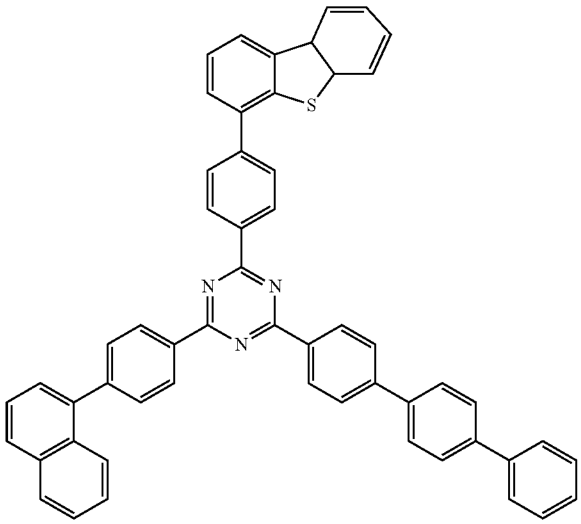
ET53
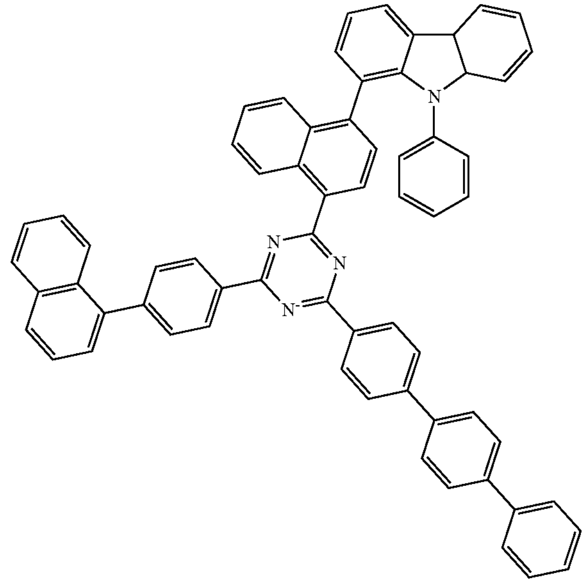
ET52
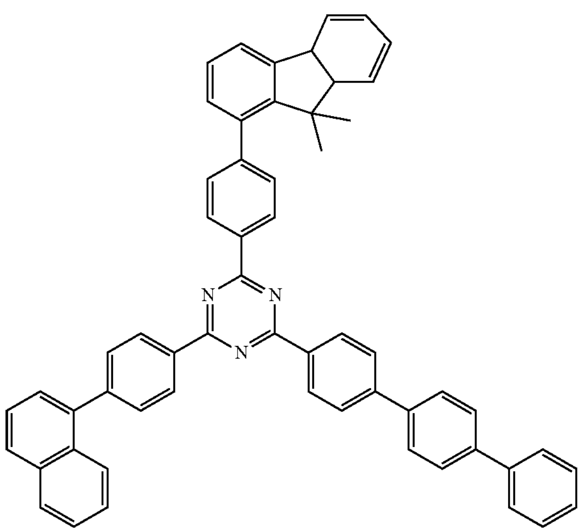
ET54
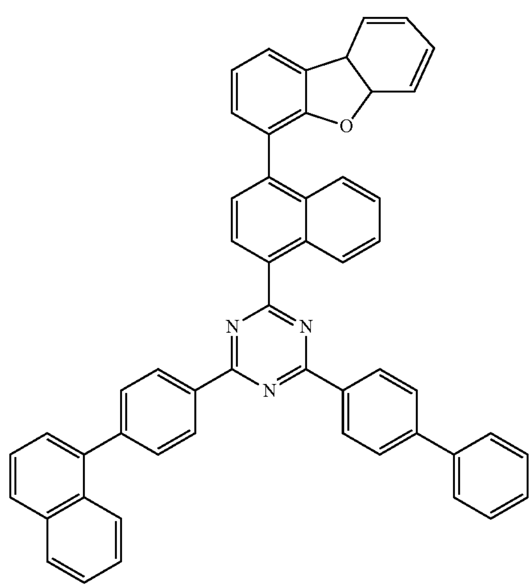

-continued
ET55
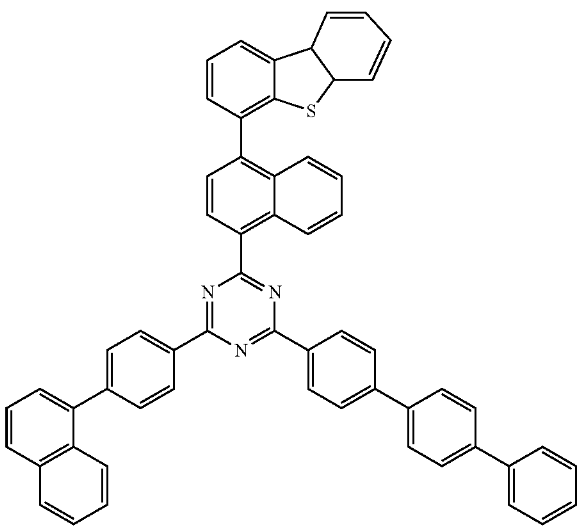
ET56
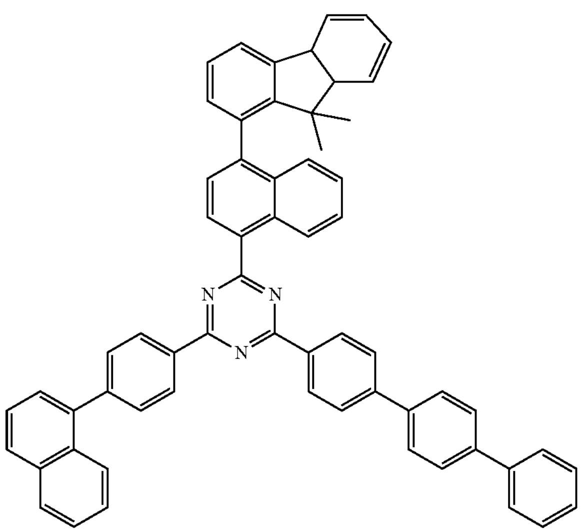
ET57
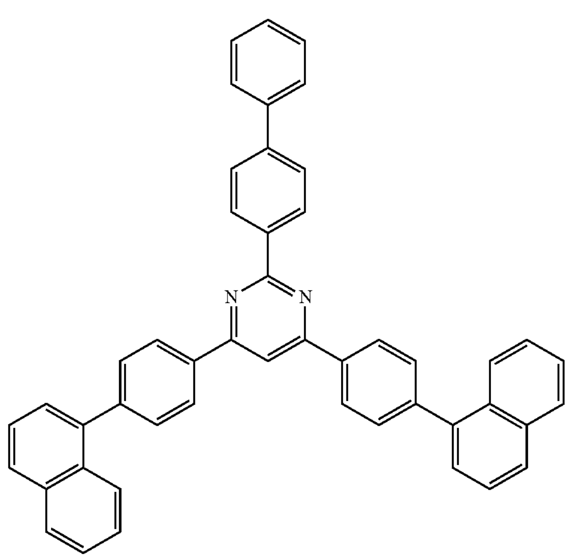
-continued
ET58
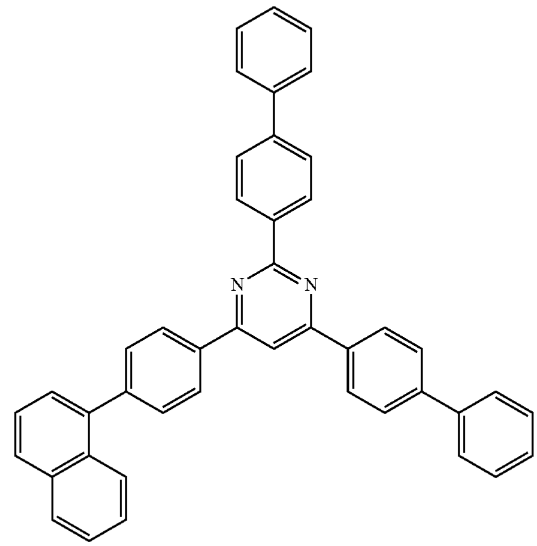
ET59
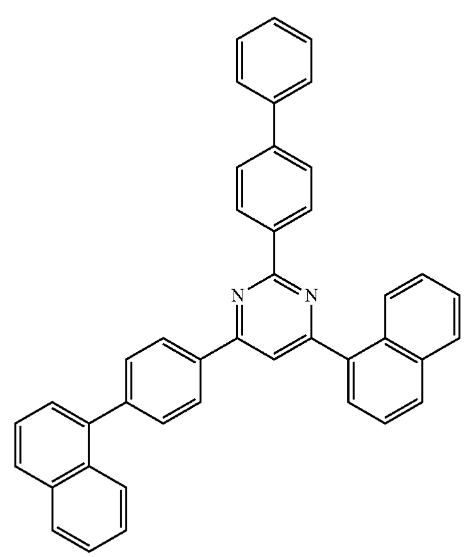

-continued
ET60
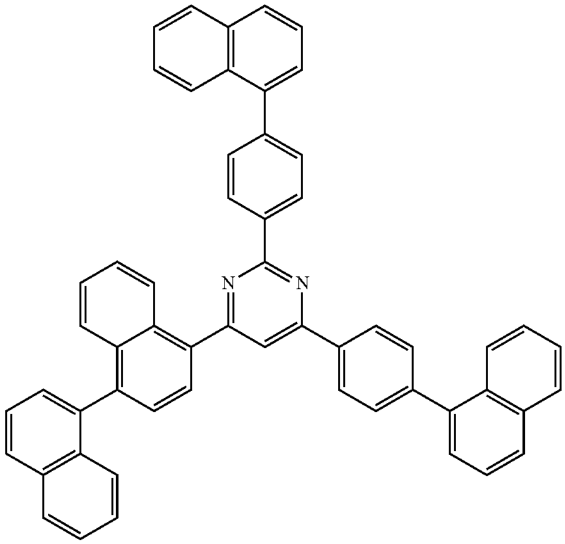
ET61
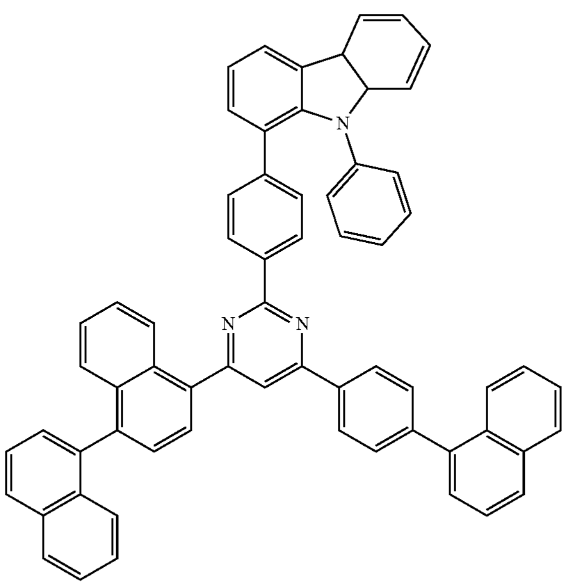
-continued
ET62
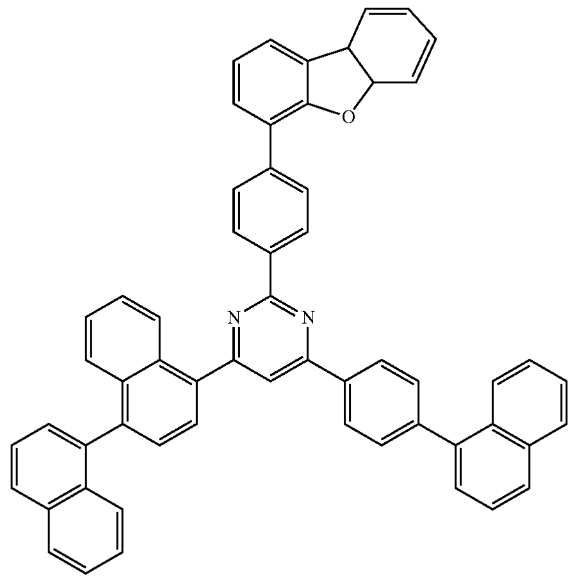
ET63
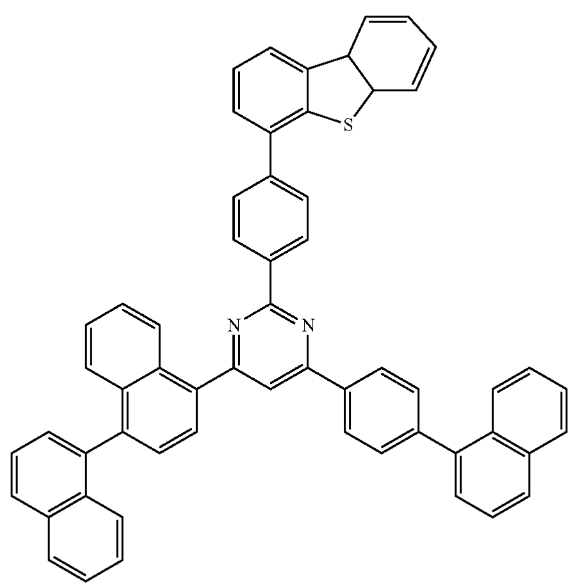

-continued
ET64
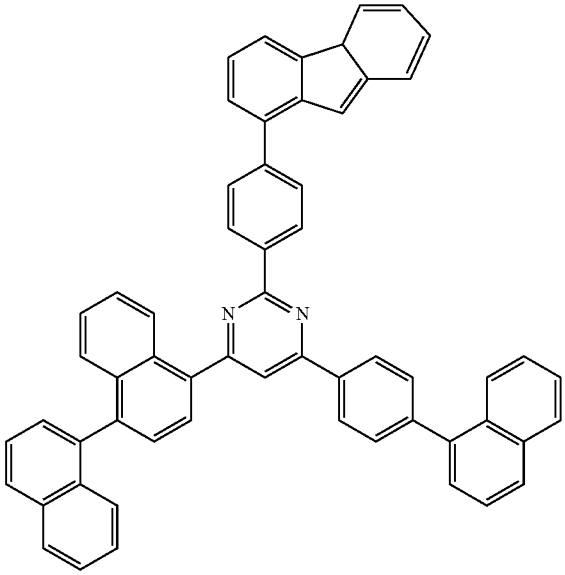
ET65
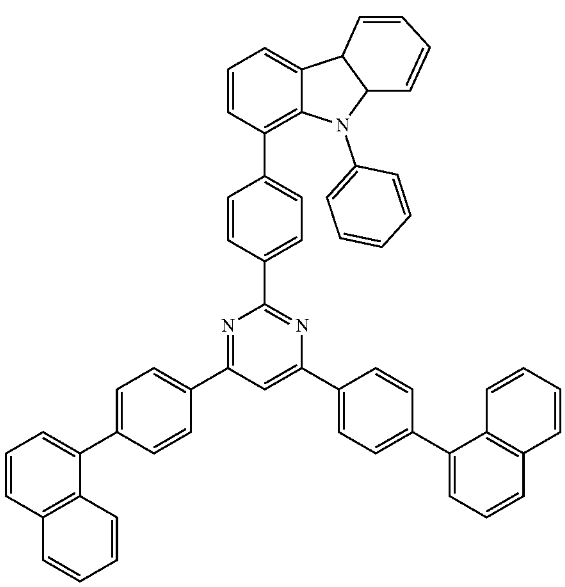
-continued
ET66
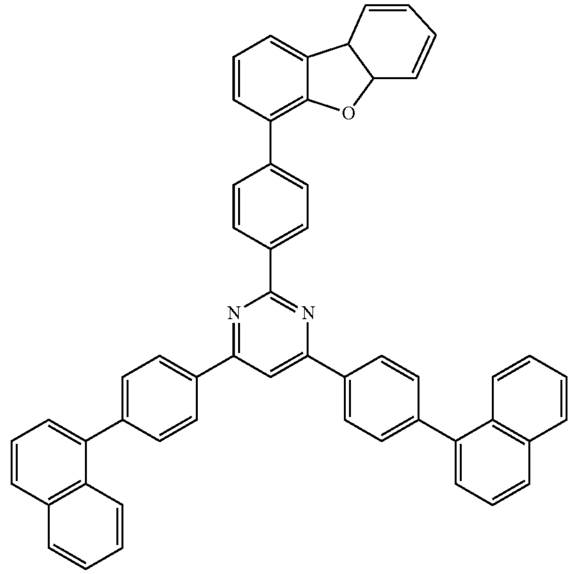
ET67
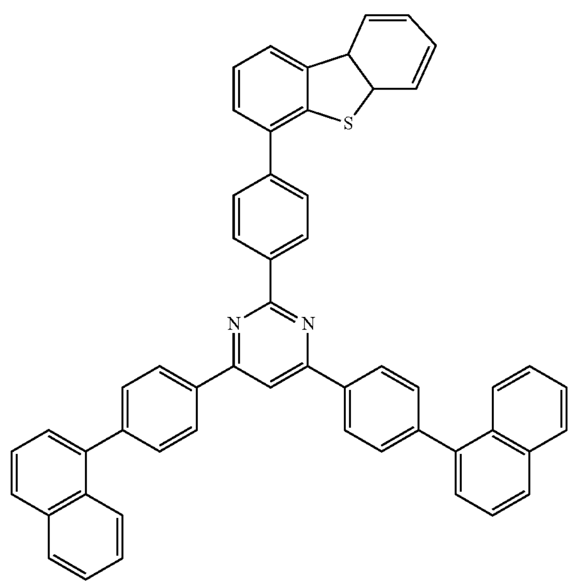

-continued
ET68
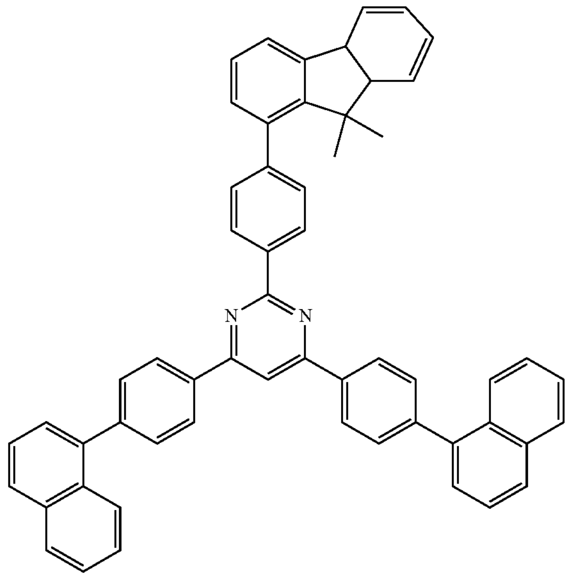
ET69
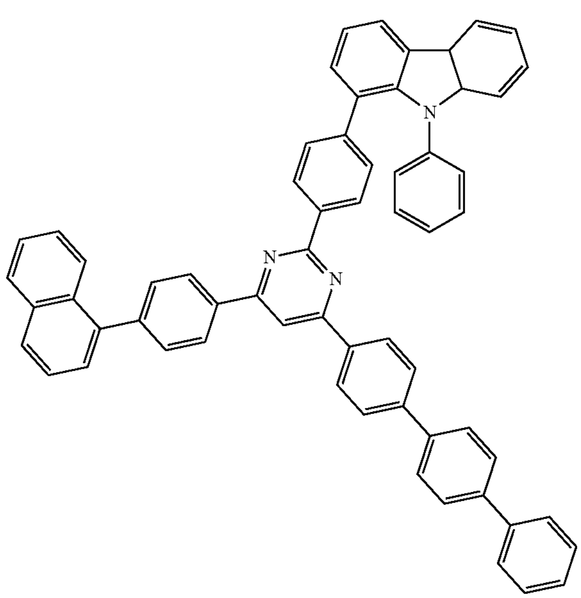
-continued
ET70
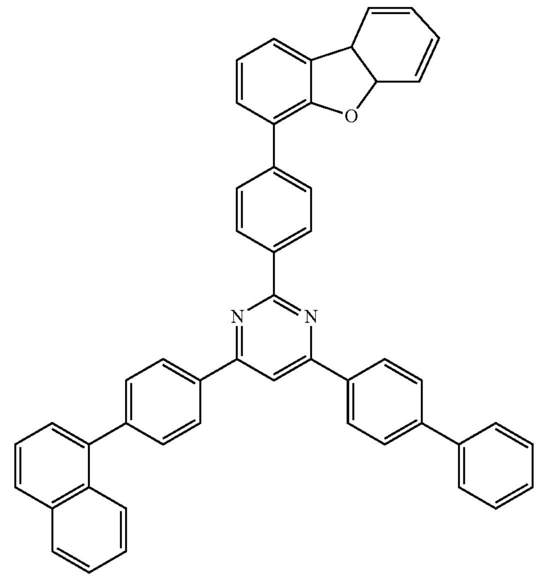
ET71
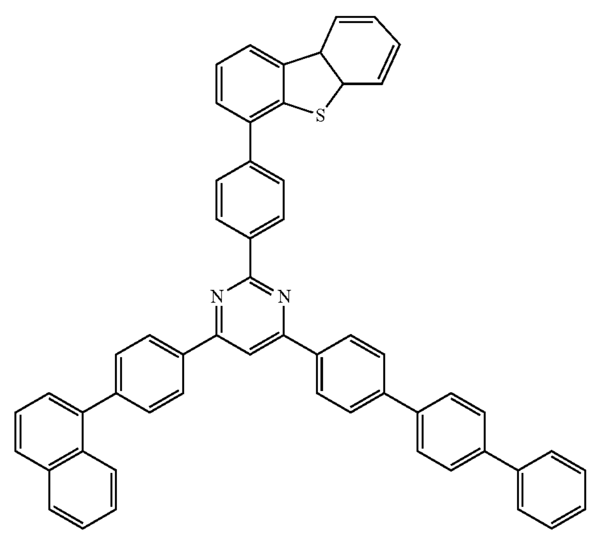

-continued
ET72
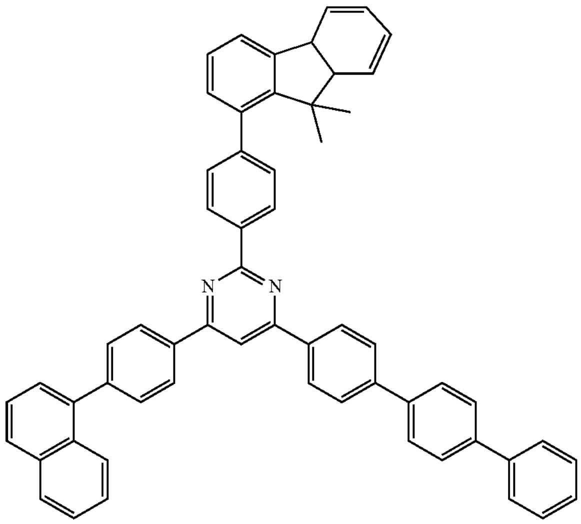
ET73
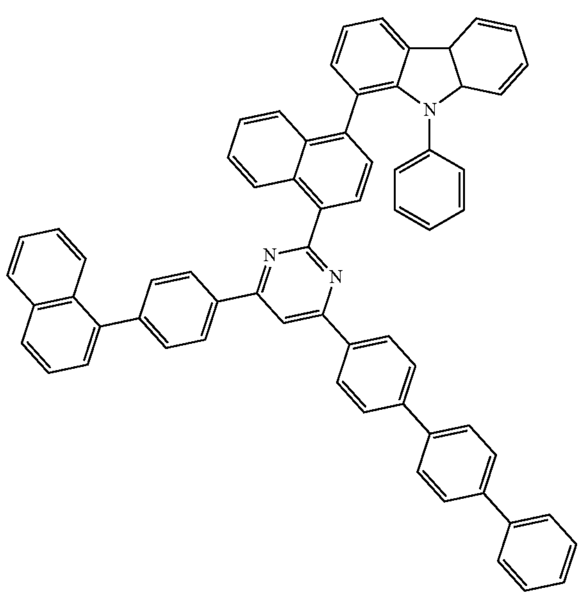
-continued
ET74
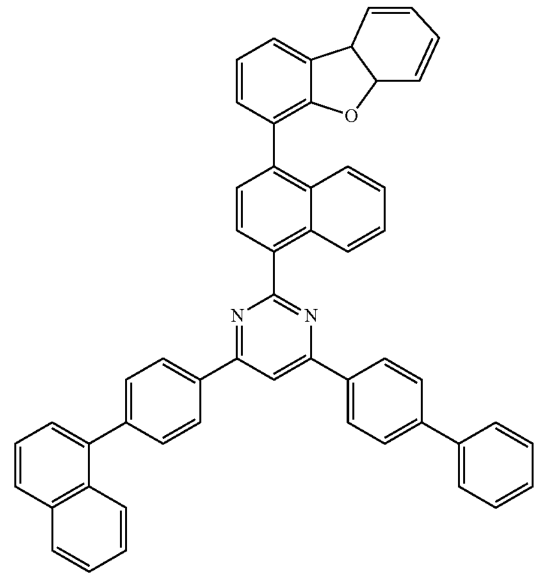
ET75
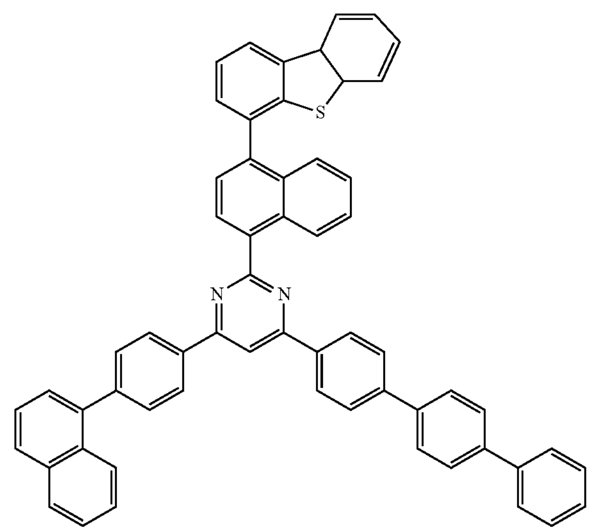
ET76
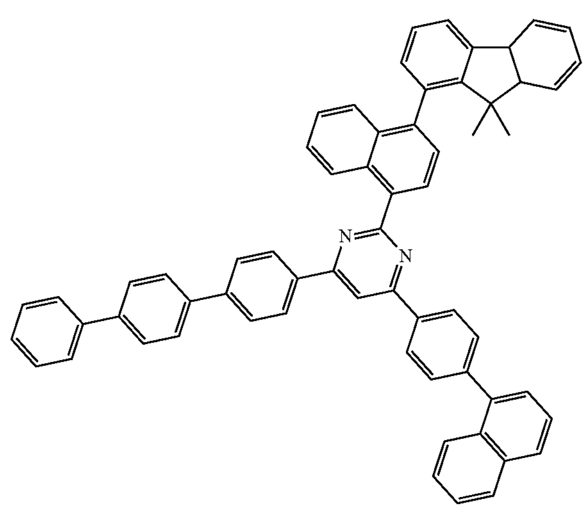

-continued
ET77
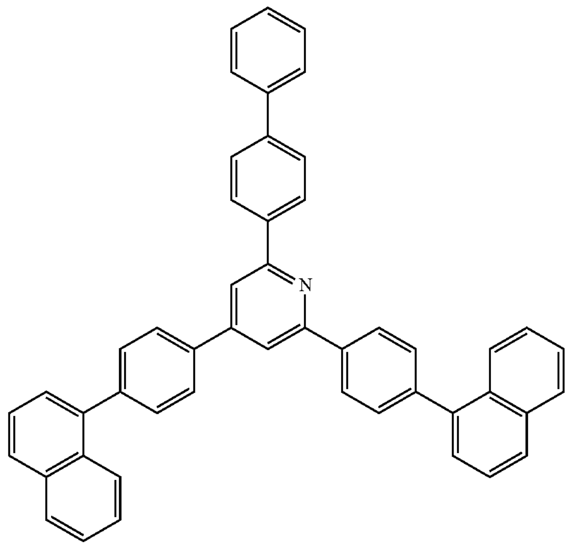
ET78
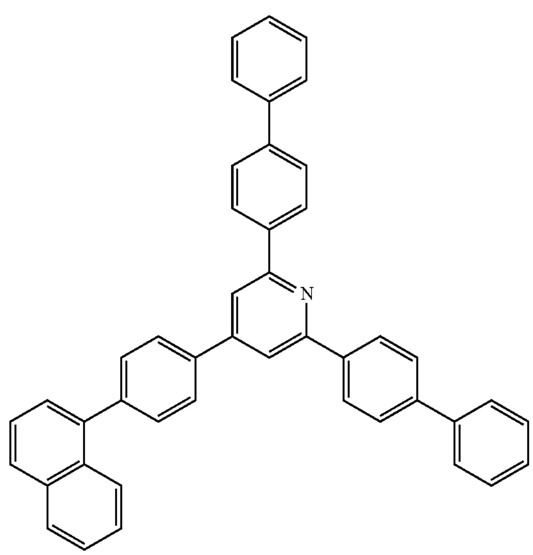
-continued
ET79
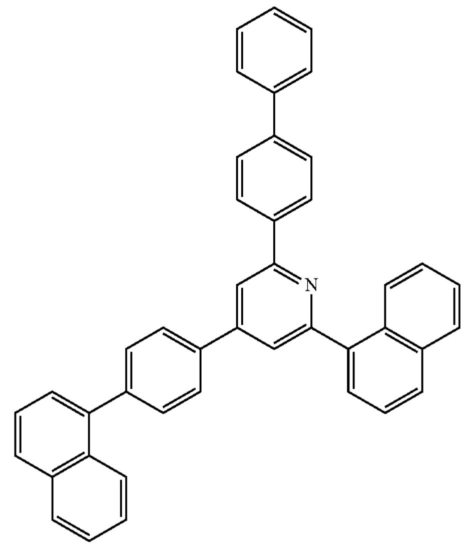
ET80
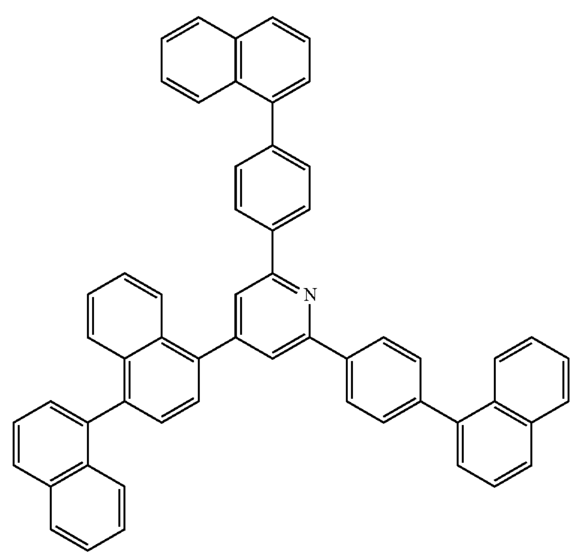

-continued
ET81
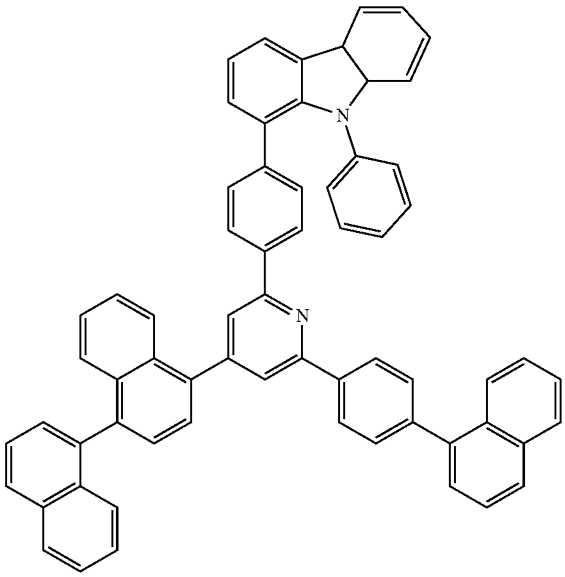
ET82
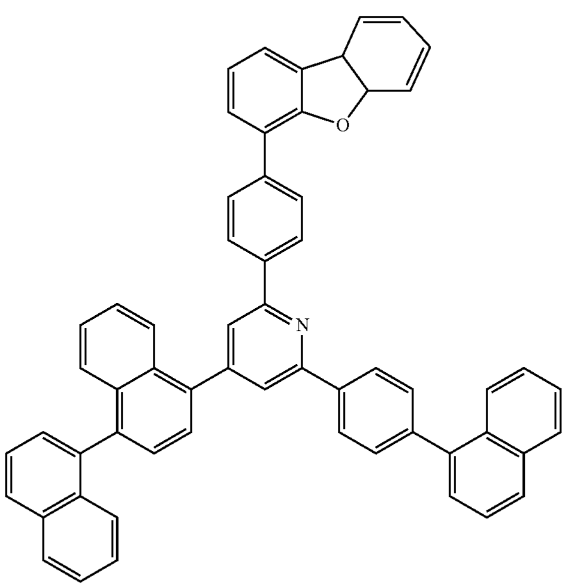
-continued
ET83
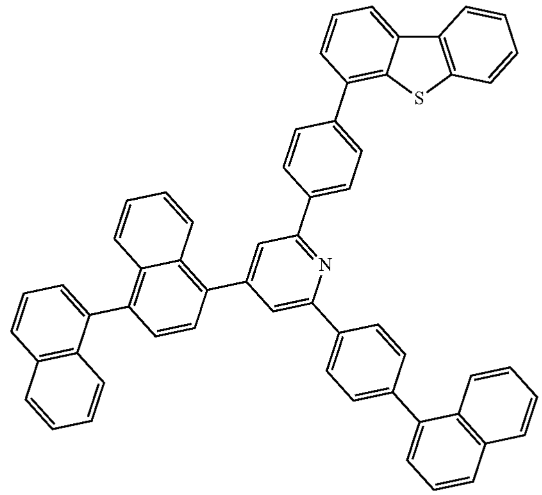
ET84
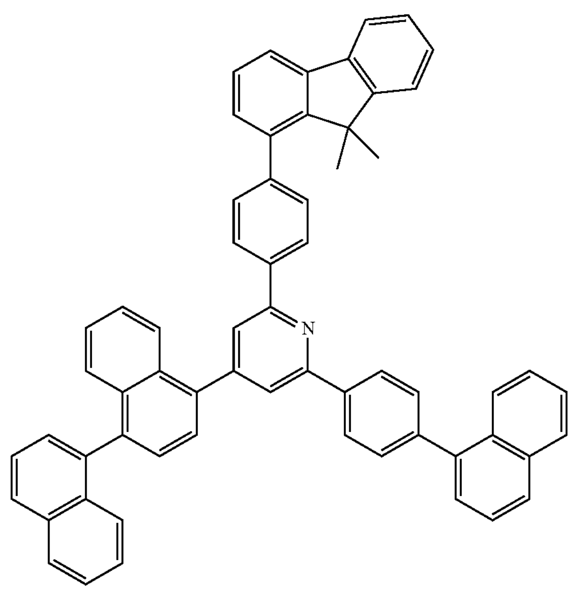

-continued
ET85
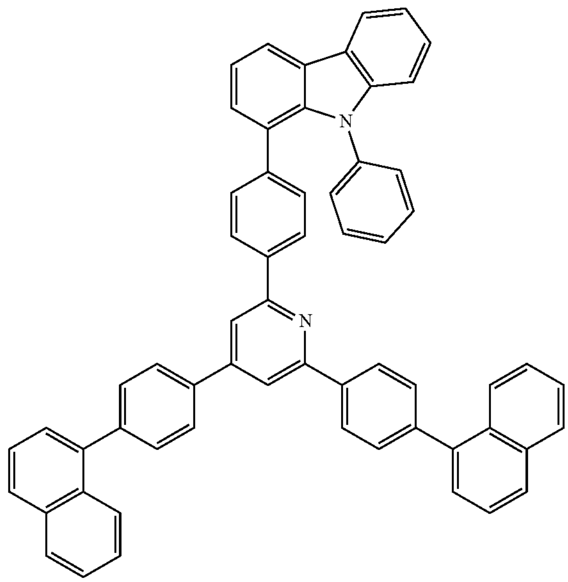
ET86
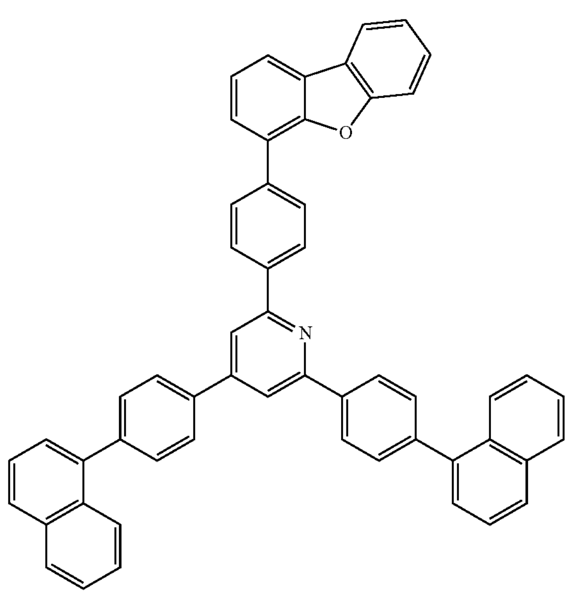
-continued
ET87
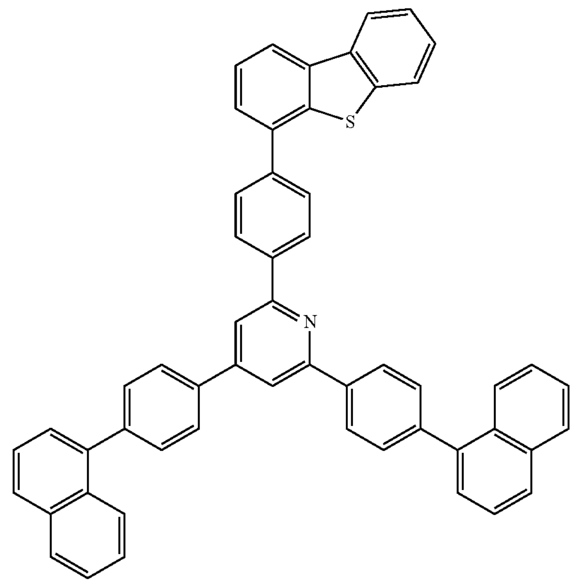
ET88
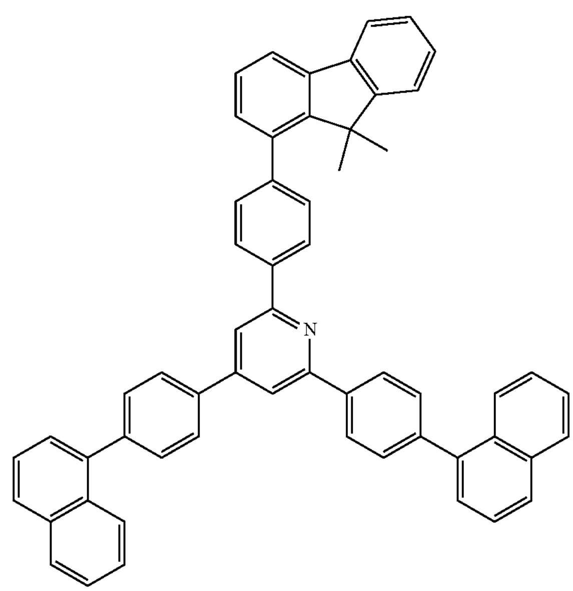

-continued
ET89
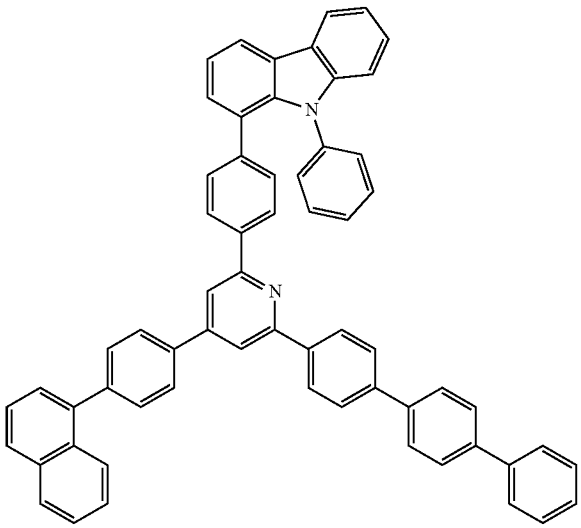
ET90
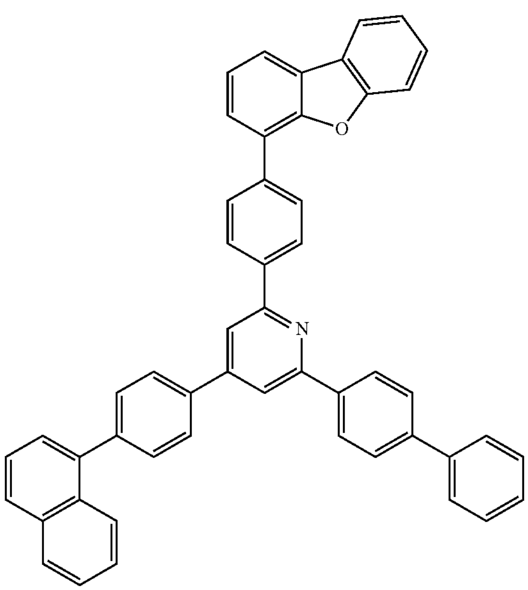
-continued
ET91
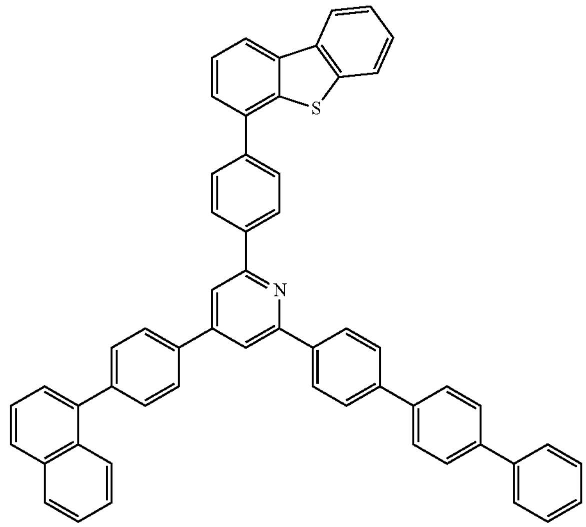
ET92
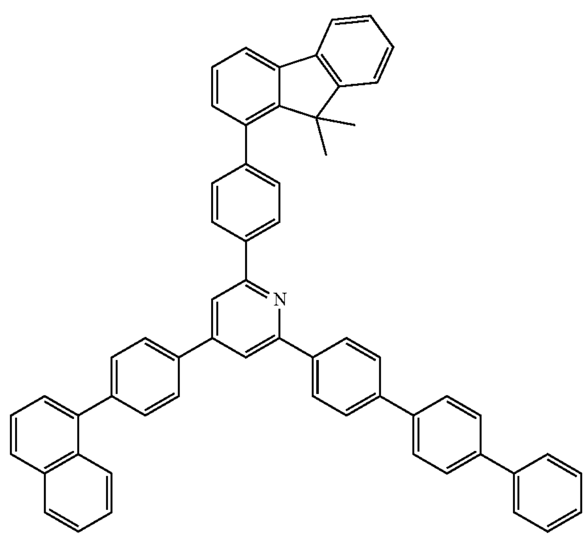

-continued
ET93
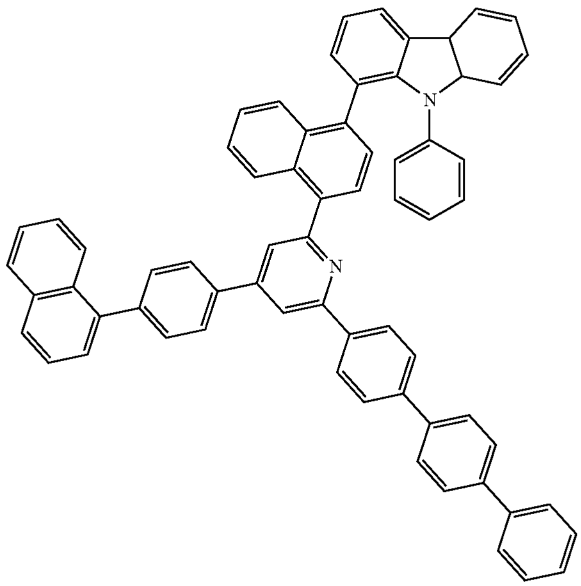
ET94
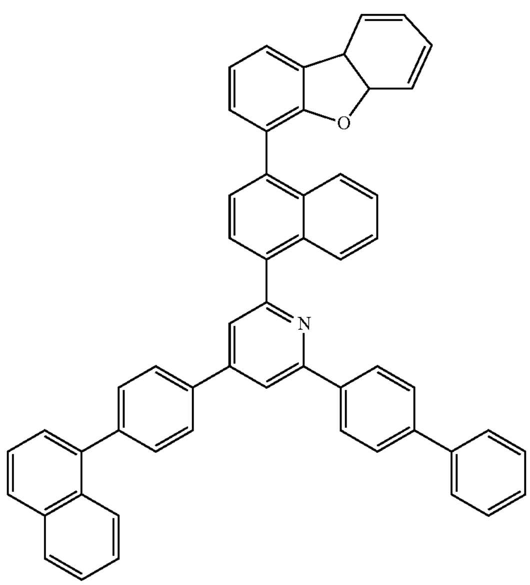
-continued
ET95
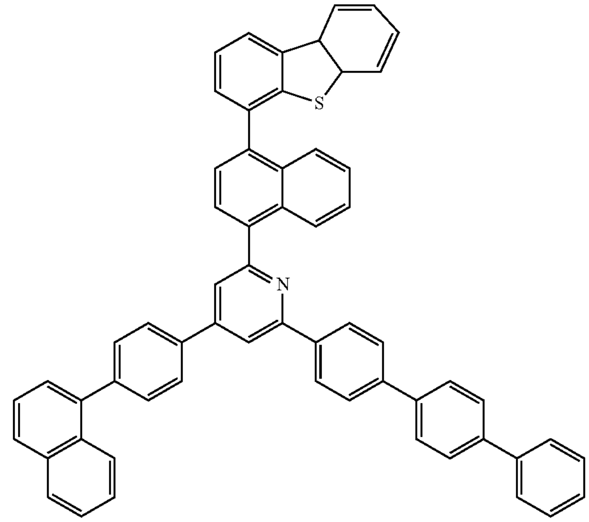
ET96
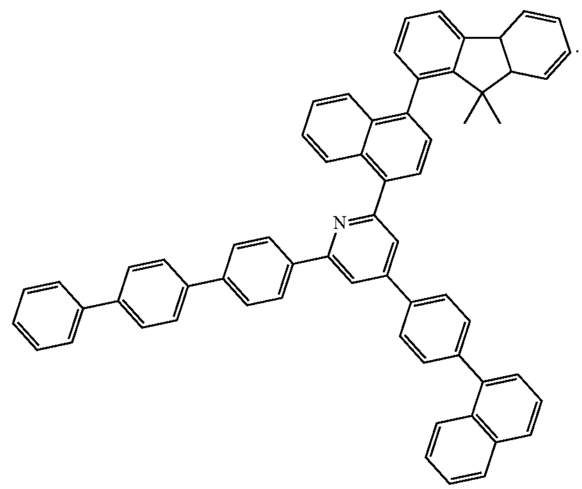
In one or more embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ.
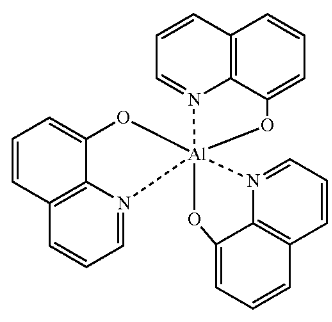
$Alq_3$ -continued

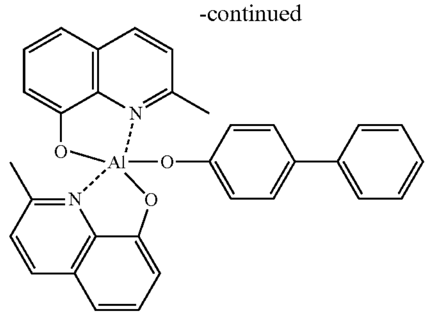

BAlq

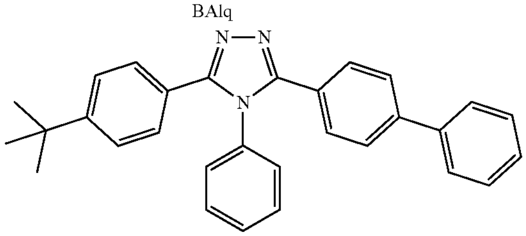

TAZ

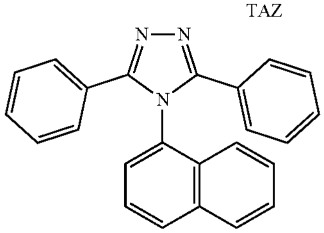

NTAZ

The thicknesses of the buffer layer, the hole blocking layer, and the electron control layer may each independently be about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth-metal complex. A metal ion of the alkali metal complex may be selected from a lithium (Li) ion, a sodium (Na) ion, a potassium (K) ion, a rubidium (Rb) ion, and a cesium (Cs) ion, and a metal ion of the alkaline earth-metal complex may be selected from a beryllium (Be) ion, a magnesium (Mg) ion, a calcium (Ca) ion, a strontium (Sr) ion, and a barium (Ba) ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

ET-D1

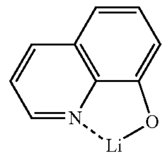

ET-D2

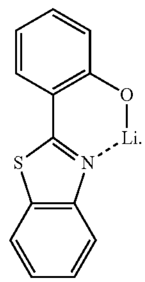

The electron transport region may include an electron injection layer to facilitate electron injection from the second electrode 190. The electron injection layer may directly contact the second electrode 190.

The electron injection layer may have i) a single-layered structure including (e.g., consisting of) a single material, ii) a single-layered structure including (e.g., consisting of) a plurality of different materials, or iii) a multi-layered structure having a plurality of layers including (e.g., consisting of) a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be selected from Li, Na, K, Rb, and Cs. In one embodiment, the alkali metal may be Li, Na, or Cs. In one embodiment, the alkali metal may be Li or Cs, but embodiments of the present disclosure are not limited thereto.

The alkaline earth metal may be selected from Mg, Ca, Sr, and Ba.

The rare earth metal may be selected from scandium (Sc), yttrium (Y), cerium (Ce), terbium (Tb), ytterbium (Yb), and gadolinium (Gd).

The alkali metal compound, the alkaline earth-metal compound, and the rare earth metal compound may be selected from oxides and halides (for example, fluorides, chlorides, bromides, and/or iodides) of the alkali metal, the alkaline earth-metal, and the rare earth metal.

The alkali metal compound may be selected from alkali metal oxides (such as $Li_2O$, $Cs_2O$, and/or $K_2O$), and alkali metal halides (such as LiF, NaF, CsF, KF, LiI, NaI, CsI, and/or KI). In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides (such as BaO, SrO, CaO, $Ba_xSr_{1-x}O$ (0<x<1), and/or $Ba_xCa_{1-x}O$ (0<x<1)). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (e.g., consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more embodiments, the electron injection layer may further include an organic material. When the electron injection layer further includes an organic material, the alkali metal, the alkaline earth metal, the rare earth metal, the alkali metal compound, the alkaline earth-metal compound, the rare earth metal compound, the alkali metal complex, the alkaline earth-metal complex, the rare earth metal complex, or combination thereof may be homogeneously or non-homogeneously dispersed in a matrix including (e.g., formed of) the organic material.

A thickness of the electron injection layer may be about 1 Å to about 100 Å, for example, about 3 Å to about 90 Å. When the thickness of the electron injection layer is within the range described above, the electron injection layer may have satisfactory electron injection characteristics without a substantial increase in driving voltage.

Second Electrode 190

The second electrode 190 is located on the organic layer 150. The second electrode 190 may be a cathode (which is an electron injection electrode), and in this regard, a material for forming the second electrode 190 may be selected from a metal, an alloy, an electrically conductive compound, and any combination thereof, each having a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure or a multi-layered structure including two or more layers.

The organic light-emitting device 10 may further include a capping layer positioned in a direction of light emission.

The capping layer may increase the external luminescence efficiency of the device according to the principle of constructive interference.

The capping layer may have a refractive index of about 1.6 or more with respect to a wavelength of about 589 nm.

The capping layer may be an organic capping layer consisting of an organic material, an inorganic capping layer consisting of an inorganic material, or a composite capping layer including an organic material and an inorganic material.

The capping layer may include at least one material selected from carbocyclic compounds, heterocyclic compounds, amine-based compounds, porphyrin derivatives, phthalocyanine derivatives, naphthalocyanine derivatives, alkali metal complexes, and alkaline earth-metal complexes. The carbocyclic compound, the heterocyclic compound, and the amine-based compound may each be optionally substituted with a substituent containing at least one element selected from oxygen (O), nitrogen (N), sulfur (S), selenium (Se), silicon (Si), fluorine (F), chlorine (Cl), bromine (Br), and iodine (I). In one embodiment, the capping layer may include an amine-based compound.

In one embodiment, the capping layer may include a compound represented by Formula 201 or a compound represented by Formula 202.

In one or more embodiments, the capping layer may include a compound selected from Compounds HT28 to HT33 and Compounds CP1 to CP5, but embodiments of the present disclosure are not limited thereto:

CP1

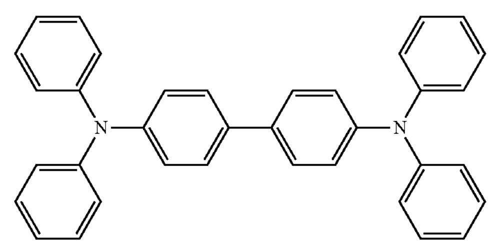

CP2

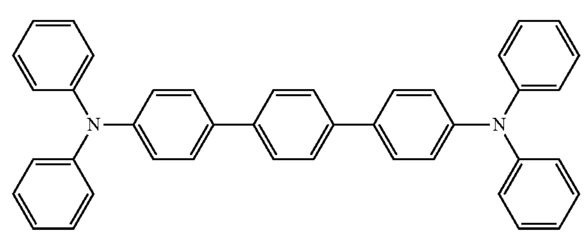

-continued

CP3

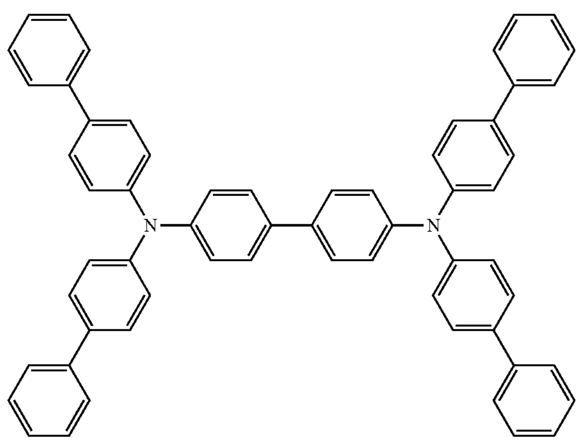

CP4

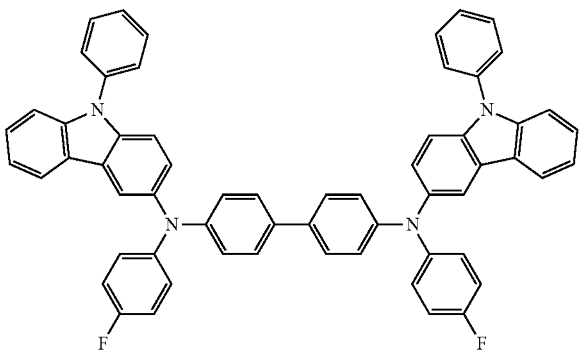

CP5

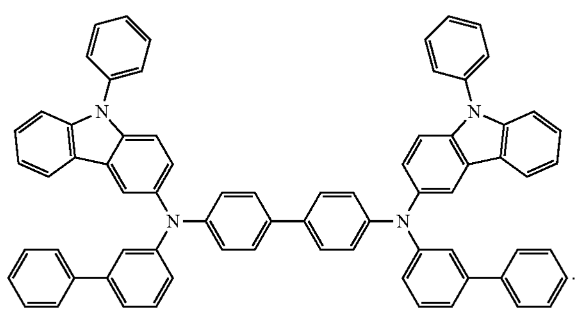

Hereinbefore, the organic light-emitting device has been described with reference to FIG. 1, but embodiments of the present disclosure are not limited thereto.

The layers constituting the hole transport region, the emission layer, and the layers constituting the electron transport region may each be formed in a set or predetermined region using one or more suitable methods selected from vacuum deposition, spin coating, casting, Langmuir-Blodgett (LB) deposition, ink-jet printing, laser-printing, and laser-induced thermal imaging (LITI).

When the layers constituting the hole transport region, the emission layer, and the layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on the material to be included and the structure of the layer to be formed.

When the layers constituting the hole transport region, the emission layer, and the layers constituting the electron transport region are formed by spin coating, the spin coating may be performed at a coating speed of about 2,000 rpm to about 5,000 rpm and at a heat treatment temperature of about 80° C. to 200° C., depending on the material to be included and the structure of the layer to be formed.

Full-Color Organic Light-Emitting Device

Figure 3:
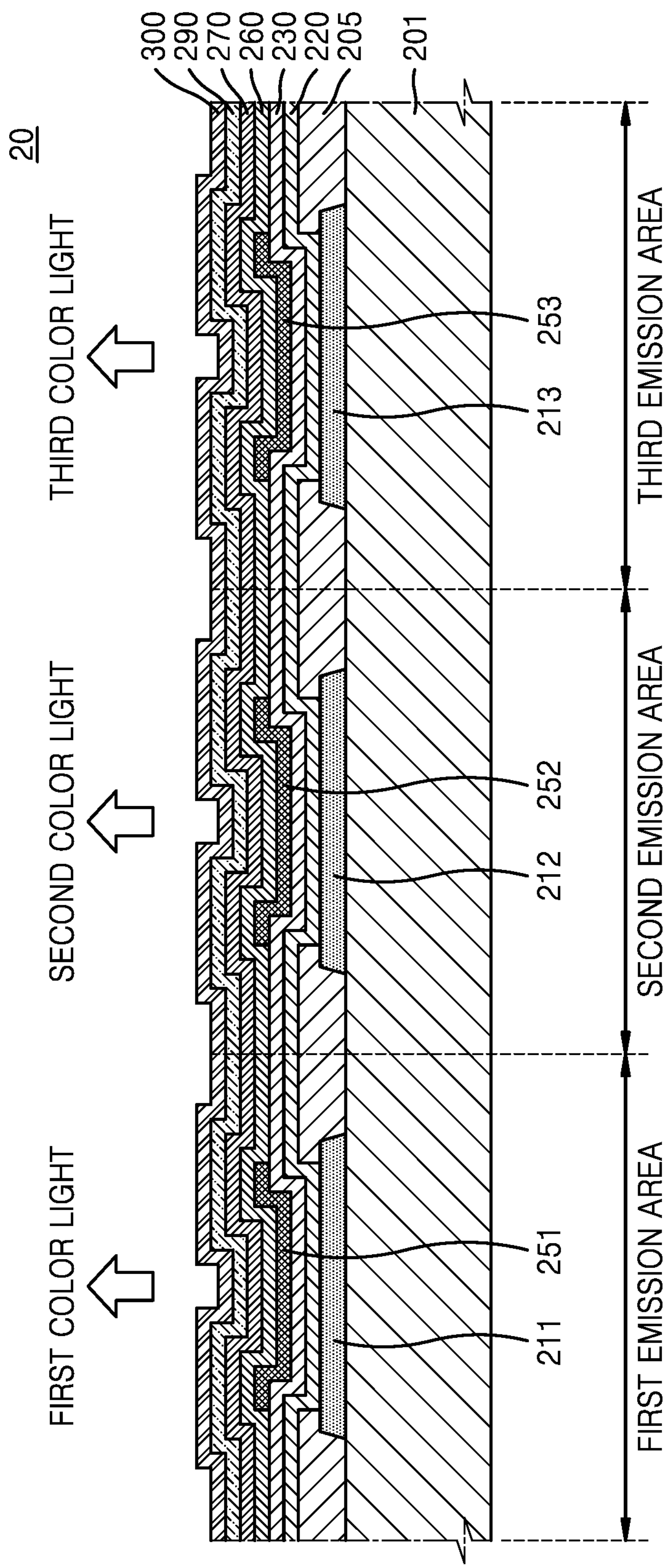
FIG. 3 is a schematic view of a structure of an organic light-emitting device according to an embodiment.

FIG. 3 is a schematic cross-sectional view of an organic light-emitting device 20 according to an embodiment.

Although a substrate 201 is described, other substrates or variations thereof may be used. In some embodiments, for example, a thin-film transistor including a source electrode, a drain electrode, an activation layer, a buffer layer, and an organic insulation layer may be further located between the substrate 201 and first, second, and third pixel electrodes 211, 212, and 213.

The organic light-emitting device 20 of FIG. 3 includes a first emission area, a second emission area, and a third emission area.

The organic light-emitting device 20 includes the first pixel electrode 211, the second pixel electrode 212, and the third pixel electrode 213, respectively located in the first emission area, the second emission area, and the third emission area.

The first pixel electrode 211, the second pixel electrode 212, and the third pixel electrode 213 are the same as described in connection with the first electrode 110 in the present specification.

The first pixel electrode 211, the second pixel electrode 212, and the third pixel electrode 213 may each be electrically connected with any one of the source electrode and the drain electrode of the thin-film transistor.

The organic light-emitting device 20 includes a counter electrode 290 facing the first pixel electrode 211, the second pixel electrode 212, and the third pixel electrode 213.

An organic layer is located between the counter electrode 290 and the first pixel electrode 211, the second pixel electrode 212, and the third pixel electrode 213.

The organic layer includes a hole injection layer 220, a hole transport layer 230, emission layers 251, 252, and 253, an electron transport layer 260, and an electron injection layer 270. Although not shown in FIG. 3, an emission auxiliary layer may be located between the hole transport layer 230 and the first emission layer 251, the hole transport layer 230 and the second emission layer 252, and/or the hole transport layer 230 and the third emission layer 253.

A pixel-defining film 205 is formed on edge portions of the first pixel electrode 211, the second pixel electrode 212, and the third pixel electrode 213. The pixel-defining film 205 defines each pixel area and may include or be formed of any suitable organic insulation material (for example, silicon-based materials), inorganic insulation materials, or organic/inorganic composite insulation materials.

The hole injection layer 220 and the hole transport layer 230 may be sequentially formed as common layers on the first pixel electrode 211, the second pixel electrode 212, and the third pixel electrode 213.

The hole injection layer 220 and the hole transport layer 230 may be the same as described in connection with the organic light-emitting device 10 in the present specification.

The first emission layer 251 may be located corresponding to the first emission area to emit first-color light, the second emission layer 252 may be located corresponding to the second emission area to emit second-color light, and the third emission layer 253 may be located corresponding to the third emission area to emit third-color light, each being formed on the hole transport layer 230.

The electron transport layer 260, the electron injection layer 270, and the counter electrode 290 may be sequentially formed as common layers with respect to the first emission area, the second emission area, and the third emission area.

The electron transport layer 260 and the electron injection layer 270 may be the same as described in connection with the organic light-emitting device 10 in the present specification. The counter electrode 290 may be the same as described in connection with the second electrode 190 in the present specification.

A capping layer 300 is located on the counter electrode 290. The capping layer 300 may include or be formed of the organic material and/or the inorganic material described above. In one or more embodiments, the capping layer 300 may include compounds selected from Compounds HT28 to HT33 and Compounds CP1 to CP5, but embodiments of the present disclosure are not limited thereto.

The capping layer 300 may aid in efficient emission of light generated from the organic light-emitting device 20, and may protect the organic light-emitting device 20.

A maximum emission wavelength of the first-color light and a maximum emission wavelength of the second-color light may each be greater than a maximum emission wavelength of the third-color light.

The first color light may be red light, the second color light may be green light, and the third color light may be blue light, but embodiments of the present disclosure are not limited thereto. Accordingly, the organic light-emitting device 20 may emit full color. However, the first-color light, the second-color light, and the third-color light are not limited to the above, provided that the mixed color light can be white light.

In one or more embodiments, a maximum emission wavelength of the first-color light may be about 620 nm to about 750 nm, a maximum emission wavelength of the second-color light may be about 495 nm to about 570 nm, and a maximum emission wavelength of the third-color light may be about 430 nm to about 495 nm, but embodiments of the present disclosure are not limited thereto.

At least two of the emission layers among the first emission layer 251, the second emission layer 252, and the third emission layer 253 may include a host including a first compound and a second compound and a dopant, wherein the first compound, the second compound, and the dopant are different from one another.

Two host compounds in the emission layer having different HOMO and LUMO energy levels form an exciplex, and a difference between a HOMO energy level and a LUMO energy level of the exciplex ($\Delta E_{exciplex}$) may be greater than a difference between a HOMO energy level and a LUMO energy level of the dopant ($\Delta E_{dopant}$).

The first compound, the second compound, and the dopant may each be the same as described in connection with the organic light-emitting device 10.

In one embodiment, the second compound may be a host having a smaller electron transport capability than the first compound.

In one embodiment, two emission layers selected from the first emission layer 251, the second emission layer 252, and the third emission layer 253 may each include two hosts (i.e., the first compound and the second compound) and a dopant, and in some embodiments, the first emission layer 251, the second emission layer 252, and the third emission layer 253 may each include two hosts (the first compound and the second compound) and a dopant.

In one embodiment, at least one emission layer selected from the first emission layer 251, the second emission layer 252, and the third emission layer 253 may further include a third compound that is different from the first compound and the second compound.

In one embodiment, at least one emission layer selected from the first emission layer 251, the second emission layer 252, and the third emission layer 253 may further include two or more hosts, each being different from the first compound and the second compound.

When there are N different hosts included in the emission layer, the emission layer may include a first compound to an Nth compound.

For example, at least one of the first emission layer 251, the second emission layer 252, and the third emission layer 253 of the organic light-emitting device 20 may include one of the following combinations:

i) a first compound, a second compound, and a dopant;

ii) a first compound, a second compound, a third compound, and a dopant; and iii) a first compound, a second compound, a third compound, . . . , an (N−1)th compound, an Nth compound, and a dopant.

In FIG. 3, the organic light-emitting device 20 including the pixel-defining film 205, the hole injection layer 220, the hole transport layer 230, the electron transport layer 260, and the electron injection layer 270 is illustrated, but various suitable modifications are possible, and for example, at least one of the described layers may be omitted.

Apparatus

The organic light-emitting device may be included in various suitable apparatuses.

One or more example embodiments of the present disclosure provide is an apparatus including the organic light-emitting device.

The apparatus may be, for example, a light-emitting apparatus, an authentication apparatus, or an electronic apparatus, but embodiments of the present disclosure are not limited thereto.

The light-emitting apparatus may be used as any suitable display, light source, and/or the like.

The authentication apparatus may be, for example, a biometric authentication apparatus for authenticating an individual using biometric information of a biometric body (for example, a fingertip, a pupil, and/or the like).

The authentication apparatus may further include, in addition to the organic light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various measuring instruments, meters (for example, meters for a vehicle, an aircraft, and a vessel), projectors, and/or the like, but embodiments of the present disclosure are not limited thereto.

In one embodiment, the apparatus may further include, in addition to the organic light-emitting device, a thin-film transistor. Here, the thin-film transistor includes a source electrode, an activation layer, and a drain electrode, and the first electrode or a pixel electrode of the organic light-emitting device may be in electrical contact (e.g., electrically connected) with one of the source electrode and the drain electrode of the thin-film transistor.

General Definition of Substituents

The term "$C_1$-$C_{60}$ alkyl group" as used herein refers to a linear or branched aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and non-limiting examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term $C_3$-$C_{10}$ cycloalkenyl group as used herein refers to a monovalent monocyclic group that has 3 to 10 carbon atoms, at least one carbon-carbon double bond in the ring thereof, and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, a fluorenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a carbazolyl group, a dibenzofuranyl group, a dibenzothiofuranyl group, a quinolinyl group, and an isoquinolinyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein indicates —$OA_{102}$ (wherein $A_{102}$ is a $C_6$-$C_{60}$ aryl group), and the term "$C_6$-$C_{60}$ arylthio group" as used herein indicates —$SA_{103}$ (wherein $A_{103}$ is a $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and non-aromaticity in its entire molecular structure. Non-limiting examples of the monovalent non-aromatic condensed polycyclic group include an adamantyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, Si, P, and S, other than carbon atoms, as a ring-forming atom, and non-aromaticity in its entire molecular structure. Non-limiting examples of the monovalent non-aromatic condensed heteropolycyclic group include an azaadamantyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon as a ring-forming atom, and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring (such as benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having substantially the same structure as the $C_5$-$C_{60}$ carbocyclic group, except that as a ring-forming atom, at least one heteroatom selected from N, O, Si, P, and S is used in addition to carbon (the number of carbon atoms may be 1 to 60).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group". For example, a "biphenyl group" is a substituted phenyl group having a $C_6$-$C_{60}$ aryl group as a substituent.

The term "terphenyl group" as used herein refers to "a phenyl group substituted with a biphenyl group". For example, a "terphenyl group" is "a substituted phenyl group" having, as a substituent, "a $C_6$-$C_{60}$ aryl group substituted with a $C_6$-$C_{60}$ aryl group".

* and *' as used herein, unless defined otherwise, each refer to a binding site to a neighboring atom in a corresponding formula.

Hereinafter, a light-emitting device according to embodiments will be described in more detail with reference to Examples.

EXAMPLES

Evaluation Example 1: Evaluation of HOMO and LUMO Energy Levels

The HOMO and LUMO energy levels of Compounds C1 to C12 used in Examples 1-1 to 1-11, 2-1 to 2-10, and 3-1 to 3-14, Compounds HA1 to HA6 used in Comparative Examples 1-1 to 1-4, 2-1 to 2-3, and 3-1 to 3-4, and Compounds PRD, PGD, and FBD, were measured by cyclic voltammetry, and results thereof are shown in Table 1.

TABLE 1

| Compound | HOMO energy level (eV) | LUMO energy level (eV) |
|---|---|---|
| C1 | 5.75 | 2.8 |
| C2 | 5.7 | 2.79 |

TABLE 1-continued

| Compound | HOMO energy level (eV) | LUMO energy level (eV) |
|---|---|---|
| C3 | 6.01 | 2.6 |
| C4 | 5.7 | 2.64 |
| C5 | 5.95 | 2.95 |
| C6 | 5.87 | 2.93 |
| C7 | 5.8 | 2.4 |
| C8 | 5.9 | 2.8 |
| C9 | 5.8 | 2.6 |
| C10 | 5.79 | 2.52 |
| C11 | 5.82 | 2.61 |
| C12 | 5.85 | 2.62 |
| HA1 | 5.8 | 2.9 |
| HA2 | 5.7 | 2.9 |
| HA3 | 6.02 | 3.32 |
| HA4 | 5.5 | 3.2 |
| HAS | 5.98 | 3.01 |
| HA6 | 5.85 | 2.89 |
| PRD | 4.7 | 2.9 |
| PGD | 5.5 | 2.99 |
| FBD | 5.43 | 2.7 |

Red Device Preparation Example

Example 1-1

A 15 Ω/cm$^2$ (1,200 Å) ITO glass substrate (anode) available from Corning was cut to a size of 50 mm×50 mm×0.5 mm, sonicated with acetone, isopropyl alcohol, and pure water each for 15 minutes, and then cleaned by irradiation of ultraviolet rays and exposure of ozone thereto for 30 minutes. Then, the ITO glass substrate was provided to a vacuum deposition apparatus.

m-MTDATA was deposited on the ITO glass substrate to form a hole injection layer having a thickness of 110 nm, and NPB was deposited on the hole injection layer to form a hole transport layer having a thickness of 10 nm, thereby completing formation of a hole transport region.

A host and a dopant were co-deposited on the hole transport region so that a concentration of the dopant in the host was 2 wt %, thereby forming an emission layer having a thickness of 45 nm. As hosts, a first compound (C1) and a second compound (C2) were co-deposited at a deposition speed of 25 nm/min and 20 nm/min, respectively, and as a dopant, Compound PRD was used.

BAlq was deposited on the emission layer to form a hole blocking layer having a thickness of 10 nm, and subsequently, $Alq_3$ and LiQ were co-deposited thereon to form an electron transport layer having a thickness of 30 nm.

LiF was deposited on the electron transport layer to form an electron injection layer having a thickness of 1.3 nm, and subsequently Al was deposited thereon to form a cathode having a thickness of 200 nm. HT28 was deposited on the cathode to form a capping layer having a thickness of 60 nm, thereby completing the manufacture of an organic light-emitting device.

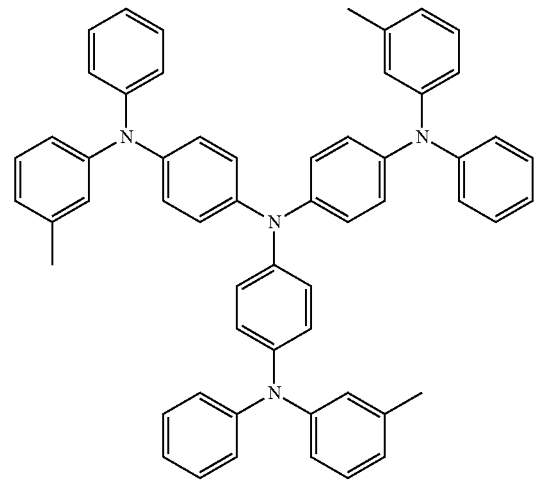

m-MTDATA

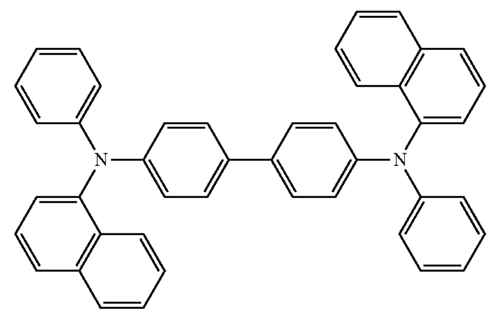

NPB

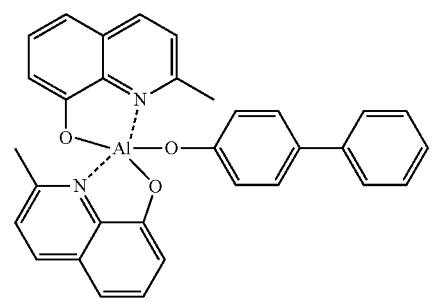

BAlq

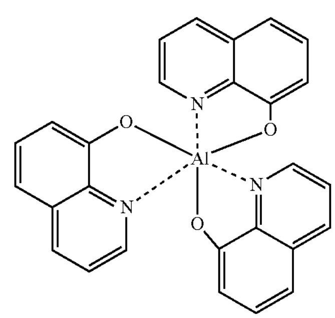

$Alq_3$

-continued

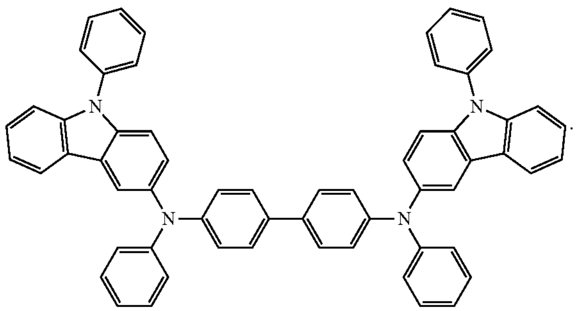

HT28

Examples 1-2 to 1-11 and Comparative Examples 1-1 to 1-4

Additional organic light-emitting devices were manufactured in substantially the same manner as in Example 1-1, except that, in forming an emission layer, the host and dopant compounds shown in Table 2 were used.

Evaluation Example 2: Red Device Evaluation Example

For each of the organic light-emitting devices manufactured according to Examples 1-1 to 1-11 and Comparative Examples 1-1 to 1-4, a driving voltage (V) at a current density of 10 mA/cm$^2$, efficiency (cd/A), and lifespan (LT97) were measured, and the results are shown in Table 2. The driving voltage and the current density of the organic light-emitting devices were measured using a source meter (manufactured by Keithley Instrument Inc., 2400 series).

TABLE 2

| No. | First compound | Second compound | Third compound | Dopant | Driving voltage (V) | Efficiency (cd/A) | Life-span ($LT_{97}$) (h) | Color coordi-nate x |
|---|---|---|---|---|---|---|---|---|
| Example 1-1 | C1 (25 nm/min) | C2 (20 nm/min) | — | PRD 2 wt % | 3.11 | 47.1 | 173 | 0.682 |
| Example 1-2 | C1 (25 nm/min) | C3 (20 nm/min) | — | PRD 2 wt % | 3.11 | 48.1 | 172 | 0.681 |
| Example 1-3 | C1 (25 nm/min) | C5 (20 nm/min) | — | PRD 2 wt % | 3.17 | 48.3 | 255 | 0.681 |
| Example 1-4 | C2 (25 nm/min) | C3 (20 nm/mi n) | — | PRD 2 wt % | 3.22 | 49.4 | 255 | 0.681 |
| Example 1-5 | C2 (25 nm/min) | C5 (20 nm/mi n) | — | PRD 2 wt % | 2.89 | 49.9 | 290 | 0.682 |
| Example 1-6 | C1 (15 nm/min) | C2 (15 nm/min) | C3 (15 nm/min) | PRD 2 wt % | 3.10 | 50.3 | 281 | 0.682 |
| Example 1-7 | C1 (15 nm/min) | C3 (15 nm/min) | C5 (15 nm/min) | PRD 2 wt % | 3.01 | 50.0 | 291 | 0.681 |
| Example 1-8 | C1 (15 nm/min) | C2 (15 nm/min) | C5 (15 nm/min) | PRD 2 wt % | 2.88 | 48.7 | 272 | 0.681 |
| Example 1-9 | C2 (15 nm/min) | C3 (15 nm/min) | C5 (15 nm/min) | PRD 2 wt % | 3.04 | 52.8 | 285 | 0.681 |
| Example 1-10 | C2 (15 nm/min) | C5 (15 nm/min) | C6 (15 nm/min) | PRD 2 wt % | 2.98 | 55.3 | 272 | 0.680 |
| Example 1-11 | C1 (15 nm/min) | C3 (15 nm/min) | C6 (15 nm/min) | PRD 2 wt % | 3.11 | 55.8 | 297 | 0.682 |
| Comparative Example 1-1 | HA1 (45 nm/min) | — | — | PRD 2 wt % | 3.42 | 44.6 | 170 | 0.681 |
| Comparative Example 1-2 | C1 (45 nm/min) | — | — | PRD 2 wt % | 3.25 | 45.3 | 150 | 0.678 |
| Comparative Example 1-3 | C2 (45 nm/min) | — | — | PRD 2 wt % | 3.35 | 43.2 | 178 | 0.675 |
| Comparative Example 1-4 | C3 (45 nm/min) | — | — | PRD 2 wt % | 3.28 | 43.8 | 170 | 0.678 |

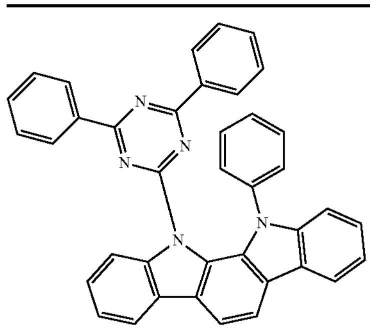

C1

TABLE 2-continued
| No. | First compound | Second compound | Third compound | Dopant | Driving voltage (V) | Efficiency (cd/A) | Life-span ($LT_{97}$) (h) | Color coordi-nate x |
|---|---|---|---|---|---|---|---|---|
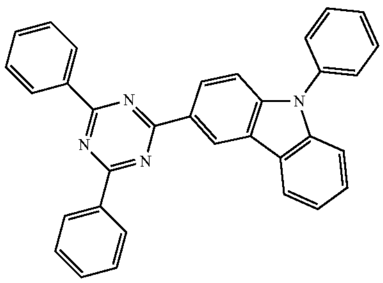
C2
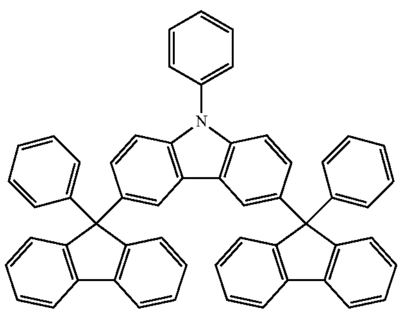
C3
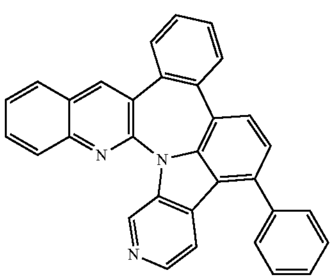
C5
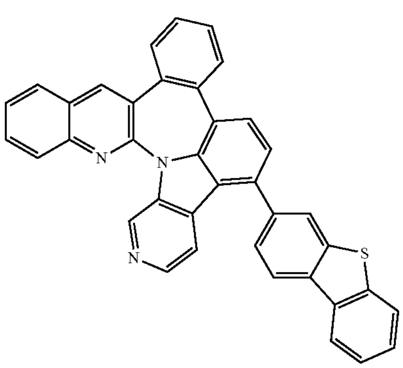
C6

TABLE 2-continued

| No. | First compound | Second compound | Third compound | Dopant | Driving voltage (V) | Efficiency (cd/A) | Life-span ($LT_{97}$) (h) | Color coordinate x |
|---|---|---|---|---|---|---|---|---|

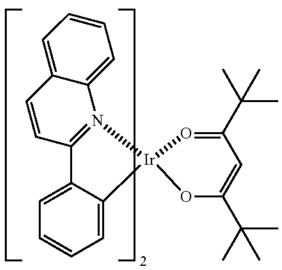

PRD

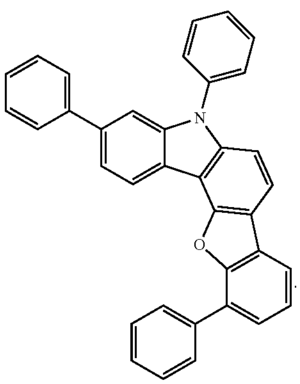

HA1

From Table 2, it is confirmed that the organic light-emitting devices manufactured according to Examples 1-1 to 1-11 have low driving voltages, high efficiencies, and long lifespans, compared to the organic light-emitting device manufactured according to Comparative Examples 1-1 to 1-4.

Green Device Preparation Example

Examples 2-1 to 2-10 and Comparative Examples 2-1 to 2-3

Additional organic light-emitting devices were manufactured in substantially the same manner as in Example 1-1, except that, in forming an emission layer, the host and dopant compounds shown in Table 3 were used.

Evaluation Example 3: Green Device Evaluation Example

For each of the organic light-emitting devices manufactured according to Examples 2-1 to 2-10 and Comparative Examples 2-1 to 2-3, a driving voltage (V) at a current density of 10 mA/cm$^2$, efficiency (cd/A), and lifespan (LT97) were measured, and the results are shown in Table 3. The driving voltage and the current density of the organic light-emitting devices were measured using a source meter (manufactured by Keithley Instrument Inc., 2400 series).

TABLE 3

| No. | First compound | Second compound | Third compound | Dopant | Driving voltage (V) | Efficiency (cd/A) | Life-span ($LT_{97}$) (h) | Color coordinate x |
|---|---|---|---|---|---|---|---|---|
| Example 2-1 | C1 (20 nm/min) | C4 (15 nm/min) | — | PGD 8 wt % | 3.76 | 101.6 | 181 | 0.344 |
| Example 2-2 | C1 (20 nm/min) | C3 (15 nm/min) | — | PGD 8 wt % | 4.08 | 97.8 | 226 | 0.345 |
| Example 2-3 | C1 (20 nm/min) | C7 (15 nm/min) | — | PGD 8 wt % | 3.68 | 152.7 | 350 | 0.266 |
| Example 2-4 | C4 (20 nm/min) | C3 (15 nm/min) | — | PGD 8 wt % | 3.72 | 150.0 | 280 | 0.275 |

TABLE 3-continued

| No. | First compound | Second compound | Third compound | Dopant | Driving voltage (V) | Efficiency (cd/A) | Life-span ($LT_{97}$) (h) | Color coordi-nate x |
|---|---|---|---|---|---|---|---|---|
| Example 2-5 | C4 (20 nm/min) | C7 (15 nm/min) | — | PGD 8 wt % | 3.84 | 148.2 | 302 | 0.270 |
| Example 2-6 | C1 (15 nm/min) | C4 (10 nm/min) | C3 (10 nm/min) | PGD 8 wt % | 3.52 | 174.7 | 280 | 0.268 |
| Example 2-7 | C1 (15 nm/min) | C4 (10 nm/min) | C7 (10 nm/min) | PGD 8 wt % | 3.65 | 173.4 | 300 | 0.273 |
| Example 2-8 | C1 (15 nm/min) | C3 (10 nm/min) | C8 (10 nm/min) | PGD 8 wt % | 3.65 | 172.7 | 290 | 0.270 |
| Example 2-9 | C4 (15 nm/min) | C3 (10 nm/min) | C8 (10 nm/min) | PGD 8 wt % | 3.50 | 170.2 | 300 | 0.274 |
| Example 2-10 | C4 (15 nm/min) | C7 (10 nm/min) | C8 (10 nm/min) | PGD wt 8 % | 3.57 | 171.8 | 295 | 0.275 |
| Comparative Example 2-1 | HA2 (20 nm/min) | HA3 (15 nm/min) | — | PGD 8 wt % | 4.10 | 46.9 | 90 | 0.340 |
| Comparative Example 2-2 | HA2 (20 nm/min) | HA4 (15 nm/min) | — | PGD 8 wt % | 4.15 | 50.8 | 110 | 0.343 |
| Comparative Example 2-3 | HA3 (20 nm/min) | HA4 (15 nm/min) | — | PGD 8 wt % | 4.15 | 52.0 | 108 | 0.342 |

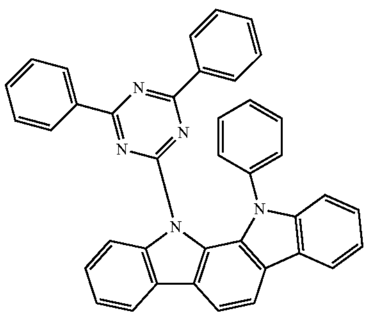

C1

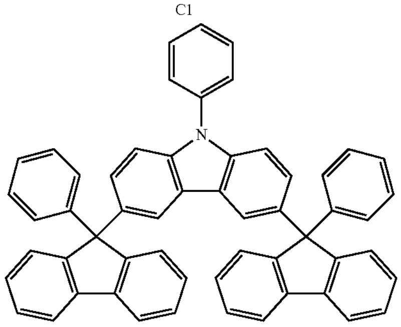

C3

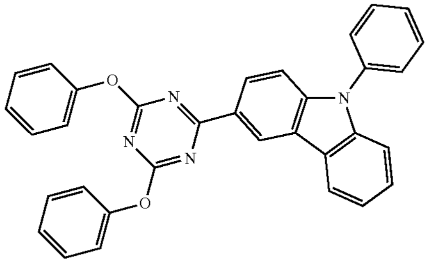

C4

TABLE 3-continued
| No. | First compound | Second compound | Third compound | Dopant | Driving voltage (V) | Efficiency (cd/A) | Life-span ($LT_{97}$) (h) | Color coordinate x |
|---|---|---|---|---|---|---|---|---|
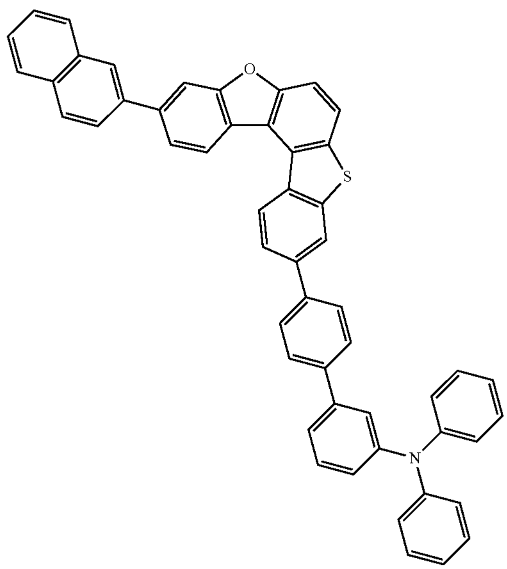
C7
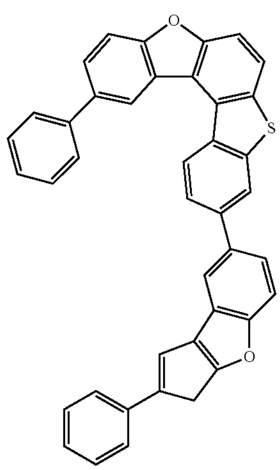
C8
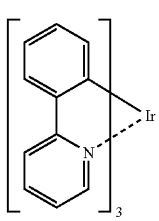
PGD TABLE 3-continued

| No. | First compound | Second compound | Third compound | Dopant | Driving voltage (V) | Efficiency (cd/A) | Life-span ($LT_{97}$) (h) | Color coordi-nate x |
|---|---|---|---|---|---|---|---|---|

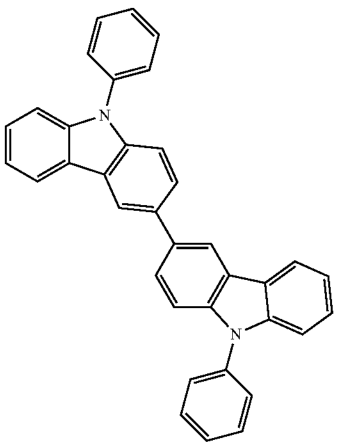

HA2

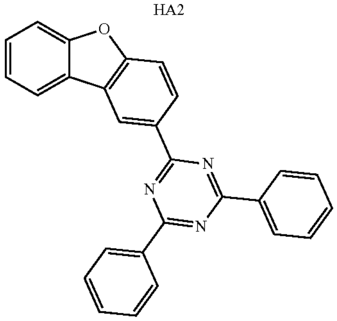

HA3

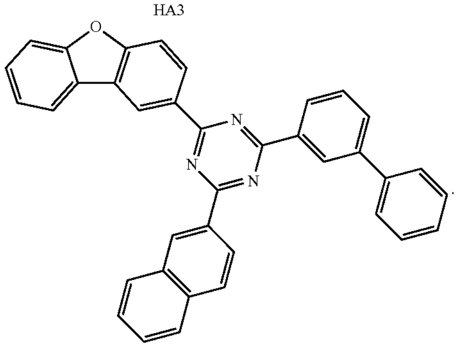

HA4

From Table 3, it is confirmed that the organic light-emitting devices manufactured according to Examples 2-1 to 2-10 have low driving voltage, high efficiency, and long lifespan, compared to the organic light-emitting device manufactured according to Comparative Examples 2-1 to 2-3.

Blue Device Preparation Example

Examples 3-1 to 3-4 and Comparative Examples 3-1 to 3-4

Additional organic light-emitting devices were manufactured in substantially the same manner as in Example 1-1, except that, in forming an emission layer, the host and dopant compounds shown in Table 4 were used.

Evaluation Example 4: Blue Device Evaluation Example

For each of the organic light-emitting devices manufactured according to Examples 3-1 to 3-4 and Comparative Examples 3-1 to 3-4, a driving voltage (V) at a current density of 10 $mA/cm^2$, efficiency (cd/A), and lifespan (LT97) were measured, and the results are shown in Table 4. The driving voltage and the current density of the organic light-emitting devices were measured using a source meter (manufactured by Keithley Instrument Inc., 2400 series).

TABLE 4

| No. | First compound | Second compound | Third compound | Dopant | Driving voltage (V) | Efficiency Cd/A (Cd/A/y) | Life-span (LT97) (h) | Color coordi-nate y |
|---|---|---|---|---|---|---|---|---|
| Example 3-1 | C9 (10 nm/min) | C10 (10 nm/min) | — | FBD 1 wt % | 3.60 | 11.8 (236) | 160 | 0.050 |
| Example 3-2 | C9 (10 nm/min) | C11 (10 nm/min) | — | FBD 1 wt % | 3.75 | 12.0 (244) | 165 | 0.049 |
| Example 3-3 | C9 (10 nm/min) | C10 (5 nm/min) | C11 (5 nm/min) | FBD 1 wt % | 3.50 | 18.5 (385.4) | 210 | 0.048 |
| Example 3-4 | C9 (10 nm/min) | C10 (5 nm/min) | C12 (5 nm/min) | FBD 1 wt % | 3.48 | 19.7 (386.2) | 202 | 0.051 |
| Comparative Example 3-1 | HA5 (20 nm/min) | — | — | FBD 1 wt % | 4.04 | 7.6 (160.4) | 131 | 0.047 |
| Comparative Example 3-2 | HA6 (20 nm/min) | — | — | FBD 1 wt % | 3.63 | 6.8 (165.3) | 113 | 0.041 |
| Comparative Example 3-3 | C9 (20 nm/min) | — | — | FBD 1 wt % | 4.00 | 6.9 (138) | 120 | 0.050 |
| Comparative Example 3-4 | C10 (20 nm/min) | — | — | FBD 1 wt % | 3.98 | 7.0 (145.8) | 140 | 0.048 |

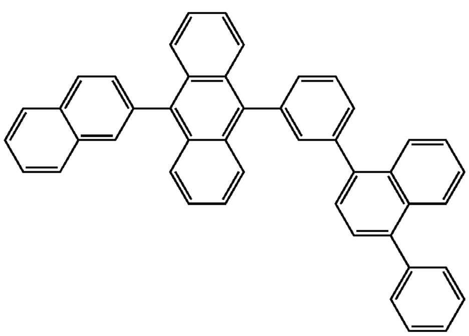

C9

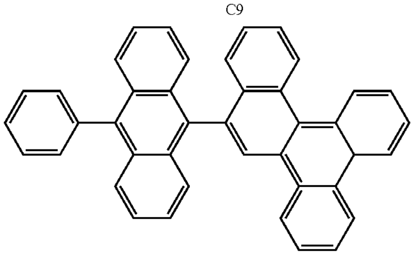

C10

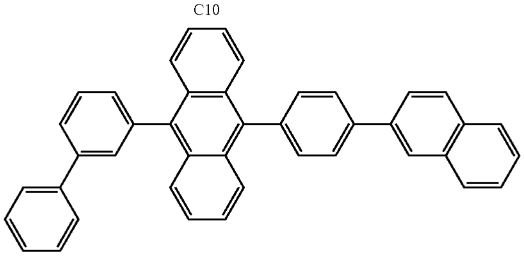

C11

TABLE 4-continued

| No. | First compound | Second compound | Third compound | Dopant | Driving voltage (V) | Efficiency Cd/A (Cd/A/y) | Life-span (LT97) (h) | Color coordi-nate y |
|---|---|---|---|---|---|---|---|---|

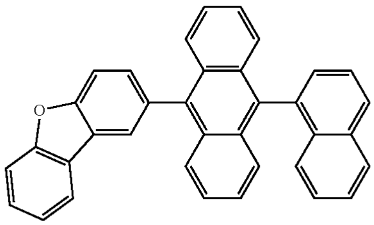

C12

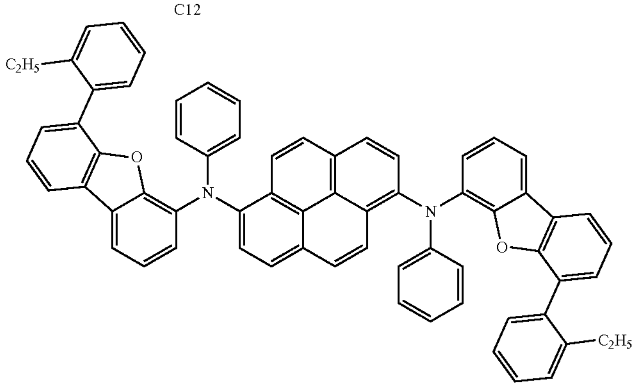

FBD

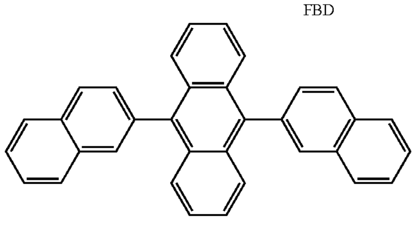

HA5

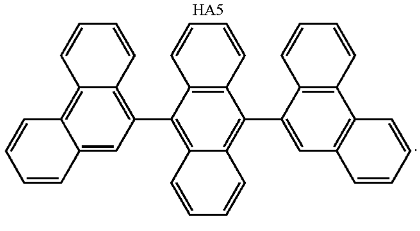

HA6

From Table 4, it is confirmed that the organic light-emitting devices manufactured according to Examples 3-1 to 3-4 have low driving voltage, high efficiency, and long lifespan, compared to the organic light-emitting devices manufactured according to Comparative Examples 3-1 to 3-4.

The organic light-emitting device according to embodiments of the present disclosure may have low driving voltage, high efficiency, and long lifespan.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. An organic light-emitting device comprising:

a first electrode;

a second electrode facing the first electrode; and an organic layer between the first electrode and the second electrode and including an emission layer, wherein the emission layer comprises a host and a dopant, the host comprises a first compound and a second compound, the first compound, the second compound, and the dopant are different from one another, two compounds in the host included in the emission layer have different HOMO and LUMO energy levels, and form an exciplex, and a difference between a HOMO energy level and a LUMO energy level of the exciplex ($\Delta E_{exciplex}$) is greater than a difference between a HOMO energy level and a LUMO energy level of the dopant ($\Delta E_{dopant}$), wherein the first compound and the second compound are each independently selected from compounds represented by Formulae 1 to 3 and 301:

Formula 2A

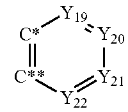

Formula 2B

in Formula 2A, C* and C** are each a carbon condensed with an $X_{21}$-containing 5-membered ring, in Formula 2A, $Y_{19}$ to $Y_{22}$ are each independently N, C, or $C(R_{25})$, wherein, when $C(R_{25})$ is 2 or more, two or more of $R_{25}$(s) are identical to or different from each other, and two adjacent among $Y_{19}$ to $Y_{22}$ are each a carbon condensed with an $X_{22}$-containing 5-membered ring, in Formula 2B, $X_{22}$ is O, S, $N[(L_{24})_{a24}—(R_{26})_{b26}]$, $C(R_{26a})(R_{26b})$, or $Si(R_{26a})(R_{26b})$, $L_{11}$ to $L_{13}$, $L_{21}$ to $L_{24}$, and $L_{31}$ are each independently a substituted or unsubstituted $C_5$-$C_{60}$ carbocyclic group or a substituted or unsubstituted $C_1$-$C_{60}$ heterocyclic group, a11 to a13, a21 to a24, and a31 are each independently an integer from 0 to 5, $R_{11}$ to $R_{14}$, $R_{11a}$, $R_{11b}$, $R_{21}$ to $R_{26}$, $R_{21a}$, $R_{21b}$, $R_{26a}$, $R_{26b}$, $R_{31}$, and $R_{32}$ are each independently selected from Formula 1

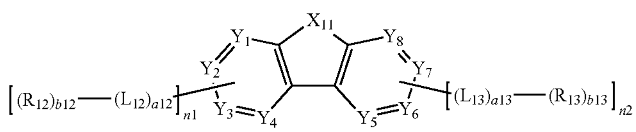

Formula 2

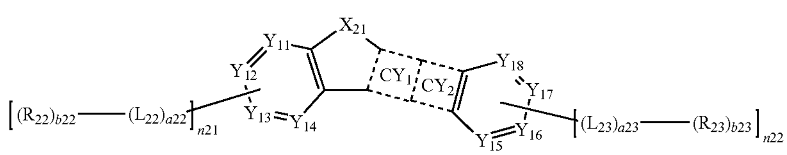

Formula 3

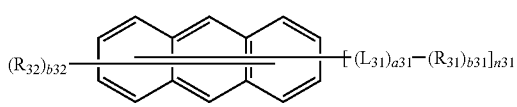

Formula 301

$$[Ar_{301}]_{xb11}—[(L_{301})_{xb1}-R_{301}]_{xb21},$$

in Formulae 1 to 3, $X_{11}$ is O, S, $N[(L_{11})_{a11}—(R_{11})_{b11}]$, $C(R_{11a})(R_{11b})$, or $Si(R_{11a})(R_{11b})$, $X_{21}$ is O, S, $N[(L_{21})_{a21}—(R_{21})_{b21}]$, $C(R_{21a})(R_{21b})$, or $Si(R_{21a})(R_{21b})$, $Y_1$ to $Y_8$ are each independently N or $C(R_{14})$, wherein, when $C(R_{14})$ is 2 or more, two or more $R_{14}$(s) are identical to or different from each other, $Y_{11}$ to $Y_{18}$ are each independently N or $C(R_{24})$, wherein, when $C(R_{24})$ is 2 or more, two or more $R_{24}$(s) are identical to or different from each other, $CY_1$ is a group represented by Formula 2A, and $CY_2$ is a group represented by Formula 2B, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, two adjacent groups among $R_{11}$ to $R_{14}$, $R_{11a}$, and $R_{11b}$ are optionally linked together via a linking group selected from a single bond, *—O—*, *—S—*, $*—B(R_{15})—*'$, $*—N(R_{15})—*'$, $*—C(R_{15})(R_{16})—*'$, $*—C(R_{15})=C(R_{16})—*'$, a $C_5$-$C_{30}$ carbocyclic group, and a $C_1$-$C_{30}$ heterocyclic group, two adjacent groups among $R_{21}$ to $R_{26}$, $R_{21a}$, $R_{21b}$, $R_{26a}$, and $R_{26b}$ are optionally linked together via a linking group selected from a single bond, *—O—*', *—S—*', $*—B(R_{27})—*'$, $*—N(R_{27})—*'$, $*—C(R_{27})(R_{28})—*'$, $—C(R_{27})=C(R_{28})—*'$, a $C_5$-$C_{30}$ carbocyclic group, and a $C_1$-$C_{30}$ heterocyclic group, $R_{15}$, $R_{16}$, $R_{27}$, and $R_{28}$ are each independently selected from: hydrogen, a $C_1$-$C_{20}$ alkyl group, a phenyl group, a biphenyl group, a terphenyl group, a naphthyl group, a fluorenyl group, a carbazolyl group, a dibenzofuranyl group, and a dibenzothiophenyl group, and a phenyl group, a biphenyl group, a terphenyl group, a naphthyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, and a naphthyl group, b11 to b13, b21 to b23, b26, b31, and b32 are each independently an integer from 1 to 5, n1, n2, n21, and n22 are each independently an integer from 1 to 4, and n31 is an integer from 1 to 3, wherein in Formula 301, $Ar_{301}$ is selected from a substituted or unsubstituted $C_5$-$C_{60}$ carbocyclic group and a substituted or unsubstituted $C_1$-$C_{60}$ heterocyclic group, xb11 is an integer from 1 to 3, $L_{301}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 is an integer from 0 to 5, $R_{301}$ is selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, and $—P(=O)(Q_{301})(Q_{302})$, xb21 is an integer from 1 to 5, and $Q_{301}$ to $Q_{303}$ are each independently selected from a $C_1$-$C_{10}$ alkyl group, a $C_1$-$C_{10}$ alkoxy group, a phenyl group, a biphenyl group, a terphenyl group, and a naphthyl group.

2. The organic light-emitting device of claim 1, wherein the second compound has a smaller electron transport capability than the first compound.

3. The organic light-emitting device of claim 1, wherein the first compound and the second compound form the exciplex.

4. The organic light-emitting device of claim 1, wherein:

the first compound and the second compound form the exciplex, and i) the first compound and the second compound both comprise an electron transport moiety, ii) neither of the first compound and the second compound comprises an electron transport moiety, or iii) the first compound comprises an electron transport moiety, and the second compound does not comprise an electron transport moiety.

5. The organic light-emitting device of claim 1, wherein the first compound is an electron transport host, and the second compound is a hole transport host.

6. The organic light-emitting device of claim 1, wherein the first compound and the second compound each have a higher triplet energy level (T1) than the dopant.

7. The organic light-emitting device of claim 1, wherein a weight ratio of the first compound to the second compound is from 90:10 to 10:90.

8. The organic light-emitting device of claim 1, wherein the host further comprises a third compound, and the first compound, the second compound, the third compound, and the dopant are different from each other.

9. The organic light-emitting device of claim 8, wherein the third compound is an electron transport host, a hole transport host, or a bipolar host.

10. The organic light-emitting device of claim 1, wherein the emission layer further comprises two or more hosts for a total of N hosts, wherein N is an integer of 4 or more, and the two or more hosts, the first compound, the second compound, and the dopant are different from each other.

11. The organic light-emitting device of claim 1, wherein the exciplex has an energy band gap ($\Delta E_{exciplex}$) of 2.5 eV to 3.5 eV.

12. The organic light-emitting device of claim 1, wherein the dopant is a phosphorescent dopant or a fluorescent dopant.

13. The organic light-emitting device of claim 1, wherein the organic layer further comprises a hole transport region between the first electrode and the emission layer, and an electron transport region between the emission layer and the second electrode, the hole transport region comprises at least one selected from a hole injection layer, a hole transport layer, an emission auxiliary layer, and an electron blocking layer, and the electron transport region comprises at least one selected from a buffer layer, a hole blocking layer, an electron control layer, an electron transport layer, and an electron injection layer.

14. An organic light-emitting device comprising:

a first electrode;

a second electrode facing the first electrode; and an organic layer between the first electrode and the second electrode and including an emission layer, wherein the emission layer comprises a host and a dopant, the host comprises a first compound and a second compound, the first compound, the second compound, and the dopant are different from one another, two compounds in the host included in the emission layer have different HOMO and LUMO energy levels, and form an exciplex, and a difference between a HOMO energy level and a LUMO energy level of the exciplex ($\Delta E_{exciplex}$) is greater than a difference between a HOMO energy level and a LUMO energy level of the dopant ($\Delta E_{dopant}$), wherein the organic layer further comprises a hole transport region between the first electrode and the emission layer, and an electron transport region between the emission layer and the second electrode, the hole transport region comprises at least one selected from a hole injection layer, a hole transport layer, an emission auxiliary layer, and an electron blocking layer, and the electron transport region comprises at least one selected from a buffer layer, a hole blocking layer, an electron control layer, an electron transport layer, and an electron injection layer, and wherein the hole transport region comprises an arylamine compound.

15. The organic light-emitting device of claim 13, wherein the electron transport region comprises a metal-free compound including at least one π-electron-deficient nitrogen-containing ring.

16. An organic light-emitting device comprising:

a first pixel electrode, a second pixel electrode, and a third pixel electrode respectively located in a first emission area, a second emission area, and a third emission area;

a counter electrode facing the first pixel electrode, the second pixel electrode, and the third pixel electrode; and an organic layer between the first pixel electrode, the second pixel electrode, and the third pixel electrode and the counter electrode and including an emission layer, wherein the emission layer comprises:

a first emission layer corresponding to the first emission area and emitting first-color light;

a second emission layer corresponding to the second emission area and emitting second-color light; and a third emission layer corresponding to the third emission area and emitting third-color light, wherein a maximum emission wavelength of the first-color light and a maximum emission wavelength of the second-color light are each greater than a maximum emission wavelength of the third-color light, at least two emission layers selected from the first emission layer, the second emission layer, and the third emission layer comprise a host including a first compound and a second compound, and a dopant, the first compound, the second compound, and the dopant are different from one another, two compounds in the host included in the emission layer have different HOMO and LUMO energy levels and form an exciplex, and a difference between a HOMO energy level and a LUMO energy level of the exciplex ($\Delta E_{exciplex}$) is greater than a difference between a HOMO energy level and a LUMO energy level of the dopant ($\Delta E_{dopant}$), and the first compound and the second compound are each independently selected from compounds represented by Formulae 1 to 3 and 301:

Formula 1

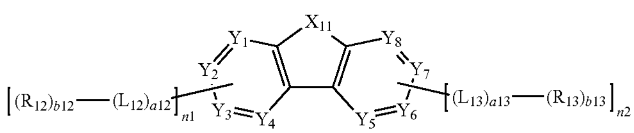

Formula 2

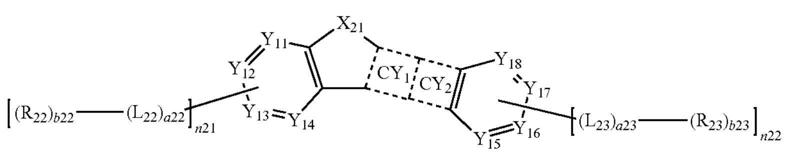

Formula 3

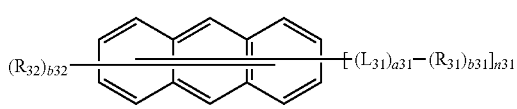

Formula 301

$$[Ar_{301}]_{xb11}-[(L_{301})_{xb1}-R_{301}]_{xb21},$$

in Formulae 1 to 3, $X_{11}$ is O, S, $N[(L_{11})_{a11}-(R_{11})_{b11}]$, $C(R_{11a})(R_{11b})$, or $Si(R_{11a})(R_{11b})$, $X_{21}$ is O, S, $N[(L_{21})_{a21}-(R_{21})_{b21}]$, $C(R_{21a})(R_{21b})$, or $Si(R_{21a})(R_{21b})$, $Y_1$ to $Y_8$ are each independently N or $C(R_{14})$, wherein, when $C(R_{14})$ is 2 or more, two or more $R_{14}$(s) are identical to or different from each other, $Y_{11}$ to $Y_{18}$ are each independently N or $C(R_{24})$, wherein, when $C(R_24)$ is 2 or more, two or more $R_{24}$(s) are identical to or different from each other, $CY_1$ is a group represented by Formula 2A, and $CY_2$ is a group represented by Formula 2B, Formula 2A

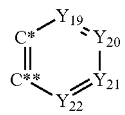

Formula 2B

in Formula 2A, C* and C** are each a carbon condensed with an $X_{21}$-containing 5-membered ring, in Formula 2A, $Y_{19}$ to $Y_{22}$ are each independently N, C, or $C(R_{25})$, wherein, when $C(R_{25})$ is 2 or more, two or more of $R_{25}$(s) are identical to or different from each other, and two adjacent among $Y_{19}$ to $Y_{22}$ are each a carbon condensed with an $X_{22}$-containing 5-membered ring, in Formula 2B, $X_{22}$ is O, S, $N[(L_{24})_{a24}—(R_{26})_{b26}]$, $C(R_{26a})(R_{26b})$, or $Si(R_{26a})(R_{26b})$, $L_{11}$ to $L_{13}$, $L_{21}$ to $L_{24}$, and $L_{31}$ are each independently a substituted or unsubstituted $C_5$-$C_{60}$ carbocyclic group or a substituted or unsubstituted $C_1$-$C_{60}$ heterocyclic group, a11 to a13, a21 to a24, and a31 are each independently an integer from 0 to 5, $R_{11}$ to $R_{14}$, $R_{11a}$, $R_{11b}$, $R_{21}$ to $R_{26}$, $R_{21a}$, $R_{21b}$, $R_{26a}$, $R_{26b}$, $R_{31}$, and $R_{32}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, two adjacent groups among $R_{11}$ to $R_{14}$, $R_{11a}$, and $R_{11b}$ are optionally linked together via a linking group selected from a single bond, *—O—*', *—S—*', $*—B(R_{15})—*'$, $*—N(R_{15})—*'$, $*—C(R_{15})(R_{16})—*'$, $*—C(R_{15})=C(R_{16})—*'$, a $C_5$-$C_{30}$ carbocyclic group, and a $C_1$-$C_{30}$ heterocyclic group, two adjacent groups among $R_{21}$ to $R_{26}$, $R_{21a}$, $R_{21b}$, $R_{26a}$, and $R_{26b}$ are optionally linked together via a linking group selected from a single bond, *—O—*', *—S—*', $*—B(R_{27})—*'$, $*—N(R_{27})—*'$, $*—C(R_{27})(R_{28})—*'$, $—C(R_{27})=C(R_{28})—*'$, a $C_5$-$C_{30}$ carbocyclic group, and a $C_1$-$C_{30}$ heterocyclic group, $R_{15}$, $R_{16}$, $R_{27}$, and $R_{28}$ are each independently selected from: hydrogen, a $C_1$-$C_{20}$ alkyl group, a phenyl group, a biphenyl group, a terphenyl group, a naphthyl group, a fluorenyl group, a carbazolyl group, a dibenzofuranyl group, and a dibenzothiophenyl group, and a phenyl group, a biphenyl group, a terphenyl group, a naphthyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, and a naphthyl group, b11 to b13, b21 to b23, b26, b31, and b32 are each independently an integer from 1 to 5, n1, n2, n21, and n22 are each independently an integer from 1 to 4, and n31 is an integer from 1 to 3, wherein in Formula 301, $Ar_{301}$ is selected from a substituted or unsubstituted $C_5$-$C_{60}$ carbocyclic group and a substituted or unsubstituted $C_1$-$C_{60}$ heterocyclic group, xb11 is an integer from 1 to 3, $L_{301}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 is an integer from 0 to 5, $R_{301}$ is selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, and $—P(=O)(Q_{301})(Q_{302})$, xb21 is an integer from 1 to 5, and $Q_{301}$ to $Q_{303}$ are each independently selected from a $C_1$-$C_{10}$ alkyl group, a $C_1$-$C_{10}$ alkoxy group, a phenyl group, a biphenyl group, a terphenyl group, and a naphthyl group.

17. The organic light-emitting device of claim 16, wherein the second compound has a smaller electron transport capability than the first compound.

18. The organic light-emitting device of claim 16, wherein at least one emission layer selected from the first emission layer, the second emission layer, and the third emission layer further comprises a third compound that is different from the first compound and the second compound.

19. An apparatus comprising: a thin-film transistor comprising a source electrode, a drain electrode, and an activation layer; and the organic light-emitting device of claim 1, wherein the first electrode of the organic light-emitting device is electrically connected with one selected from the source electrode and the drain electrode of the thin-film transistor.

* * * * *